US012367015B2

(12) United States Patent
Roper, Jr. et al.

(10) Patent No.: US 12,367,015 B2
(45) Date of Patent: Jul. 22, 2025

(54) MACHINE LEARNING ENGINE FOR WORKFLOW ENHANCEMENT IN DIGITAL WORKFLOWS

(71) Applicant: Istari Digital, Inc., Charleston, SC (US)

(72) Inventors: William Roper, Jr., Charleston, SC (US); Christopher Lee Benson, Arlington, VA (US); Sriram Krishnan, Cambridge, MA (US); Baha aldeen E. A. Abunojaim, Roslindale, MA (US); Peter Galvin, Watertown, MA (US); Joshua Adam Marks, San Francisco, CA (US)

(73) Assignee: Istari Digital, Inc., Charleston, SC (US)

( * ) Notice: Subject to any disclaimer, the term of this patent is extended or adjusted under 35 U.S.C. 154(b) by 0 days.

(21) Appl. No.: 19/067,902

(22) Filed: Mar. 2, 2025

(65) Prior Publication Data
US 2025/0217114 A1    Jul. 3, 2025

Related U.S. Application Data

(63) Continuation of application No. PCT/US2024/040624, filed on Aug. 1, 2024.
(Continued)

(51) Int. Cl.
*G06F 9/44*     (2018.01)
*G06F 8/30*     (2018.01)
(Continued)

(52) U.S. Cl.
CPC ............... *G06F 8/30* (2013.01); *G06N 20/00* (2019.01)

(58) Field of Classification Search
CPC ............ G06F 8/30; G06N 20/00; G05B 17/02
See application file for complete search history.

(56) References Cited

U.S. PATENT DOCUMENTS

| 11,409,629 B1 * | 8/2022 | Ganti ............... G06F 21/51 |
| 2015/0081598 A1 | 3/2015 | Depizzol et al. |

(Continued)

OTHER PUBLICATIONS

Jason Brancazio, Machine learning orchestration on Vertex AI, 2022, pp. 1-25. https://engineering.sada.com/machine-learning-orchestration-on-vertex-ai-3fb8cb9b787a (Year: 2022).*

(Continued)

*Primary Examiner* — Mongbao Nguyen
(74) *Attorney, Agent, or Firm* — American Patent Agency PC; Daniar Hussain; Stephen M. Hou

(57) ABSTRACT

Methods and systems for generating a sharable script related to an input digital model on a digital platform are provided. The method includes receiving a user request indicative of a digital task involving an input digital model, and retrieving a corresponding input digital model file. Then, determining characteristic attributes of the input digital model, where the characteristic attributes include digital artifacts generated from the input digital model file. Then, selecting from a collection of templates, using a machine learning (ML) engine, a template matching the characteristic attributes of the input digital model. The ML engine may be trained on documentations of digital tools integrated into the digital platform, a resource-capability mapping of the digital platform, and sample digital thread orchestration scripts collected through past uses of the digital platform. Finally, the method includes generating the sharable script that implements the digital task, based on the selected template.

18 Claims, 26 Drawing Sheets

Related U.S. Application Data

(60) Provisional application No. 63/517,136, filed on Aug. 2, 2023.

(51) Int. Cl.
  *G06F 9/445* (2018.01)
  *G06F 9/455* (2018.01)
  *G06N 20/00* (2019.01)

(56) References Cited

U.S. PATENT DOCUMENTS

| | | |
|---|---|---|
| 2020/0005523 A1* | 1/2020 | Brebner .............. H04W 4/021 |
| 2020/0218519 A1 | 7/2020 | Brebner |
| 2021/0086451 A1 | 3/2021 | Carbone et al. |
| 2021/0096553 A1 | 4/2021 | Stump et al. |
| 2022/0058528 A1 | 2/2022 | Murakonda et al. |
| 2023/0048472 A1 | 2/2023 | Nayak et al. |
| 2024/0223628 A1* | 7/2024 | Kumar .............. H04L 65/4015 |
| 2024/0370252 A1* | 11/2024 | Venkataraman .......... G06F 8/65 |
| 2024/0370583 A1* | 11/2024 | Michael .............. G06Q 10/063 |

OTHER PUBLICATIONS

Post et al., "Beyond the workflow: archivists' aspirations for digital curation practices", Archival Science, vol. 21, Jun. 14, 2021, pp. 413-432.

International Search Report and Written Opinion of PCT Application No. PCT/US24/40624, mailed on Oct. 7, 2024.

\* cited by examiner

MACHINE LEARNING ENGINE FOR WORKFLOW ENHANCEMENT IN DIGITAL WORKFLOWS

REFERENCE TO RELATED APPLICATIONS

If an Application Data Sheet ("ADS") or PCT Request Form ("Request") has been filed on the filing date of this application, it is incorporated by reference herein. Any applications claimed on the ADS or Request for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

Furthermore, this application is related to the U.S. patent applications listed below, which are incorporated by reference in their entireties herein, as if fully set forth herein:

- PCT application No. PCT/US24/40468, filed on Jul. 31, 2024, entitled "Multimodal User Interfaces for Interacting with Digital Model Files," describes multimodal user interfaces for digital software platforms.
- PCT application No. PCT/US24/38878, filed on Jul. 19, 2024, entitled "Generative Artificial Intelligence (AI) for Digital Workflows," describes efficient AI-assisted script generation methods that preserve customer data sovereignty.
- PCT application No. PCT/US24/35885, filed on Jun. 27, 2024, entitled "Artificial Intelligence (AI) Assisted Integration of New Digital Model Types and Tools into Integrated Digital Model Platform," describes the enhancement of model splicer technology through AI-assistance.
- PCT application No. PCT/US24/27912, filed on May 5, 2024, entitled "Secure and Scalable Sharing of Digital Engineering Documents," describes secure and scalable document splicing technology.
- PCT application No. PCT/US24/27898, filed on May 4, 2024, entitled "Digital Twin Enhancement using External Feedback within Integrated Digital Model Platform," describes digital and physical twin management and the integration of external feedback within a DE platform.
- PCT application No. PCT/US24/19297, filed on Mar. 10, 2024, entitled "Software-Code-Defined Digital Threads in Digital Engineering Systems with Artificial Intelligence (AI) Assistance," describes AI-assisted digital threads for digital engineering platforms.
- PCT application No. PCT/US24/18278, filed on Mar. 3, 2024, entitled "Secure and Scalable Model Splicing of Digital Engineering Models for Software-Code-Defined Digital Threads," describes model splicing for digital engineering platforms.
- PCT application No. PCT/US24/14030, filed on Feb. 1, 2024, entitled "Artificial Intelligence (AI) Assisted Digital Documentation for Digital Engineering," describes AI-assisted documentation for digital engineering platforms.
- U.S. provisional patent application No. 63/442,659, filed on Feb. 1, 2023, entitled "AI-Assisted Digital Documentation for Digital Engineering with Supporting Systems and Methods," describes AI-assistance tools for digital engineering (DE), including modeling and simulation applications, and the certification of digitally engineered products.
- U.S. provisional patent application No. 63/451,545, filed on Mar. 10, 2023, entitled "Digital Threads in Digital Engineering Systems, and Supporting AI-Assisted Digital Thread Generation," describes model splicer and digital threading technology.
- U.S. provisional patent application No. 63/451,577, filed on Mar. 11, 2023, entitled "Model Splicer and Microservice Architecture for Digital Engineering," describes model splicer technology.
- U.S. provisional patent application No. 63/462,988, filed on Apr. 29, 2023, also entitled "Model Splicer and Microservice Architecture for Digital Engineering," describes model splicer technology.
- U.S. provisional patent application No. 63/511,583, filed on Jun. 30, 2023, entitled "AI-Assisted Model Splicer Generation for Digital Engineering," describes model splicer technology with AI-assistance.
- U.S. provisional patent application No. 63/516,624, filed on Jul. 31, 2023, entitled "Document and Model Splicing for Digital Engineering," describes document splicer technology.
- U.S. provisional patent application No. 63/520,643, filed on Aug. 20, 2023, entitled "Artificial Intelligence (AI)-Assisted Automation of Testing in a Software Environment," describes software testing with AI-assistance.
- U.S. provisional patent application No. 63/590,420, filed on Oct. 14, 2023, entitled "Commenting and Collaboration Capability within Digital Engineering Platform," describes collaborative capabilities.
- U.S. provisional patent application No. 63/586,384, filed on Sep. 28, 2023, entitled "Artificial Intelligence (AI)-Assisted Streamlined Model Splice Generation, Unit Testing, and Documentation," describes streamlined model splicing, testing and documentation with AI-assistance.
- U.S. provisional patent application No. 63/470,870, filed on Jun. 3, 2023, entitled "Digital Twin and Physical Twin Management with Integrated External Feedback within a Digital Engineering Platform," describes digital and physical twin management and the integration of external feedback within a DE platform.
- U.S. provisional patent application No. 63/515,071, filed on Jul. 21, 2023, entitled "Generative Artificial Intelligence (AI) for Digital Engineering," describes an AI-enabled digital engineering task fulfillment process within a DE software platform.
- U.S. provisional patent application No. 63/517,136, filed on Aug. 2, 2023, entitled "Machine Learning Engine for Workflow Enhancement in Digital Engineering," describes a machine learning engine for model splicing and DE script generation.
- U.S. provisional patent application No. 63/516,891, filed on Aug. 1, 2023, entitled "Multimodal User Interfaces for Digital Engineering," describes multimodal user interfaces for DE systems.
- U.S. provisional patent application No. 63/580,384, filed on Sep. 3, 2023, entitled "Multimodal Digital Engineering Document Interfaces for Certification and Security Reviews," describes multimodal user interfaces for certification and security reviews.
- U.S. provisional patent application No. 63/613,556, filed on Dec. 21, 2023, entitled "Alternative Tool Selection and Optimization in an Integrated Digital Engineering Platform," describes tool selection and optimization.
- U.S. provisional patent application No. 63/584,165, filed on Sep. 20, 2023, entitled "Methods and Systems for Improving Workflows in Digital Engineering," describes workflow optimization in a DE platform.

U.S. provisional patent application No. 63/590,456, filed on Oct. 15, 2023, entitled "Data Sovereignty Assurance for Artificial Intelligence (AI) Models," relates to data sovereignty assurance during AI model training and evaluation.

U.S. provisional patent application No. 63/606,030, filed on Dec. 4, 2023, also entitled "Data Sovereignty Assurance for Artificial Intelligence (AI) Models," further details data sovereignty assurances during AI model training and evaluation.

U.S. provisional patent application No. 63/419,051, filed on Oct. 25, 2022, entitled "Interconnected Digital Engineering and Certification Ecosystem."

U.S. non-provisional patent application Ser. No. 17/973,142 filed on Oct. 25, 2022, entitled "Interconnected Digital Engineering and Certification Ecosystem."

U.S. non-provisional patent application Ser. No. 18/383,635, filed on Oct. 25, 2023, entitled "Interconnected Digital Engineering and Certification Ecosystem."

U.S. provisional patent application No. 63/489,401, filed on Mar. 9, 2023, entitled "Security Architecture for Interconnected Digital Engineering and Certification Ecosystem."

NOTICE OF COPYRIGHTS AND TRADEDRESS

A portion of the disclosure of this patent document contains material which is subject to copyright protection. This patent document may show and/or describe matter which is or may become tradedress of the owner. The copyright and tradedress owner has no objection to the facsimile reproduction by anyone of the patent disclosure as it appears in the U.S. Patent and Trademark Office files or records, but otherwise reserves all copyright and tradedress rights whatsoever.

ISTARI DIGITAL is a trademark name carrying embodiments of the present invention, and hence, the aforementioned trademark name may be interchangeably used in the specification and drawings to refer to the products/process offered by embodiments of the present invention. The terms ISTARI and ISTARI DIGITAL may be used in this specification to describe the present invention, as well as the company providing said invention.

FIELD OF THE INVENTION

This disclosure relates to utilizing machine learning (ML) in fulfilling digital tasks and enhancing digital workflows within digital software platforms.

BACKGROUND OF THE INVENTION

The statements in the background of the invention are provided to assist with understanding the invention and its applications and uses, and may not constitute prior art.

Digital workflows have become indispensable across various fields of human endeavor, revolutionizing how tasks are accomplished. From healthcare and finance to manufacturing and creative industries, these automated sequences of digital operations streamline complex procedures, enhance collaboration, and boost productivity. By leveraging technology to orchestrate tasks, manage data flow, and facilitate decision-making, digital workflows enable organizations to operate with greater efficiency, accuracy, and scalability. They not only reduce manual errors and save time but also provide valuable insights through data analytics, allowing for continuous improvement and innovation in diverse sectors of the economy and society.

Current approaches to digital workflows often suffer from inefficiencies due to the fragmentation of tools and processes across large teams. Organizations find themselves grappling with a patchwork of disparate and incompatible software solutions, each serving a specific function but failing to integrate seamlessly with other software. This lack of cohesion leads to data silos, communication breakdowns, and redundant work as team members struggle to transfer information between systems. Consequently, valuable time is lost in manual data entry, format conversions, and reconciling conflicting information across platforms. These inefficiencies not only slow down project timelines but also increase the risk of errors and miscommunications, ultimately hampering productivity and innovation potential.

For example, within the field of engineering, current approaches to digital engineering involve inefficient processes with a large number of engineers working with many disparate engineering tools. This typically requires massive teams of highly specialized engineers and software developers working with data and models from the siloed tools, while cross-platform collaboration is often further impeded by the mismatch of software skill sets among highly expensive subject matter experts, given the sheer number of different digital engineering model types in use today. The resulting "spaghetti monster" of code, data, and engineering models is difficult to track and update, especially with limited budgets. The vast resources dedicated to digital engineering are thus compounded by massive overhead related to the size of the engineering teams and to the file-by-file integration of hundreds of digital engineering models, leading to repetitive work and to an explosion of in the budget.

Although emerging machine learning (ML) and generative artificial intelligence (AI) tools show promise for addressing complex digital workflows, they face several obstacles that compound the challenges stemming from the fragmented nature of current digital processes. Security concerns over data privacy and intellectual property protection exacerbate the risks associated with siloed data across disparate systems. In addition, scalability challenges in maintaining performance across large-scale enterprise workflows are amplified by the lack of integration between various software tools. Finally, integration difficulties when incorporating ML or AI tools into existing systems underscore the broader problem of disconnected software systems. Such issues must be overcome for safe and effective deployment of ML and AI in digital workflows.

Therefore, in view of the aforementioned difficulties, there is an unsolved need to provide a digital workflow and collaboration platform that reduces the cost and corporate impact of digital tasks while providing the ability to manipulate digital model files seamlessly across multiple siloed software tools, and integrating powerful ML and AI to assist users in constructing and navigating digital workflows. Accordingly, it would be an advancement in the state of the art to enable ML tools to facilitate the completion of digital tasks within a unified, scalable, collaborative, and secure digital software platform integrating multidisciplinary models from disparate, disconnected tools.

It is against this background that various embodiments of the present invention were developed.

BRIEF SUMMARY OF THE INVENTION

This summary of the invention provides a broad overview of the invention, its application, and uses, and is not intended to limit the scope of the present invention, which will be apparent from the detailed description when read in conjunction with the drawings.

Broadly, the present invention relates to methods and systems for a continuously learning system that trains on digital tool documentations, digital platform resource-capability mappings, and historical digital workflows to suggest specific functions, use-cases, and digital workflows to a user upon request. A machine learning (ML) engine seeks to represent disparate data sources in a joint embedding space or a shared vector space, where data of different types or modalities can be represented and compared. Specifically, elements of digital threads including digital models and specific atomic actions made on data artifacts from digital models may be codified and jointly embedded. A similarity measure or distance metric is defined in this joint embedding space to allow for comparisons between embedding vectors. The ML engine further comprises a template engine that learns characteristic components, properties, attributes or representative features of commonly accessed digital models, digital tasks and digital workflows to create templates from IDMP documentations and historical usage data. Building upon the joint embedding space and a template database, the ML engine provides dynamic template recommendations by evaluating a user's requested digital task involving one or more digital models, potentially taking into account the user's historical usage patterns, to generate sharable scripts that streamline and enhance digital workflows while reducing manual input. For example, a recommended template embedding may be decoded to generate digital tool function scripts or digital thread orchestration scripts. As users interact with recommended templates and/or generated scripts, their feedback is collected and used to further refine the ML engine, thus continuously improving the accuracy and relevance of future template suggestions.

Accordingly, various methods, processes, and non-transitory storage media storing program code for an ML-based generation of digital model splices, function scripts, and/or digital thread orchestration scripts are within the scope of the present invention.

In a first aspect, an embodiment of the present invention is a non-transitory physical storage medium storing program code. The program code is executable by a hardware processor. The hardware processor when executing the program code causes the hardware processor to execute a computer-implemented process for generating a sharable script related to an input digital model, the program code comprising code to receive a user request indicative of a digital task involving an input digital model. The program code comprises code that may retrieve an input digital model file of the input digital model. The program code comprises code that may determine characteristic attributes of the input digital model. The characteristic attributes may comprise digital artifacts generated from the input digital model file. The program code comprises code that may select from a collection of templates, using a machine learning (ML) engine, a selected template matching the characteristic attributes of the input digital model. The ML engine may be trained on documentations of digital tools integrated into a digital platform, a resource-capability mapping of the digital platform, and sample digital thread orchestration scripts collected through past uses of the digital platform. Finally, the program code comprises code that may generate the sharable script based on the selected template. The sharable script, when interpreted, may implement the digital task.

In some embodiments, the program code to generate the sharable script based on the selected template further comprises code to excerpt a portion of the template to generate an excerpted portion. The program code comprises code that may update the excerpted portion for the input digital model.

In some embodiments, the digital artifacts generated from the input digital model file may comprise extracted model component data, derivative data derived from the extracted model component data, and metadata.

In some embodiments, the digital task may be related to the selected template.

In some embodiments, the selected template may be a digital model splice template having one or more splice functions. A given splice function may provide an Application Programming Interface (API) or Software Development Kit (SDK) endpoint to access a given digital artifact derived from a given digital model data. Finally, the sharable script may be a splice function applicable on the input digital model.

In some embodiments, the digital model may be a first digital model. The sharable script may be a digital thread orchestration script that accesses the first digital model and a second digital model when executed. The ML engine may comprise a Graph Transformer Network (GTN) trained on graph representations of the sample digital thread orchestration scripts. Finally, the selected template may correspond to a given digital thread execution graph comprising task nodes.

In some embodiments, at least a first task node of the given digital thread execution graph may operate on an input matching a characteristic attribute of the first digital model. At least a second task node may operate on a characteristic attribute of the second digital model.

In some embodiments, the graph representations of the sample digital thread orchestration scripts may be direct acyclic graphs (DAGs).

In some embodiments, the program code further comprises code to generate an embedding of the characteristic attributes in a vector space. The template matching the characteristic attributes may be embedded to a vector closest to the embedding of the characteristic attributes in the vector space, as measured by a given distance function.

In some embodiments, the embedding may be generated further from the user request indicative of the digital task.

In some embodiments, the vector space may be a joint embedding space encoded over at least two data modalities selected from digital thread execution graph data, image data, and text data.

In some embodiments, the program code further comprises code to perform unsupervised training of the ML engine on the documentations of digital tools integrated into a digital platform, the resource-capability mapping of the digital platform, and the sample digital thread orchestration scripts collected through past uses of the digital platform.

In some embodiments, the program code further comprises code to store the sharable script as a new sample digital thread orchestration script for training the ML engine.

In some embodiments, the ML engine may have been trained by customization through Retrieval-Augmented Generation (RAG) using a selection of the sample digital thread orchestration scripts relevant to the digital task.

In some embodiments, the ML engine may have been trained further on user inputs, user scripts, and graph representations of dynamically updated documents having corresponding digital threads.

In some embodiments, the sample digital thread orchestration scripts may be desensitized of customer data.

In some embodiments, the program code further comprises code to output the digital thread orchestration script to a user and/or run the orchestration script.

In a second aspect or in another embodiment, a system for generating a sharable script related to a digital model is provided. The system comprises at least one hardware processor, and at least one memory storing program code. The program code is executable by the at least one hardware processor to cause the at least one hardware processor to execute a process for generating a sharable script related to a digital model. The program code comprising code to receive a user request indicative of a digital task involving an input digital model. The program code comprises code that may retrieve an input digital model file of the input digital model. The program code comprises code that may determine characteristic attributes of the input digital model. The characteristic attributes may comprise digital artifacts generated from the input digital model file. The program code comprises code that may select from a collection of templates, using a machine learning (ML) engine, a selected template matching the characteristic attributes of the input digital model. The ML engine may have been trained on documentations of digital tools integrated into a digital platform, a resource-capability mapping of the digital platform, and sample digital thread orchestration scripts collected through past uses of the digital platform. Finally, the program code comprises code that may generate the sharable script based on the selected template. The sharable script, when interpreted, may implement the digital task.

Embodiments as set out for the first aspect apply equally to the second aspect.

In a third aspect, an embodiment of the present invention is a method for generating a sharable script related to a digital model, comprising receiving a user request indicative of a digital task involving an input digital model. The method may further comprise retrieving an input digital model file of the input digital model. The method may further comprise determining characteristic attributes of the input digital model. The characteristic attributes may comprise digital artifacts generated from the input digital model file. The method may further comprise selecting from a collection of templates, using a machine learning (ML) engine, a selected template matching the characteristic attributes of the input digital model. The ML engine may have been trained on documentations of digital tools integrated into a digital platform, a resource-capability mapping of the digital platform, and sample digital thread orchestration scripts collected through past uses of the digital platform. Finally, the method may further comprise generating the sharable script based on the selected template. The sharable script, when interpreted, may implement the digital task.

Embodiments as set out for the first aspect apply equally to the third aspect.

In another aspect, an embodiment of the present invention is a non-transitory, computer-readable storage medium, the non-transitory, computer-readable storage medium storing executable instructions which when executed by a processor, causes the processor to perform a process for generating a sharable script including the aforementioned steps.

In another aspect, an embodiment of the present invention is a computer program product. The computer program product may be used for generating a sharable script, and may include a computer-readable storage medium having program instructions, or program code, embodied therewith, the program instructions executable by a processor to cause the processor to perform the aforementioned steps.

In another aspect, an embodiment of the present invention is a system for generating a sharable script, the system including a memory that stores computer-executable components, and a hardware processor, operably coupled to the memory, and that executes the computer-executable components stored in the memory, where the computer-executable components may include components communicatively coupled with the processor that execute the aforementioned steps.

In another aspect, an embodiment of the present invention is a system for generating a sharable script, the system including a user device having a processor, a display, a first memory; a server including a second memory and a data repository; a communications link between said user device and said server; and a plurality of computer codes embodied on said first and second memory of said user device and said server, said plurality of computer codes which when executed causes said server and said user device to execute a process including the steps described herein.

In another aspect, an embodiment of the present invention is a computerized server including at least one processor, memory, and a plurality of computer codes embodied on said memory, said plurality of computer codes which when executed causes said processor to execute a process including the steps described herein. Other aspects and embodiments of the present invention include the methods, processes, and algorithms including the steps described herein, and also include the processes and modes of operation of the systems and servers described herein.

In yet another aspect, an embodiment of the present invention is an edge computerized system running on a physical system or physical twin (PTw) with either access to, or dedicated, processing, memory, computer code stored on a non-transitory computer-readable storage medium of the physical system or PTw, and a plurality of sensor data being measured on said physical system or PTw, the computer code causing the processor to perform the aforementioned steps.

Features which are described in the context of separate aspects and/or embodiments of the invention may be used together and/or be interchangeable wherever possible. Similarly, where features are, for brevity, described in the context of a single embodiment, those features may also be provided separately or in any suitable sub-combination. Features described in connection with the non-transitory physical storage medium may have corresponding features definable and/or combinable with respect to a digital documentation system and/or method and/or system, or vice versa, and these embodiments are specifically envisaged.

Yet other aspects and embodiments of the present invention will become apparent from the detailed description of the invention when read in conjunction with the attached drawings.

BRIEF DESCRIPTION OF THE DRAWINGS

The accompanying drawings, which are incorporated in and constitute part of this specification, illustrate embodiments of the invention and together with the description, serve to explain the principles of the disclosed embodiments. For clarity, simplicity, and flexibility, not all elements, components, or specifications are defined in all drawings. Not all drawings corresponding to specific steps or embodiments of the present invention are drawn to scale. Emphasis is instead placed on illustration of the nature, function, and product of the manufacturing method and devices described herein.

Embodiments of the present invention described herein are exemplary, and not restrictive. Embodiments will now be described, by way of examples, with reference to the accompanying drawings, in which.

DETAILED DESCRIPTION OF THE INVENTION

Figure 1:
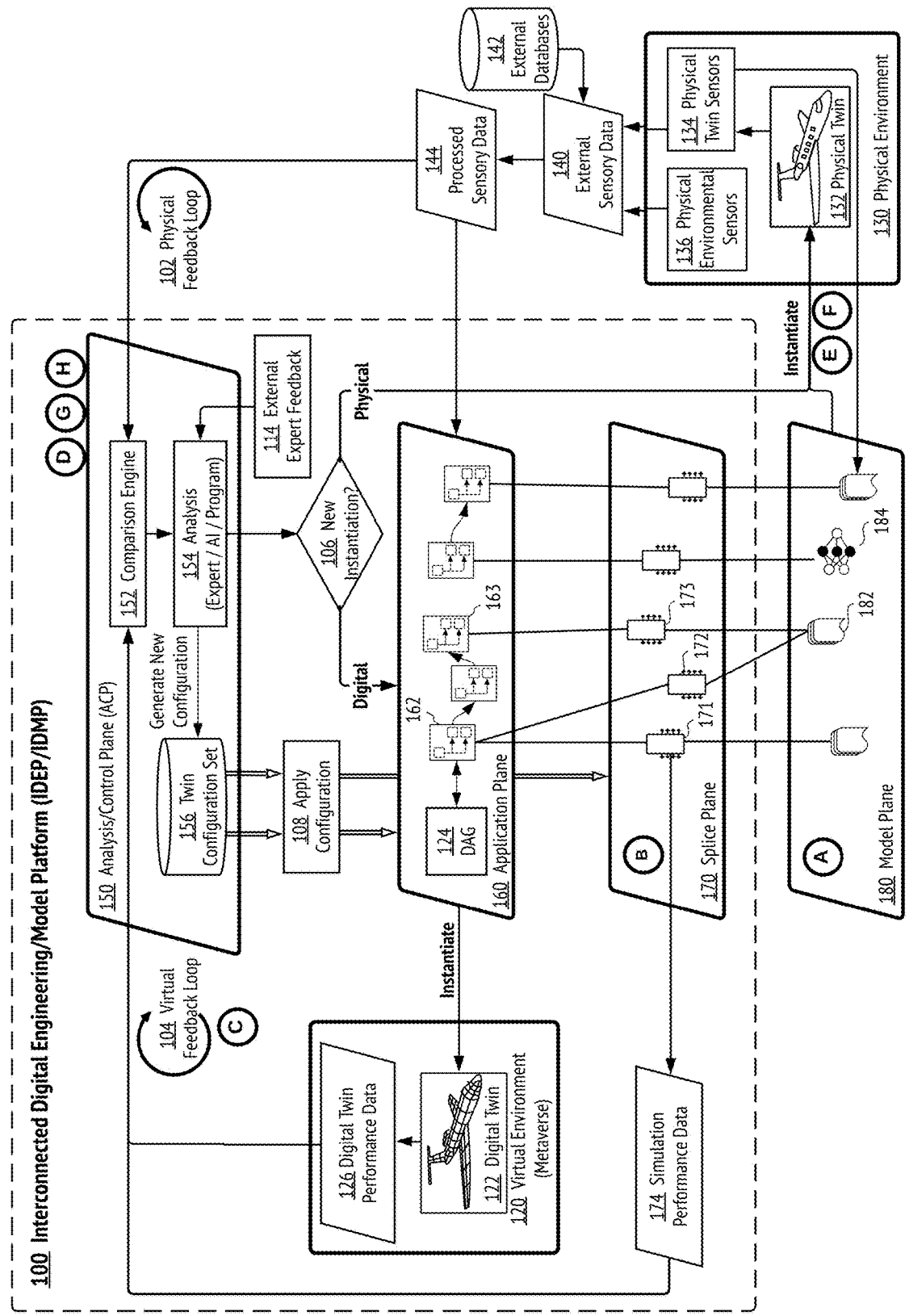
FIG. 1 shows an exemplary interconnected digital engineering/model platform (IDEP/IDMP) architecture, in accordance with some embodiments of the present invention.

In the following description, for purposes of explanation, numerous specific details are set forth in order to provide a thorough understanding of the invention. It will be apparent, however, to one skilled in the art that the invention can be practiced without these specific details. In other instances, structures, devices, activities, methods, and processes are shown using schematics, use cases, and/or diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, the present invention relates to methods and systems for a continuously learning system that trains on digital tool documentations, digital platform resource-capability mappings, and historical digital workflows to suggest specific functions, use-cases, and digital workflows to a user upon request. A machine learning (ML) engine seeks to represent disparate data sources in a joint embedding space or a shared vector space, where data of different types or modalities can be represented and compared. Specifically, elements of digital threads including digital models and specific atomic actions made on data artifacts from digital models may be codified and jointly embedded. A similarity measure or distance metric is defined in this joint embedding space to allow for comparisons between embedding vectors. The ML engine further comprises a template engine that learns characteristic components, properties, attributes or representative features of commonly accessed digital models, digital tasks and digital workflows to create templates from IDMP documentations and historical usage data. Building upon the joint embedding space and a template database, the ML engine provides dynamic template recommendations by evaluating a user's requested digital task involving one or more digital models, potentially taking into account the user's historical usage patterns, to generate sharable scripts that streamline and enhance digital workflows while reducing manual input. For example, a recommended template embedding may be decoded to generate digital tool function scripts or digital thread orchestration scripts. As users interact with recommended templates and/or generated scripts, their feedback is collected and used to further refine the ML engine, thus continuously improving the accuracy and relevance of future template suggestions.

One use case for the present invention as disclosed herein is in enhancing the usability of digital models by tapping into the universality of model splicing and embedding to generate splice function scripts. Specifically, through continued learning, an ML engine can recognize an input digital model type-file, assign a matching or best-fit template, and suggest to a user, based on the template, Application Programming Interface (API) function scripts that may call upon third party digital tools and may be applicable to digital model data as structured within a corresponding model splice. Model splicing encapsulates and compartmentalizes digital model data and model data manipulation and access functionalities, enabling the scripting of digital model operations encompassing disparate digital tools into a corpus of normative program code. As a result, digital tasks involving digital models can be threaded into program code, enabling the generation and training of ML modules for the purpose of manipulating digital models to accomplish a given digital task. The ML engine can be trained on the history of prior workflows in an interconnected digital model platform (IDMP) with model splicing capability. The ML engine may monitor function calls combined with the digital models they operate on, and organize the details in a joint vector space. Vectors may be produced from the same embedding function, with dimensions corresponding to digital model types and other metadata. Similarities among different digital models may be measured via appropriate distance functions. Estimated similarities between a new digital model and existing digital models may be relied upon for suggesting usable function scripts for the new digital model file. In other words, the ML engine as disclosed herein may suggest specific function scripts that are applicable to a newly uploaded digital model file, and in this process generates, refines, and/or expands a model splicer for the corresponding digital model type.

Another use case for the present invention as disclosed herein is in generating orchestration scripts that threads multiple digital models in a digital workflow to complete a given digital task. An ML engine may utilize various user actions, data artifacts, and historical digital workflows within an IDMP to create a joint embedding vector space over at least two data modalities selected from digital thread execution graph data, image data, and text data. This joint embedding space serves as a unified representation and comprehensive framework to infer from all types of digital models and data within the IDMP. A template engine within the ML engine may ingest a variety of input data types integral to operations within the IDMP, including but not limited to execution graphs for digital threads, and image and text data for digital artifacts, ensuring comprehensive coverage and applicability of the template engine across multiple domains and use cases. Embeddings for different data types may be generated and aligned through methods such as concatenation and projection, bilinear transformations, and attention mechanisms. The ML engine may be trained to generate, score, and validate exemplary templates, and in turn provide template recommendations or suggestions to users, whose feedback may be used further to refine the ML model.

In various embodiments, the ML engine may be trained on a collection of known user inputs, digital tool documentations, digital platform resource-capability mappings, and the history of prior digital workflows. Digital platform resource-capability mapping may comprise platform API documentations describing existing digital model types, model splices, splice function scripts, and orchestration scripts. During training, the ML engine creates templates that capture similarities and characteristic attributes among digital models or digital threads that share elements, properties, and/or attributes. Potential boundary conditions may be established while the template is learned. Such generated templates may be subjected to a scoring system to evaluate their validity and effectiveness using metrics such as time saved, errors reduced, and user satisfaction. Those meeting a predefined efficacy threshold may be integrated into the system and persisted for further fine-tuning of the system. This scoring and validation process ensures that only the most effective templates are utilized, providing measurable benefits to ongoing projects.

Methods and systems disclosed herein are not limited to any specific digital model type or native environments. While a native digital model environment may recommend certain digital tool functions for specific digital model type files, embodiments of the present invention operate outside any particular native environment in a unified and scalable fashion, and link to a large database of model types and associated functions and digital thread orchestration scripts. This feature allows the system to provide a wider range of suggestions, increasing its utility to the user. Furthermore, the disclosed validation and feedback mechanism from physical constraints and/or platform-specific details does not rely on a user's familiarity with every one of the various tools involved.

Accordingly, various methods, processes, and non-transitory storage media storing program code for an ML-based generation of digital model splices, function scripts, and/or digital thread orchestration scripts are within the scope of the present invention. With reference to the figures, embodiments of the present invention are now described in detail. First, IDMP and digital workflow-specific terminologies are introduced. Next, the IDMP is explained in detail. Finally, the digital workflow enhancing machine learning engine, which may be considered a subsystem of the IDMP, is described in detail.

Terminology

Some illustrative terminologies used herein are provided at the end of this document to assist in understanding the present invention, but these are not to be read as restricting the scope of the present invention. The terms may be used in the form of nouns, verbs, or adjectives, within the scope of the definition.

An Interconnected Digital Engineering/Model Platform (IDEP/IDMP) Architecture

FIG. 1 shows an exemplary interconnected digital model platform (IDMP) architecture, in accordance with some embodiments of the present invention. In what follows, the terms IDMP and IDEP are used interchangeably, as an interconnected digital engineering platform (IDEP) is a representative type of IDMP.

IDEP 100 streamlines the process of product development from conception to production, by using a virtual representation or digital twin (DTw) 122 of the product to optimize and refine features before building a physical prototype or physical twin (PTw) 132, and to iteratively update DTw 122 until DTw 122 and PTw 132 are in sync to meet the product's desired performance goals.

Specifically, a product (e.g., airplane, spacecraft, exploration rover, missile system, automobile, rail system, marine vehicle, remotely operated underwater vehicle, robot, drone, medical device, biomedical device, pharmaceutical compound, drug, power generation system, smart grid metering and management system, microprocessor, integrated circuit, building, bridge, tunnel, chemical plants, oil and gas pipeline, refinery, etc.) manufacturer may use IDEP platform 100 to develop a new product. The engineering team from the manufacturer may create or instantiate digital twin (DTw) 122 of the product in a virtual environment 120, encompassing detailed computer-aided design (CAD) models and finite element analysis (FEA) or computational fluid dynamics (CFD) simulations of component systems such as fuselage, wings, engines, propellers, tail assembly, and aerodynamics. DTw 122 represents the product's design and performance characteristics virtually, allowing the team to optimize and refine features before building a physical prototype 132 in a physical environment 130. In some embodiments, PTw 132 may be an existing entity, while DTw 122 is a digital instance that replicates individual configurations of PTw 132, as-built or as-maintained. In the present disclosure, for illustrative purposes only, DTw 122 and PTw 132 are discussed in the context of building a new product, but it would be understood by persons of ordinary skill in the art that the instantiation of DTw 122 and PTw 132 may take place in any order, based on the particular use case under consideration.

Digital models (e.g., CAD models, FEA models, CFD models) used for creating DTw 122 are shown within a model plane 180 in FIG. 1. Also shown in model plane 180 is a neural network (NN) model 184, which may provide machine-learning based predictive modeling and simulation for a DE process. A DE model such as 182 may be spliced into one or more model splices, such as 172 and 173 within a splice plane 170. Individual DTws such as 122 are instantiated from splice plane 170 via an application plane 160. A model splice such as 172 may be linked to another model splice such as 171 by a platform script or application 162 on application plane 160 into a digital thread. Multiple digital threads such as 162 and 163 may be further linked across different stages or phases of a product life cycle, from concept, design, testing, to production. Digital threads further enable seamless data exchange and collaboration between departments and stakeholders, ensuring optimized and validated designs.

As model splicing provides input and output splice functions that can access and modify DE model data, design updates and DE tasks associated with the digital threads may be represented by scripted, interconnected, and pipelined tasks arranged in Directed Acyclic Graphs (DAGs) such as 124. A DE task DAG example is discussed in further detail with reference to FIG. 10.

To enhance the design, external sensory data 140 may be collected, processed, and integrated into application plane 160. This process involves linking data from different sources, such as physical sensors 134 on prototype 132, physical environmental sensors 136, and other external data streams such as simulation data from model plane 180. API endpoints provide access to digital artifacts from various environments (e.g., physical twin (PTw) sensor 134 data) and integrate them into the spliced plane 170 for the DTw 122. Model splices on the splice plane 170 enable autonomous data linkages and digital thread generation, ensuring DTw 122 accurately represents the product's real-world performance and characteristics.

To validate DTw 122's accuracy, the engineering team may build or instantiate PTw 132 based on the same twin configuration (i.e., digital design). Physical prototype 132 may be equipped with numerous sensors 134, such as accelerometers and temperature sensors, to gather real-time performance data. This data may be compared with the DTw's simulations to confirm the product's performance and verify its design.

Processed sensory data 144 may be used to estimate parameters difficult to measure directly, such as aerodynamic forces or tire contact patch forces. Such processed sensory data provide additional data for DTw 122, further refining its accuracy and reliability. Processed sensory data 144 may be generated from physical environment sensors 136 with physical environment 130, and may be retrieved from other external databases 142, as discussed below.

During development, feedback from customers and market research may be collected to identify potential improvements or adjustments to the product's design. At an analysis & control plane (ACP) 150, subject matter experts (SMEs) may analyze processed sensory data 144 and external expert feedback 114, to make informed decisions on necessary design changes. Such an analysis 154 may be enhanced or entirely enabled by algorithms (i.e., static program code) or artificial intelligence (AI) modules. Linking of digital threads such as 162, physical sensors 134 and 136, processed sensory data 144, and expert feedback data 114 occurs at ACP 150, where sensor and performance data is compared, analyzed, leading to modifications of the underlying model files through digital threads.

In particular, sensory data 144 from physical environment 130 and performance data 126 from virtual environment 120 may be fed into a comparison engine 152. Comparison engine 152 may comprise tools that enable platform users to compare various design iterations with each other and with design requirements, identify performance lapses and trends, and run verification and validation (V&V) tools.

Model splicing is discussed in further detail with reference to FIGS. 7 to 9, and 11 to 33. Model splicing enables the scripting of any DE operation involving DE model files in model plane 180, where each DE model is associated with disparate and siloed DE tools. Codification of DE models and DE operations with a unified corpus of scripts enable IDEP 100 to become an aggregator where a large space of DE activities associated with a given product (e.g., airplane, spacecraft, exploration rover, missile system, automobile, rail system, marine vehicle, remotely operated underwater vehicle, robot, drone, medical device, biomedical device, pharmaceutical compound, drug, power generation system, smart grid metering and management system, microprocessor, integrated circuit, building, bridge, tunnel, chemical plants, oil and gas pipeline, refinery, etc.) may be threaded through program code. Thus, model splicing enables the linking and manipulation of all model files (e.g., 182, 184) associated with a given product within the same interconnected DE platform or DE ecosystem 100. As a consequence, the generation and training of AI modules for the purpose of manipulating DE models (e.g., 182), digital threads (e.g., 162), and digital twins (e.g., 122) become possible over the programmable and unified IDEP 100.

Virtual and Physical Feedback Loops

FIG. 1 uses letter labels "A" to "H" to denote different stages of a product's lifecycle. At each stage, IDEP 100 enables feedback loops whereby data emanating from a PTw or a DTw is analyzed at ACP 150, leading to the generation of a new twin configuration based on design modifications. The new twin configuration may be stored in a twin configuration set and applied through the application and splice planes, yielding modified model files that are registered on the digital thread.

A virtual feedback loop 104 starts with a decision 106 to instantiate new DTw 122. A DAG of hierarchical tasks 124 allows the automated instantiation of DTw 122 within virtual environment 120, based on a twin configuration applied at a process step 108 from a twin configuration set 156. DTw 122 and/or components thereof are then tested in virtual environment 120, leading to the generation of DTw performance data 126. Concurrently, DTw 122 and/or components thereof may be tested and simulated in model plane 180 using DE software tools, giving rise to test and simulation performance data 174. Performance data 126 and 174 may be combined, compared via engine 152, and analyzed at ACP 150, potentially leading to the generation and storage of a new twin configuration. The eventual decision to instantiate a DTw from the new twin configuration completes virtual feedback loop 104.

A physical feedback loop 102 starts with a decision 106 to instantiate a new PTw 132. PTw 132 may be instantiated in a physical environment 130 from the model files of model plane 180 that are associated with an applied twin configuration from the twin configuration set 156. PTw 132 and/or components thereof are then tested in physical environment 132, leading to the generation of sensory data from PTw sensors 134 and environmental sensors 136 located in physical environment 130. This sensory data may be combined with data from external databases to yield processed sensory data 144.

Data from PTw sensors 134 may be directly added to the model files in model plane 180 by the DE software tools used in the design process of PTw 132. Alternatively, PTw sensor data may be added to digital thread 162 associated with PTw 132 directly via application plane 160. In addition, processed sensory data 144 may be integrated into IDEP 100 directly via application plane 160. For example, processed sensory data 144 may be sent to ACP 150 for analysis, potentially leading to the generation and storage of a new twin configuration. The eventual decision to instantiate a PTw from the new twin configuration completes physical feedback loop 102.

At each stage A to H of the product life cycle, the system may label one twin configuration as a current design reference, herein described as an "authoritative twin" or "authoritative reference". The authoritative twin represents the design configuration that best responds to actual conditions (i.e., the ground truth). U.S. provisional patent application No. 63/470,870 provides a more complete description of authoritative twins and their determination, and is incorporated by reference in its entirety herein.

With faster feedback loops from sensor data and expert recommendations, the system updates DTw 122 to reflect latest design changes. This update process may involve engineering teams analyzing feedback 154 and executing the changes through IDEP 100, or automated changes enabled by IDEP 100 where updates to DTw 122 are generated through programmed algorithms or AI modules. This iterative updating process continues until DTw 122 and PTw 132 are in sync and the product's performance meets desired goals. While IDEP 100 may not itself designate the authoritative reference between a DTw or a PTw, the platform provides configurable mechanisms such as policies, algorithms, voting schema, and statistical support, whereby agents may designate a new DTw as the authoritative DTw, or equivalently in what instances the PTw is the authoritative source of truth.

When significant design improvements are made, a new PTw prototype may be built based on the updated DTw. This new prototype undergoes further testing and validation, ensuring the product's performance and design align with project objectives.

Once DTw 122 and PTw 132 have been validated and optimized, the product is ready for production. A digital thread connecting all stages of development can be queried via splice plane 170 to generate documentation as needed to meet validation and verification requirements. The use of model splicing, along with the feedback architecture shown in FIG. 1, improves the efficiency of the overall product innovation process.

Interconnected DE Platform and Product Lifecycle

In FIG. 1, letter labels "A" to "H" indicate the following major steps of a product lifecycle, according to some embodiments of the current invention:

A. Digital models reside within customer environments: a product may be originally represented by model files that are accessible via software tools located within customer environments. Model plane 180 encompasses all model files (e.g., 182) associated with the product.

B. Preparatory steps for design in the digital realm: splice plane 170 encompasses model splices (e.g., 172) generated from DE model file through model splicing. Model splicing enables the integration and sharing of DE model files within a single platform, as described in detail with reference to FIGS. 7 to 9, and 11 to 33

C. Link threads as needed among model splices: to implement a product, model splices are linked through scripts within application plane 160. A digital twin (DTw) 122 englobing as-designed product features may be generated from application plane 160 for running in virtual environment 120. The complete twin configuration of a generated DTw is saved in twin configuration set 156 located at the analysis & control plane (ACP) 150. Features or parts of DTw 122 may be simulated in model plane 180, with performance data 174 accessed through splice plane 170. In one embodiment, features or parts of PTw 132 or DTw 122 configuration may be simulated outside the platform, where performance data is received by the ACP 150 for processing, in a similar way as performance data 126 received from DTw 122.

D. Finalize "As-designed": performance data 126 from DTw 122 or simulation performance data 174 attained through model plane 180 and accessed through model splicing may be collected and sent to ACP 150 for analysis. Performance data from different iterations of DTw 122 may be compared via engine 152 to design requirements. Analysis of the differences may lead to the generation of new twin configurations that are stored at twin configuration set 156. Each twin configuration in twin configuration set 156 may be applied at application plane 160 and splice plane 170 via process step 108 to instantiate a corresponding DTw. Multiple DTws may be generated and tested, consecutively or simultaneously, against the design requirements, through comparison engine 152 and analysis module 154. Verification and validation tools may be run on the various DTw iterations.

E. Finalize "As-manufactured": once a DTw 122 satisfies the design requirements, a corresponding PTw 132 prototype may be instantiated from the spliced model files (e.g., 172). Sensor data originating from the PTw 134 or from within the physical environment 136 may be collected, combined with other external data 142 (e.g., sensor data from other physical environments). The resulting processed sensory data 144 may be sent to the analysis & control plane 150 to be compared with performance data 126 from DTws and simulations (e.g., 174), leading to further DTw 122 and PTw 132 iterations populating the twin configuration set 156. Processed sensory data 144 may also be mapped to the digital threads (e.g., 164) and model splices (e.g., 172) governing the tested PTw 132 through the application plane 160.

F. Finalize "As-assembled": once the manufacturing process is completed for the various parts, as a DTw and as a PTw, the next step is to finalize the assembled configuration. This involves creating a digital representation of the assembly to ensure it meets the specified requirements. The digital assembly takes into account the dimensions and tolerances of the "as-manufactured" parts. To verify the feasibility of the digital assembly, tests are conducted using the measured data obtained from the physical assembly and its individual components. Measurement data from the physical component parts may serve as the authoritative reference for the digital assembly, ensuring alignment with the real-world configuration. The digital assembly is compared with the actual physical assembly requirements for validation of the assembled configuration. Subsequently, the digital assembly tests and configurations serve as an authoritative reference for instructions to guide the physical assembly process and ensure accurate replication. IDEP 100 components described above may be used in the assembly process. In its authoritative iteration, DTw 122 ultimately captures the precise details of the physical assembly, enabling comprehensive analysis and control in subsequent stages of the process.

G. Finalize "As-operated": to assess the performance of the physical assembly or its individual component parts, multiple digital twins 122 may be generated as needed. These digital twins are created based on specific performance metrics and serve as virtual replicas of the physical system. Digital twins 122 are continuously updated and refined in real-time using the operational data (e.g., 144) collected from monitoring the performance of the physical assembly or its components. This data may include, but are not limited to, processed sensory data, performance indicators, and other relevant information. By incorporating this real-time operational data, digital twins 122 stay synchronized with the actual system and provide an accurate representation of its operational performance. Any changes or improvements observed via sensory data 144 during the real-world operation of the assembly are reflected in DE models within the digital twins and recorded in the twin configuration set 156. This ensures that the digital twins remain up-to-date and aligned with the current state of the physical system.

H. Predictive analytics/Future performance: The design process may continue iteratively in virtual environment 120 through new DTw 122 configurations as the product is operated. Multiple digital twins may be created to evaluate the future performance of the physical assembly or its component parts based on specific performance metrics. Simulations are conducted with various control policies to assess the impact on performance objectives and costs. The outcome of these simulations helps in deciding which specific control policies should be implemented (e.g., tail volume coefficients and sideslip angle for an airplane product). The digital twin DE models (e.g., 182) are continuously updated and refined using the latest sensor data, control policies, and performance metrics to enhance their predictive accuracy. This iterative process ensures that the digital twins (e.g., 122, 156) provide reliable predictions of future performance and assist in making informed decisions.

Figure 3:
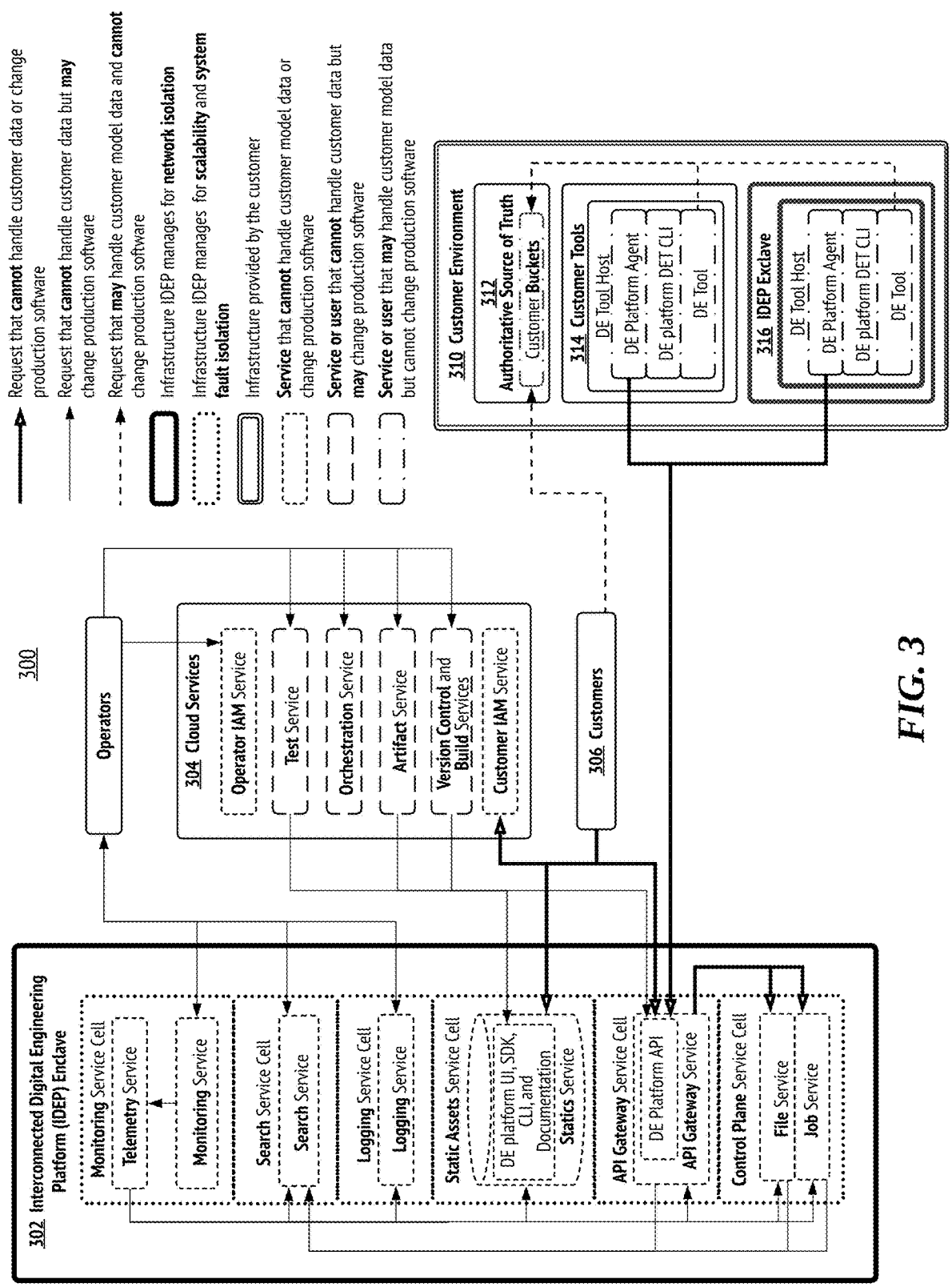
FIG. 3 shows another exemplary implementation of the IDEP illustrating its offered services and features, in accordance with some embodiments of the present invention.
Figure 4:
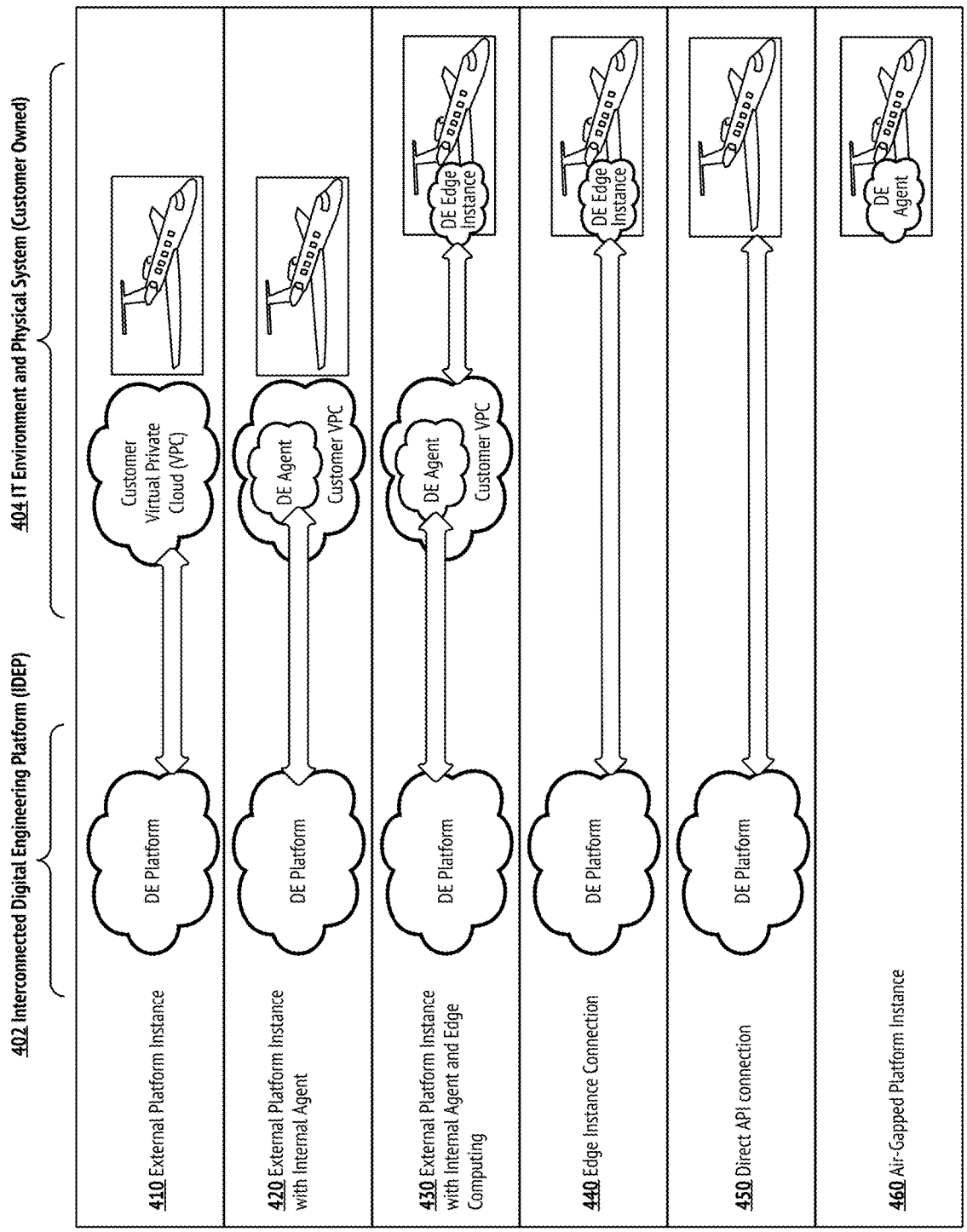
FIG. 4 shows potential scenarios for instantiating an IDEP in connection to a customer's physical system and IT environment, in accordance with some embodiments of the present invention.

The hardware components making up IDEP 100 (e.g., servers, computing devices, storage devices, network links) may be centralized or distributed among various entities, including one or more DE service providers and DE clients, as further discussed in the context of FIGS. 3 and 4. FIG. 4 shows an illustration of various potential configurations for instancing a DE platform within a customer's physical system and information technology (IT) environment, usually a virtual private cloud (VPC) protected by a firewall.

DE Documentation with Live or Magic Documents

The methods and systems described herein enable the updating and generation of DE documents using the full functionality of the IDEP shown in FIG. 1. In FIG. 1, the IDEP virtual feedback loop 104 allows the scripting of program code within a digital thread 162 for the generation, storing, and updating of digital twins 122 and twin configurations 156. Similarly, the IDEP virtual feedback loop 104 also allows the scripting of program code within a digital thread 162 for the generation, storing, and updating of DE documents. This enables the creation and maintenance of so-called live digital engineering documents.

Live DE documents are more akin to a DTw than a conventional static document in that they are configured, through a digital thread, to be continuously updated to reflect the most current changes within a particular twin configuration. In particular, an authoritative live DE document is configured to reflect the latest authoritative twin configuration. The "printing" of a live DE document corresponds to the generation of a frozen (i.e., static) time-stamped version of a live DE document. Therefore, "printing"—for a live DE document—is equivalent to "instantiation" for a DTw.

Live DE documents may also be known as magic documents as changes implemented within a twin configuration (e.g., through a modification of a model file) may appear instantaneously within the relevant data fields and sections of the live DE document. Similarly, authoritative live DE documents may also be known as authoritative magic documents as they continuously reflect data from the authoritative twin, thus always representing the authoritative source of truth.

Given the massive quantities of data and potential modifications that are carried out during a product's lifecycle, the scripts implementing live DE documentation may be configured to allow for a predefined maximum delay between the modification of a model file and the execution of the corresponding changes within a live DE document. Moreover, for similar reasons, the scripts implementing live DE documentation may be restricted to operate over a specified subset of model files within a DTw, thus reflecting changes only to key parameters and configurations of the DTw.

In one embodiment of the present invention, an IDEP script (e.g., an IDEP application) having access to model data via one or more model splices and DE document templates to create and/or update a live DE document may dynamically update the live DE document using software-defined digital threads over an IDEP platform. In such an embodiment, the IDEP script may receive user interactions dynamically. In response to the user updating data for a model and/or a specific parameter setting, the IDEP script may dynamically propagate the user's updates into the DE document through a corresponding digital thread.

In another embodiment of the present invention, the IDEP script may instantiate a DE document with sufficient specification to generate a physical twin (PTw). In such an embodiment, the IDEP script may receive a digital twin configuration of a physical twin, generate a live DE document associated with the digital twin configuration, receive a predetermined timestamp, and generate a printed DE document (i.e., a static, time-stamped version of the live DE document at the predetermined timestamp). Such an operation may be referred to as the "printing of a digital twin".

In yet another embodiment of the present invention, an IDEP script may instantiate (i.e., "print") a DE document specifying an updated digital twin upon detecting the update. In such an embodiment, the IDEP script may detect a modification of a DE model or an associated digital thread. In response to detecting the modification, the IDEP script may update relevant data fields and sections of the live DE document based on the detected modification, and generate an updated printed DE document with the updated relevant data fields and sections based on the always-updated live DE document.

In various embodiments, a software-defined digital thread can be associated with a companion magic document (or "magic doc") that encompasses live updates for one or more core parameters of the digital thread. In one embodiment, the magic doc includes key parameters describing the implementation of a user's intent. For example, in one embodiment, a companion magic doc for a given digital thread may include key data points and key orchestration script examples illustrating a user's intent (e.g., "increase a drone's wing span by 1%"). In one embodiment, a script-generating ML model receiving as input pseudocode or detailed user instructions derived from a user's intent, is trained on prior IDEP digital threads and documents. In addition to generating a digital thread (with orchestration scripts and comments), the script-generating ML model is also configured to generate a magic doc that explains how the generated digital thread addresses the user intent.

In some embodiments, receiving user interactions with a DE model, modifications to a DE model, or modifications to an associated digital thread, may be carried out through a push configuration, where a model splicer or a script of the digital thread sends any occurring relevant updates to the IDEP script immediately or within a specified maximum time delay. In other embodiments, receiving user interactions with a DE model, modifications of a DE model, or modifications of an associated digital thread, may be carried out through a pull configuration, where a model splicer or a script of the digital thread flag recent modifications until the IDEP script queries relevant DE models (via their model splices) or associated digital threads, for flagged modification. In these embodiments, the IDEP script may extract the modified information from the modified DE models (via their model splices) or the modified digital threads, in order to update a live DE document. In yet other embodiments, receiving user interactions with a DE model, modifications of a DE model, or modifications of an associated digital thread, may be carried out through a pull configuration, where the IDEP script regularly checks relevant DE models (via their model splices) or associated digital threads, for modified data fields, by comparing the data found in the live DE document with regularly extracted model and digital thread data. In these embodiments, the IDEP script may use the modified data to update the live DE document.

Dynamic Document Updates

Some embodiments described herein center around documentation, or document preparation and update and on document management (e.g., for reviews). As discussed, some embodiments of the system allow for dynamic updates to documents, which pertain to software-defined digital threads in the IDEP platform and the accompanying documentation.

Use of an ML engine with the model data and templates to create and/or update documents almost instantaneously as a one-time action have been presented. Furthermore, the digital engineering platform interacts dynamically with the user. As the user interacts with the system and updates data for a model or a specific parameter setting, these changes may be propagated through the corresponding digital threads and to the associated documentation. The AI architectures involved include locally-instanced large language model (LLMs, for data security reasons) as well as non-LLM approaches (e.g., NLP-based), in order to create, update, or predict documentation in the form of sentences, paragraphs, and whole documents. At the same time, trying to update the entire system of digital threads for every update may be prohibitively slow and may present security risks to the system. Generating live DE documents that are updated based on a subset of a system's DE models and within a maximum time delay may therefore be more efficient.

Interconnected Digital Engineering and Certification Ecosystem

Figure 2:
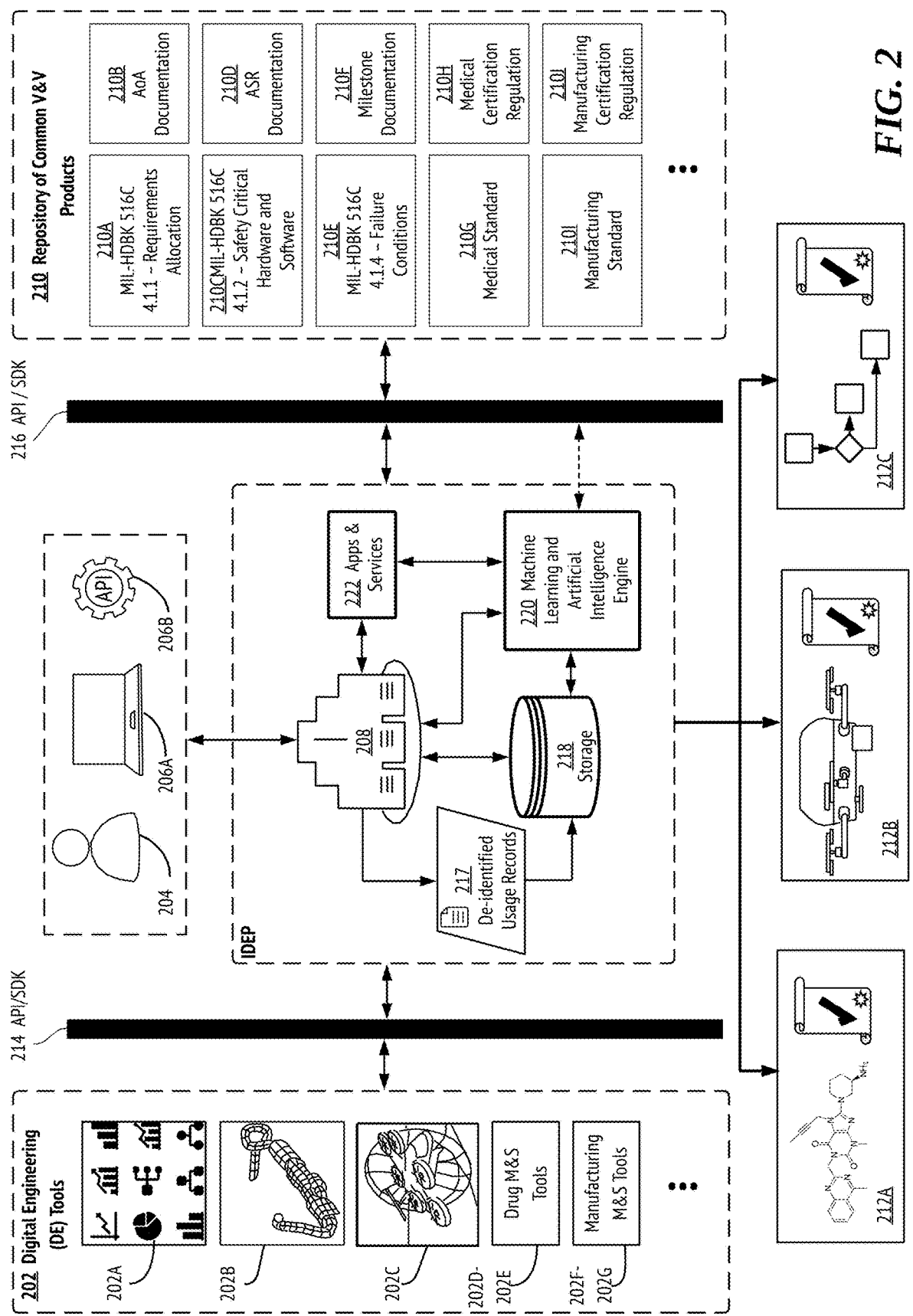
FIG. 2 shows an exemplary implementation of an IDEP as an interconnected digital engineering (DE) and certification ecosystem, and exemplary digitally certified products, in accordance with some embodiments of the present invention.

FIG. 2 shows an exemplary implementation of the IDEP as an interconnected digital engineering (DE) and certification ecosystem 200, and exemplary digitally certified products, in accordance with some embodiments of the present invention. Interconnected DE and certification ecosystem 200 may be viewed as a particular instantiation or implementation of IDEP 100 shown in FIG. 1. The IDEP may also be referred to as a "DE Metaverse."

Interconnected DE and certification ecosystem 200 is a computer-based system that links models and simulation tools with their relevant requirements in order to meet verification, validation, and certification purposes. Verification refers to methods of evaluating whether a product, service, or system meets specified requirements and is fit for its intended purpose. For example, in the aerospace industry, a verification process may include testing an aircraft component to ensure it can withstand the forces and conditions it will encounter during flight. Verification also includes checking externally against customer or stakeholder needs. Validation refers to methods of evaluating whether the overall performance of a product, service, or system is suitable for its intended use, including its compliance with regulatory requirements and its ability to meet the needs of its intended users. Validation also includes checking internally against specifications and regulations. Interconnected DE and certification ecosystem 200 as disclosed herein is designed to connect and bridge large numbers of disparate DE tools and models from multitudes of engineering domains and fields, or from separate organizations who may want to share models with each other but have no interactions otherwise. In various embodiments, the system implements a robust, scalable, and efficient DE model collaboration platform, with extensible model splices having data structures and accompanying functions for widely distributed DE model types and DE tools, an application layer that links or connects DE models via APIs, digital threads that connect live engineering model files for collaboration and sharing, digital documentation management to assist with the preparation of engineering and certification documents appropriate for verification and validation (V&V) purposes, and AI-assistance with the functionalities of the aforementioned system components.

More specifically, FIG. 2 shows an example of an interconnected DE and certification ecosystem and examples of digitally certified products 212A, 212B, and 212C (collectively referred to as digitally certified products 212). For example, in some implementations, digitally certified product 212A may be an unmanned aerial vehicle (UAV) or other aircraft, digitally certified product 212B may be a drug or other chemical or biologic compound, and the digitally certified product 212C may be a process such as a manufacturing process. In general, the digitally certified products 212 can include any product, process, or solution that can be developed, tested, or certified (partially or entirely) using DE tools such as 202. In some implementations, digitally certified products 212 may not be limited to physical products, but can include non-physical products such as methodologies, processes and software, etc. While physical and physically-interacting systems often require multiple DE tools to assess for compliance with common V&V products simply by virtue of the need for modeling and simulation (M&S), many complex non-physical systems may also require multiple DE tools for product development, testing, and/or certification. With this in mind, various other possibilities for digitally certified products will be recognized by one of ordinary skills in the art. The inclusion of regulatory and certification standards, compliances, calculations, and tests (e.g., for the development, testing, and certification of products and/or solutions) enables users to incorporate relevant regulatory and certification standards, compliances, calculations, and test data directly into their DE workflow. Regulatory and certification standards, compliances, calculations, and tests are sometimes referred to herein as "common validation and verification (V&V) products."

Digitally certified products 212 in FIG. 2 may be designed and/or certified using interconnected DE and certification ecosystem 200. Interconnected DE and certification ecosystem 200 may include a user device 206A, API 206B, or other similar human-to-machine, or machine-to-machine communication interfaces operated by a user. A user may be a human 204 of various skill levels, or artificial users such as algorithms, artificial intelligence, or other software that interface with ecosystem 200 through API 206B. Ecosystem 200 may further comprise a computing and control system 208 ("computing system 208" hereinafter) connected to and/or including a data storage unit 218, an artificial intelligence (AI) engine 220, and an application and service layer 222. In some embodiments, the artificial intelligence (AI) engine 220 is a machine learning (ML) engine. References to "machine learning engine 220" or "ML engine 220" may be extended to artificial intelligence (AI) engines 220 more generally. For the purposes of clarity, any user selected from various potential human or artificial users are referred to herein simply as the user 204. In some implementations, computing system 208 may be a centralized computing system; in some implementations, computing system 208 may be a distributed computing system. In some cases, user 204 may be considered part of ecosystem 200, while in other implementations, user 204 may be considered separately from ecosystem 200. Ecosystem 200 may include one or more DE tools 202, such as data analysis tool 202A, computer-aided design (CAD) and finite element analysis (FEA) tool 202B, simulation tool 202C, drug modeling and simulation (M&S) tools 202D-202E, manufacturing M&S tools 202F-202G, etc. Ecosystem 200 may also include a repository of common V&V products 210, such as regulatory standards 210A-210F related to the development and certification of a UAV, medical standard 210G (e.g., CE marking (Europe), FCC Declaration of Conformity (USA), IECEE CB Scheme (Europe, North America, parts of Asia & Australia), CDSCO (India), FDA (USA), etc.), medical certification regulation 210H (e.g., ISO 13485, ISO 14971, ISO 9001, ISO 62304, ISO 10993, ISO 15223, ISO 11135, ISO 11137, ISO 11607, IEC 60601, etc.), manufacturing standard 210I (e.g., ISO 9001, ISO 9013, ISO 10204, EN 1090, ISO 14004, etc.), and manufacturing certification regulation 210J (e.g., General Certification of Conformity (GCC), etc.), etc.

In FIG. 2, computing system 208 is centrally disposed within the architecture and is configured to communicate with (e.g., receive data from and transmit data to) user device 206A or API 206B such as an API associated with an artificial user, DE tools 202 via an API or software development kit (SDK) 214, and repository of common V&V products 210 via an API/SDK interface 216. For example, computing system 208 may be configured to communicate with user device 206A and/or API 206B to send or receive data corresponding to a prototype of a design, information about a user (e.g., user credentials), engineering-related inputs/outputs associated with DE tools 202, digitized common V&V products, an evaluation of a product design, user instructions (e.g., search requests, data processing instructions, etc.), and more. Computing system 208 may also be configured to communicate with one or more DE tools 202 to send engineering-related inputs for executing analyses, models, simulations, tests, etc. and to receive engineering-related outputs associated with the results. Computing system 208 may also be configured to communicate with repository of common V&V products 210 to retrieve data corresponding to one or more digitized common V&V products 210 and/or upload new common V&V products, such as those received from user 204, to repository of common V&V products 210. All communications may be transmitted and corroborated securely, for example, using methods relying on zero-trust security. In some implementations, the computing system of the ecosystem may interface with regulatory and/or certification authorities (e.g., via websites operated by the authorities) to retrieve digitized common V&V products published by the regulatory authorities that may be relevant for a product that a user is designing. In some implementations, the user may upload digitized common V&V products to the ecosystem themselves.

Computing and control system 208 may process and/or store the data that it receives to perform analysis and control functionalities, and in some implementations, may access machine learning engine 220 and/or application and service layer 222, to identify useful insights based on the data, as further described herein. The central disposition of computing system 208 within the architecture of the ecosystem has many advantages including reducing the technical complexity of integrating the various DE tools; improving the product development experience of user 204; intelligently connecting common V&V products such as standards 210A-210F to DE tools 202 most useful for satisfying requirements associated with the common V&V products; and enabling the monitoring, storing, and analysis of the various data that flows between the elements of the ecosystem throughout the product development process. In some implementations, the data flowing through and potentially stored by the computing system 208 can also be auditable to prevent a security breach, to perform data quality control, etc. Similarly, any analysis and control functions performed via computing system 208 may be tracked for auditability and traceability considerations.

Referring to one particular example shown in FIG. 2, user 204 may use the DE and certification ecosystem to produce a digitally certified UAV 212B. For example, user 204 may be primarily concerned with certifying the UAV as satisfying the requirements of a particular regulatory standard 210E relating to failure conditions of the UAV (e.g., "MIL-HDBK 516C 4.1.4—Failure Conditions"). In this usage scenario, user 204 may develop a digital prototype of the UAV on user device 206A or using API 206B and may transmit prototype data (e.g., as at least one of a CAD file, a MBSE file, etc.) to computing system 208. Along with the prototype data, user 204 can transmit, via user device 206A, additional data including an indication of the common V&V product that user 204 is interested in certifying the product for (e.g., regulatory standard 210E), user credential information for accessing one or more capabilities of computing system 208, and/or instructions for running one or more digital models, tests, and/or simulations using a subset of DE tools 202.

Referring to another example shown in FIG. 2, user 204 can use the DE and certification ecosystem to produce a digitally certified drug, chemical compound, or biologic 212A. For example, user 204 may be primarily concerned with certifying drug, chemical compound, or biologic 212A as satisfying the requirements of a particular medical standard 210G and medical certification regulation 210H. In this usage scenario, user 204 can develop a digital prototype of the drug, chemical compound, or biologic on user device 206A or using API 206B and can transmit the prototype data (e.g., as a molecular modeling file) to computing system 208. Along with the prototype data, user 204 can transmit, via user device 206A, additional data including an indication of the common V&V products that user 204 is interested in certifying the product for (e.g., medical standard 210G and medical certification regulation 210H), user credential information for accessing one or more capabilities of computing system 208, and/or instructions for running one or more digital models, tests, and/or simulations using a subset of DE tools 202 (e.g., drug M&S tools 202D-202E).

Referring to yet another example shown in FIG. 2, user 204 can use the digital engineering and certification ecosystem to produce a digitally certified manufacturing process 212C. For example, user 204 may be primarily concerned with certifying manufacturing process 212C as satisfying the requirements of a particular manufacturing standard 210I and manufacturing certification regulation 210J. In this usage scenario, user 204 can develop a digital prototype of the manufacturing process on user device 206A or using API 206B and can transmit the prototype data to computing system 208. Along with the prototype data, user 204 can transmit, via the user device 206A, additional data including an indication of the common V&V products that user 204 is interested in certifying the process for (e.g., manufacturing standard 210I and manufacturing certification regulation 210J), user credential information for accessing one or more capabilities of computing system 208, and/or instructions for running one or more digital models, tests, and/or simulations using a subset of DE tools 202 (e.g., manufacturing M&S tools 202F-202G).

In any of the aforementioned examples, computing system 208 can receive the data transmitted from user device 206A and/or API 206B and can process the data to evaluate whether the common V&V product of interest (e.g., regulatory standard 210E, medical standard 210G, medical certification regulation 210H, manufacturing standard 210I, manufacturing certification regulation 210J, etc.) is satisfied by the user's digital prototype, in the context of analysis and control plane 150 shown in FIG. 1. For example, this can involve communicating with the repository of common V&V products 210 via the API/SDK 216 to retrieve the relevant common V&V product of interest and processing the regulatory and/or certification data associated with the common V&V product to identify one or more requirements for the UAV prototype; the drug, chemical compound, or biologic prototype; the manufacturing process prototype; etc. In some implementations, repository of common V&V products 210 can be hosted by a regulatory and/or certification authority (or another third party), and retrieving the regulatory and/or certification data can involve using API/SDK 216 to interface with one or more data resources maintained by the regulatory and/or certification authority (or the another third party). In some implementations, the regulatory and/or certification data can be provided directly by user 204 via user device 206A and/or API 206B (e.g., along with the prototype data).

Evaluating whether the common V&V product of interest is satisfied by the user's digital prototype can also involve processing the prototype data received from user device 206A or API 206B to determine if the one or more identified requirements are actually satisfied. In some implementations, computing system 208 can include one or more plugins, local applications, etc. to process the prototype data directly at the computing system 208. For example, model splicing and digital threading applications are discussed in detail later with reference to FIG. 6 to 9. In some implementations, the computing system can simply pre-process the received prototype data (e.g., to derive inputs for DE tools 202) and can then transmit instructions and/or input data to a subset of DE tools 202 via API/SDK 214 for further processing.

Not all DE tools 202 are necessarily required for the satisfaction of particular regulatory and/or certification standards. Therefore, in the UAV example provided in FIG. 2, computing system 208 may determine that only a data analysis tool 202A and a finite element analysis tool 202B are required to satisfy regulatory standard 210E for failure conditions. In the drug, chemical compound, or biologic example provided in FIG. 2, computing system 208 may determine that only drug M&S tools 202D-202E are required to satisfy medical standard 210G and medical certification regulation 210H. In the manufacturing process example provided in FIG. 2, computing system 208 may determine that only manufacturing M&S tools 202F-202G are required to satisfy manufacturing standard 210I and manufacturing certification regulation 210J. In other implementations, user 204 may themselves identify the particular subset of DE tools 202 that should be used to satisfy the common V&V product of interest, provided that user 204 is a qualified subject matter expert (SME). In other implementations, user 204 may input to computing system 208 some suggested DE tools 202 to satisfy a common V&V product of interest, and computing system 208 can recommend to user 204 a modified subset of DE tools 202 for final approval by user 204, provided that user 204 is a qualified SME. After a subset of DE tools 202 has been identified, computing system 208 can then transmit instructions and/or input data to the identified subset of DE tools 202 to run one or more models, tests, and/or simulations. The results (or "engineering-related data outputs" or "digital artifacts") of these models, tests, and/or simulations can be transmitted back and received at computing system 208.

In still other implementations, user 204 may input a required DE tool such as 202F for meeting a common V&V product 210I, and the computing system 208 can determine that another DE tool such as 102G is also required to satisfy common V&V product 210I. The computing system can then transmit instructions and/or input data to both DE tools (e.g., 202F and 202G), and the outputs of these DE tools can be transmitted and received at computing system 208. In some cases, the input data submitted to one of the DE tools (e.g., 202G) can be derived (e.g., by computing system 208) from the output of another of the DE tools (e.g., 202F).

After receiving engineering-related data outputs or digital artifacts from DE tools 202, computing system 208 can then process the received engineering-related data outputs to evaluate whether or not the requirements identified in the common V&V product of interest (e.g., regulatory standard 210E, medical standard 2110G, medical certification regulation 210H, manufacturing standard 210I, manufacturing certification regulation 210J, etc.) are satisfied. For example, applications and services 222 may provide instructions for orchestrating validation or verification activities. In some implementations, computing system 208 can generate a report summarizing the results of the evaluation and can transmit the report to device 206A or API 206B for review by user 204. If all of the requirements are satisfied, then the prototype can be certified, resulting in digitally certified product 212 (e.g., digitally certified drug, chemical compound, or biologic 212A; digitally certified UAV 212B; digitally certified manufacturing process 212C, etc.). However, if some of the regulatory requirements are not satisfied, then additional steps may need to be taken by user 204 to certify the prototype of the product. In some implementations, the report that is transmitted to the user can include recommendations for these additional steps (e.g., suggesting one or more design changes, suggesting the replacement of one or more components with a previously designed solution, suggesting one or more adjustments to the inputs of the models, tests, and/or simulations, etc.). If the requirements of a common V&V product are partially met, or are beyond the collective capabilities of distributed engineering tools 202, computing systems 208 may provide user 204 with a report recommending partial certification, compliance, or fulfillment of a subset of the common V&V products (e.g., digital certification of a subsystem or a sub-process of the prototype). The process of generating recommendations for user 204 is described in further detail below.

In response to reviewing the report, user 204 can make design changes to the digital prototype locally and/or can send one or more instructions to computing system 208 via user device 206A or API 206B. These instructions can include, for example, instructions for computing system 208 to re-evaluate an updated prototype design, use one or more different DE tools 202 for the evaluation process, and/or modify the inputs to DE tools 202. Computing system 208 can, in turn, receive the user instructions, perform one or more additional data manipulations in accordance with these instructions, and provide user 204 with an updated report. Through this iterative process, user 204 can utilize the interconnected digital engineering and certification ecosystem to design and ultimately certify (e.g., by providing certification compliance information) the prototype (e.g., the UAV prototype, drug prototype, manufacturing process prototype, etc.) with respect to the common V&V product of interest. Importantly, since all of these steps occur in the digital world (e.g., with digital prototypes, digital models/tests/simulations, and digital certification), significant amount of time, cost, and materials can be saved in comparison to a process that would involve the physical prototyping, evaluation and/or certification of a similar UAV, drug, manufacturing process, etc. If the requirements associated with a common V&V product are partially met, or are beyond the collective capabilities of DE tools 202, computing system 208 may provide user 204 with a report recommending partial certification, compliance or fulfillment of a subset of the common V&V products (e.g., digital certification of a subsystem or a sub-process of the prototype).

While the examples described above focus on the use of the interconnected digital engineering and certification ecosystem by a single user, additional advantages of the ecosystem can be realized through the repeated use of the ecosystem by multiple users. As mentioned above, the central positioning of computing system 208 within the architecture of the ecosystem enables computing system 208 to monitor and store the various data flows through the ecosystem. Thus, as an increasing number of users utilize the ecosystem for digital product development, data associated with each use of the ecosystem can be stored (e.g., in storage 218), traced (e.g., with metadata), and analyzed to yield various insights, which can be used to further automate the digital product development process and to make the digital product development process easier to navigate for non-subject matter experts.

Indeed, in some implementations, user credentials for user 204 can be indicative of the skill level of user 204, and can control the amount of automated assistance the user is provided. For example, non-subject matter experts may only be allowed to utilize the ecosystem to browse pre-made designs and/or solutions, to use DE tools 202 with certain default parameters, and/or to follow a predetermined workflow with automated assistance directing user 204 through the product development process. Meanwhile, more skilled users may still be provided with automated assistance, but may be provided with more opportunities to override default or suggested workflows and settings.

In some implementations, computing system 208 can host applications and services 222 that automate or partially automate components of common V&V products; expected or common data transmissions, including components of data transmissions, from user 204; expected or common interfaces and/or data exchanges, including components of interfaces, between various DE tools 202; expected or common interfaces and/or data exchanges, including components of interfaces, with machine learning (ML) models implemented on computing system 208 (e.g., models trained and/or implemented by the ML engine 220); and expected or common interfaces and/or data exchanges between the applications and services themselves (e.g., within applications and services layer 222).

In some implementations, the data from multiple uses of the ecosystem (or a portion of said data) can be aggregated to develop a training dataset. For example, usage records 217 collected via computing system 208 may be de-identified or anonymized, before being added to the training set. Such usage records may comprise model parameters and metadata, tool configurations, common V&V product matching to specific models or tools, user interactions with the system including inputs and actions, and other user-defined or system-defined configurations or decisions in using the ecosystem for digital engineering and certification. For instance, an exemplary de-identified usage record may comprise the combination of a specific DE tool, a specific target metric, a specific quantity deviation, and a corresponding specific user update to a DE model under this configuration. Another exemplary de-identified usage record may comprise a user-identified subset of DE tools 202 that should be used to satisfy a common V&V product of interest.

This training dataset can then be used to train ML models (e.g., using ML engine 220) to learn the steps and actions for certification processes and to perform a variety of tasks including the identification of which of DE tools 202 to use to satisfy a particular common V&V product; the identification of specific models, tests, and/or simulations (including inputs to them) that should be performed using DE tools 202; the identification of the common V&V products that need to be considered for a product of a particular type; the identification of one or more recommended actions for user 204 to take in response to a failed regulatory requirement; the estimation of model/test/simulation sensitivity to particular inputs; etc. The outputs of the trained ML models can be used to implement various features of the interconnected digital engineering and certification ecosystem including automatically suggesting inputs (e.g., inputs to DE tools 202) based on previously entered inputs, forecasting time and cost requirements for developing a product, predictively estimating the results of sensitivity analyses, and even suggesting design changes, original designs or design alternatives (e.g. via assistive or generative AI) to a user's prototype to overcome one or more requirements (e.g., regulatory and/or certification requirements) associated with a common V&V product. In some implementations, with enough training data, ML engine 220 may generate new designs, models, simulations, tests, common V&V products and/or digital threads on its own based on data collected from multiple uses of the ecosystem. Furthermore, such new designs, models, simulations, tests, common V&V products and digital threads generated by ML engine 220, once approved and adjusted by a user, may be added to the training set for further fine-tuning of ML algorithms in a reinforcement learning setup.

As shall be discussed in the context of FIGS. 7 to 9 and 11 to 33, the aforementioned collection of training datasets and the training of ML and AI modules including ML engine 220 may be enabled by model splicing technologies. Model splicing, as described herein, allows the scripting of DE model operations encompassing disparate DE tools into a corpus of normative program code, and facilitates the code-defined digital threading of a large space of DE activities involving DE models across different disciplines. ML and AI techniques may be used to create scripts to carry out almost any DE task and to execute any digital thread, allowing for programmable, machine-learnable, and dynamic changes to DE model files, digital threads, and ultimately to digital or physical twins, throughout the product life cycle. For example, in the embodiment shown in FIG. 2, ML engine 220 may manage or orchestrate the interactions between spliced DE models, DE tools, and common V&V products (e.g., DE requirements), based on digital thread options specific to user's intent and input. Sample DE tasks that may be carried out by ML engine 220 include, but are not limited to, (1) aligning models/analysis to certification lifecycle requirement steps, (2) optimizing compute by determining the appropriate fidelity of each model, (3) optimizing compute resources for specific tools/models, or (4) optimizing compute resources across multiple models. ML-enabled executions of DE tasks are not limited to certification or resource optimization, but encompass the whole DE space of operations. Rather, ML engine 220 may act as an AI multiplexer for the DE platform.

In addition to storing usage data to enable the development of ML models, previous prototype designs and/or solutions (e.g., previously designed components, systems, models, simulations and/or other engineering representations thereof) can be stored within the ecosystem (e.g., in storage 218) to enable users to search for and build upon the work of others. For example, previously designed components, systems, models, simulations and/or other engineering representations thereof can be searched for by user 204 and/or suggested to user 204 by computing system 208 in order to satisfy one or more requirements associated with a common V&V product. The previously designed components, systems, models, simulations and/or other engineering representations thereof can be utilized by user 204 as is, or can be utilized as a starting point for additional modifications. This store, or repository, of previously designed components, systems, models, simulations and/or other engineering representations thereof (whether or not they were ultimately certified) can be monetized to create a marketplace of digital products, which can be utilized to save time during the digital product development process, inspire users with alternative design ideas, avoid duplicative efforts, and more. In some implementations, data corresponding to previous designs and/or solutions may only be stored if the user who developed the design and/or solution opts to share the data. In some implementations, the repository of previous designs and/or solutions can be containerized for private usage within a single company, team, organizational entity, or technical field for private usage (e.g., to avoid the unwanted disclosure of confidential information). In some implementations, user credentials associated with user 204 can be checked by computing system 208 to determine which designs and/or solutions stored in the repository can be accessed by user 204. In some implementations, usage of the previously designed components, systems, models, simulations and/or other engineering representations thereof may be available only to other users who pay a fee for a usage.

Exemplary IDEP Implementation Architecture with Services and Features

FIG. 3 shows another exemplary implementation of the IDEP illustrating its offered services and features, in accordance with some embodiments of the present invention. Specifically, an exemplary implementation architecture diagram 300 is shown in FIG. 3 to include multiple illustrative components: an IDEP enclave 302, cloud services 304, and a customer environment 310 which optionally includes an IDEP exclave 316. This exemplary architecture 300 for the IDEP is designed in accordance with zero-trust security principles and is further designed to support scalability as well as robust and resilient operations. IDEP enclave 302 and IDEP exclave 316 together instantiate IDEP 100 shown in FIG. 1, with IDEP exclave 316 implementing model splicing and splice plane 170 in some embodiments of the present invention. An enclave is an independent set of cloud resources that are partitioned to be accessed by a single customer (i.e., single-tenant) or market (i.e., multi-tenant) that does not take dependencies on resources in other enclaves. An exclave is a set of cloud resources outside enclaves managed by the IDEP, to perform work for individual customers. Examples of exclaves include virtual machines (VMs) and/or servers that the IDEP maintains to run DE tools for customers who need such services.

In particular, IDEP enclave or DE platform enclave 302 may serve as a starting point for services rendered by the IDEP, and may be visualized as a central command and control hub responsible for the management and orchestration of all platform operations. For example, enclave 302 may be implemented using computer system 208 of the interconnected DE and certification ecosystem shown in FIG. 2. DE platform enclave 302 is designed to integrate both zero-trust security models and hyperscale capabilities, resulting in a secure and scalable processing environment tailored to individual customer needs. Zero-trust security features include, but are not limited to, strict access control, algorithmic impartiality, and data isolation. Enclave 302 also supports an ML engine such as 220 for real-time analytics, auto-scaling features for workload adaptability, and API-based interoperability with third-party services. Security and resource optimization are enhanced through multi-tenancy support, role-based access control, and data encryption both at rest and in transit. DE platform enclave 302 may also include one or more of the features described below.

First, IDEP enclave 302 may be designed in accordance with zero-trust security principles. In particular, DE platform enclave 302 may employ zero-trust principles to ensure that no implicit trust is assumed between any elements, such as digital models, platform agents or individual users (e.g., users 204) or their actions, within the system. That is, no agent may be inherently trusted and the system may always authenticate or authorize for specific jobs. The model is further strengthened through strict access control mechanisms, limiting even the administrative team (e.g., a team of individuals associated with the platform provider) to predetermined, restricted access to enclave resources. To augment this robust security stance, data encryption is applied both at rest and in transit, effectively mitigating risks of unauthorized access and data breaches.

IDEP enclave 302 can also be designed to maintain isolation and independence. A key aspect of the enclave's architecture is its focus on impartiality and isolation. DE enclave 302 disallows cryptographic dependencies from external enclaves and enforces strong isolation policies. The enclave's design also allows for both single-tenant and multi-tenant configurations, further strengthening data and process isolation between customers 306 (e.g., users 204). Additionally, DE enclave 302 is designed with decoupled resource sets, minimizing interdependencies and thereby promoting system efficiency and autonomy.

IDEP enclave 302 can further be designed for scalability and adaptability, aligning well with varying operational requirements. For example, the enclave 302 can incorporate hyperscale-like properties in conjunction with zero-trust principles to enable scalable growth and to handle high-performance workloads effectively.

IDEP enclave 302 can further be designed for workflow adaptability, accommodating varying customer workflows and DE models through strict access control mechanisms. This configurability allows for a modular approach to integrate different functionalities ranging from data ingestion to algorithm execution, without compromising on the zero-trust security posture. Platform 300's adaptability makes it highly versatile for a multitude of use-cases, while ensuring consistent performance and robust security.

IDEP enclave 302 can further be designed to enable analytics for robust platform operations. At the core of the enclave's operational efficiency is a machine learning engine (e.g., machine learning engine 220) capable of performing real-time analytics. This enhances decision-making and operational efficiency across platform 300. Auto-scaling mechanisms can also be included to enable dynamic resource allocation based on workload demand, further adding to the platform's responsiveness and efficiency.

In the exemplary embodiment shown in FIG. 3, IDEP enclave 302 includes several components as described in further detail herein.

A "Monitoring Service Cell. may provide "Monitoring Service" and "Telemetry Service." A cell may refer to a set of microservices, for example, a set of microservices executing within a kubernetes pod. These components focus on maintaining, tracking and analyzing the performance of platform 300 to ensure good service delivery, including advanced machine learning capabilities for real-time analytics. A "Search Service Cell" provides "Search Service" to aid in the efficient retrieval of information from DE platform 300, adding to its overall functionality. A "Logging Service Cell" and a "Control Plane Service Cell" provide "Logging Service," "File Service", and "Job Service" to record and manage operational events and information flow within platform 300, and are instrumental in the functioning of platform 300. A "Static Assets Service Cell," provides "Statics Service", and may house user interface, SDKs, command line interface (CLI), and documentation for platform 300. An "API Gateway Service Cell" provides "API Gateway Service," and may provide DE platform API(s) (e.g., APIs 214, 216) and act as a mediator for requests between the client applications (e.g., DE tools 202, the repository of common V&V products 210, etc.) and the platform services. In some embodiments, the API gateway service cell may receive and respond to requests from agents such as DE platform exclave 316 to provide splice functions for model splicing purposes.

As shown in FIG. 3, the architecture of DE platform 300 may also include a cloud services 304 that provide services which cannot interact with customer data but can modify the software for the orchestration of DE platform operations. In example implementations, several cloud resources provide support and foundational services to the platform. For example, in the embodiment of the DE platform 300 shown in FIG. 3, cloud services 304 includes a "Customer Identity and Access Management (IAM) Service" that ensures secure and controlled access to platform 300. Cloud services 304 also includes a "Test Service" that tests tools to validate platform operations. Cloud services 304 may also include an "Orchestration Service" that controls and manages the lifecycle of containers on the platform 300. Cloud services 304 may also include an "Artifact Service" and "Version Control and Build Services," which may be used to maintain the evolution of projects, codes, and instances in the system, while also managing artifacts produced during the product development process.

As shown in FIG. 3, the architecture of DE platform 300 may also include a customer environment 310 with an "Authoritative Source of Truth" 312, customer tools 314, and an optional DE platform exclave 316. Customer environment 310 is where customer data resides and is processed in a zero-trust manner by DE platform 300. As described previously, DE platform enclave 302, by focusing on both zero-trust principles and hyperscale-like properties, provides a robust and scalable environment for the secure processing of significant workloads, according to the customer's unique needs. In some examples, DE platform exclave 316 may be situated within customer environment

310 in order to assist the customer(s) 306 with their DE tasks and operations, including model splicing and digital threading.

When a customer 306 (e.g., user 204) intends to perform a DE task using DE platform 300 (e.g., IDEP 100), typical operations may include secure data ingestion and controlled data retrieval. Derivative data generated through the DE operations, such as updated digital model files or revisions to digital model parameters, may be stored only within customer environment 310, and DE platform 300 may provide tools to access the metadata of the derivative data. Here metadata refers to data that can be viewed without opening the original data, and may comprise versioning information, time stamps, access control properties, and the like. Example implementations may include secure data ingestion, which utilizes zero-trust principles to ensure customer data is securely uploaded to customer environment 310 through a pre-validated secure tunnel, such as Secure Socket Layer (SSL) tunnel. This can enable direct and secure file transfer to a designated cloud storage, such as a simple storage service (S3) bucket, within customer environment 310. Example implementations may also include controlled data retrieval, in which temporary, pre-authenticated URLs generated via secure token-based mechanisms are used for controlled data access, thereby minimizing the risk of unauthorized interactions. Example implementations may also include immutable derivative data, with transformed data generated through operations like data extraction being securely stored within customer environment 310 while adhering to zero-trust security protocols. Example implementations may also include tokenization utility, in which a specialized DE platform tool referred to as a "tokenizer" is deployed within customer environment 310 for secure management of derivative metadata, conforming to zero-trust guidelines.

Customer environment 310 may interact with other elements of secure DE platform 300 and includes multiple features that handle data storage and secure interactions with platform 300. For example, one element of the customer environment 310 is "Authoritative Source of Truth" 312, which is a principal repository for customer data, ensuring data integrity and accuracy. Nested within this are "Customer Buckets" where data is securely stored with strict access controls, limiting data access to authorized users or processes through pre-authenticated URL links. This setup ensures uncompromising data security within customer environment 310 while providing smooth interactions with other elements of DE platform 300.

Customer environment 310 may also include additional software tools such as customer tools 314 that can be utilized based on specific customer requirements. For example, a "DE Tool Host" component may handle necessary DE applications for working with customer data. It may include a DE Tools Command-Line Interface (DET CLI), enabling user-friendly command-line operation of DE tools (e.g., DE tools 102). A "DE platform Agent" ensures smooth communication and management between customer environment 310 and elements of DE platform 300. Furthermore, there can be another set of optional DE tools designed to assist customer-specific DE workflows. Native DE tools are typically access-restricted by proprietary licenses and end-user license agreements paid for by the customer. IDEP platform functions call upon native DE tools that are executed within customer environment 310, therefore closely adhering to the zero-trust principle of the system design. Exemplary DE tools include, but are not limited to, proprietary and open-source versions of model-based systems engineering (MBSE) tools, augmented reality (AR) tools, computer aided design (CAD) tools, data analytics tools, modeling and simulation (M&S) tools, product lifecycle management (PLM) tools, multi-attribute trade-space tools, simulation engines, requirements model tools, electronics model tools, test-plan model tools, cost-model tools, schedule model tools, supply-chain model tools, manufacturing model tools, cyber security model tools, or mission effects model tools.

In some cases, an optional "IDEP Exclave" 316 may be employed within customer environment 310 to assist with customer DE tasks and operations, supervise data processing, and rigorously adhering to zero-trust principles while delivering hyperscale-like platform performance. IDEP exclave 316 is maintained by the IDEP to run DE tools for customers who need such services. IDEP exclave 316 may contain a "DE Tool Host" that runs DE tools and a "DE Platform Agent" necessary for the operation. Again, native DE tools are typically access-restricted by proprietary licenses and end-user license agreements paid for by the customer. IDEP exclave 316 utilities and manages proprietary DE tools hosted with customer environment 310, for example, to implement model splicing and digital threading functionalities.

In some embodiments, the machine learning (ML) models and artificial intelligence (AI) assistance approaches as described herein adapt to suit different customer instances of the IDEP (see FIG. 4) and the availability of training data. In an example, a pre-trained ML or AI model (e.g. within the IDEP enclave 302) is deployed in instances where there are restrictions around sharing customer data. In another example, AI models are deployed in a federated manner adjacent to DE agents and DE tools in the customer environment (e.g., within IDEP exclave 316). In another example, an AI model deployed inside the customer environment is trained behind its firewalls. In yet another example, the customer may allow sharing of subsets of their metadata for a training database located within the IDEP enclave.

IDEP Deployment Scenarios

FIG. 4 shows potential scenarios for instantiating an IDEP in connection to a customer's physical system and IT environment, in accordance with some embodiments of the present invention. Specifically, FIG. 4 illustrates various potential configurations for instancing or instantiating an IDEP ("DE platform) 402 in connection to a customer's IT environment and physical system 404. The IT environment may be located on a virtual private cloud (VPC) protected by a firewall. The physical system may refer to a physical twin as discussed with reference to FIG. 1. In some embodiments, IDEP 402 may be instanced as an enclave such as 302 shown in FIG. 3. For example, IDEP 402 may be instanced on the cloud, possibly in a software-as-a-service (SaaS) configuration. The platform instances in these embodiments include software and algorithms, and may be described as follows:

1. External Platform Instance 410: This option showcases the IDEP as a separate platform instance. The platform interacts with the physical system through the customer's virtual environment, or a Customer Virtual Private Cloud ("Customer VPC"), which is connected to the physical system.
2. External Platform Instance with Internal Agent 420: The IDEP is instantiated as a separate platform, connected to an internal agent ("DE Agent") wholly instanced within the Customer VPC. For example, the IDEP may be instantiated as enclave 302, and the DE agent may be instantiated as exclave 316 within the Customer VPC linked to the physical system.

3. External Platform Instance with Internal Agent and Edge Computing 430: This scenario displays the IDEP as a separate instantiation, connected to an internal DE Agent wholly instanced within the Customer VPC, which is further linked to an edge instance ("DE Edge Instance") on the physical system. The DE agent is nested within the customer environment, with a smaller edge computing instance attached to the physical system.
4. Edge Instance Connection 440: This option shows the DE platform linked directly to an DE edge instance on the physical system. The DE platform and the physical system are depicted separately, connected by an edge computing instance in the middle, indicating the flow of data.
5. Direct API Connection 450: This deployment scenario shows the DE platform connecting directly to the physical system via API calls. In this depiction, an arrow extends directly from the platform sphere to the physical system sphere, signifying a direct interaction through API.
6. Air-Gapped Platform Instance 460: This scenario illustrates the IDEP being completely instanced on an air-gapped, or isolated, physical system as a DE agent. The platform operates independently from any networks or Internet connections, providing an additional layer of security by eliminating external access points and potential threats. Interaction with the platform in this context would occur directly on the physical system, with any data exchange outside the physical system being controlled following strict security protocols to maintain the air-gapped environment.

Across these deployment scenarios, the IDEP plays an important role in bridging the gap between a digital twin (DTw) established through the IDEP and its physical counterpart. Regardless of how the IDEP is instantiated, it interacts with the physical system, directly or through the customer's virtual environment. The use of edge computing instances in some scenarios demonstrates the need for localized data processing and the trade-offs between real-time analytics and more precise insights in digital-physical system management. Furthermore, the ability of the platform to connect directly to the physical system through API calls underscores the importance of interoperability in facilitating efficient data exchange between the digital and physical worlds. In all cases, the DE platform operates with robust security measures.

In some embodiments, the IDEP deployment for the same physical system can comprise a combination of the deployment scenarios described above. For example, for the same customer, some physical systems may have direct API connections to the DE platform (scenario 5), while other physical systems may have an edge instance connection (scenario 4).

Multimodal User Interfaces

Figure 5:
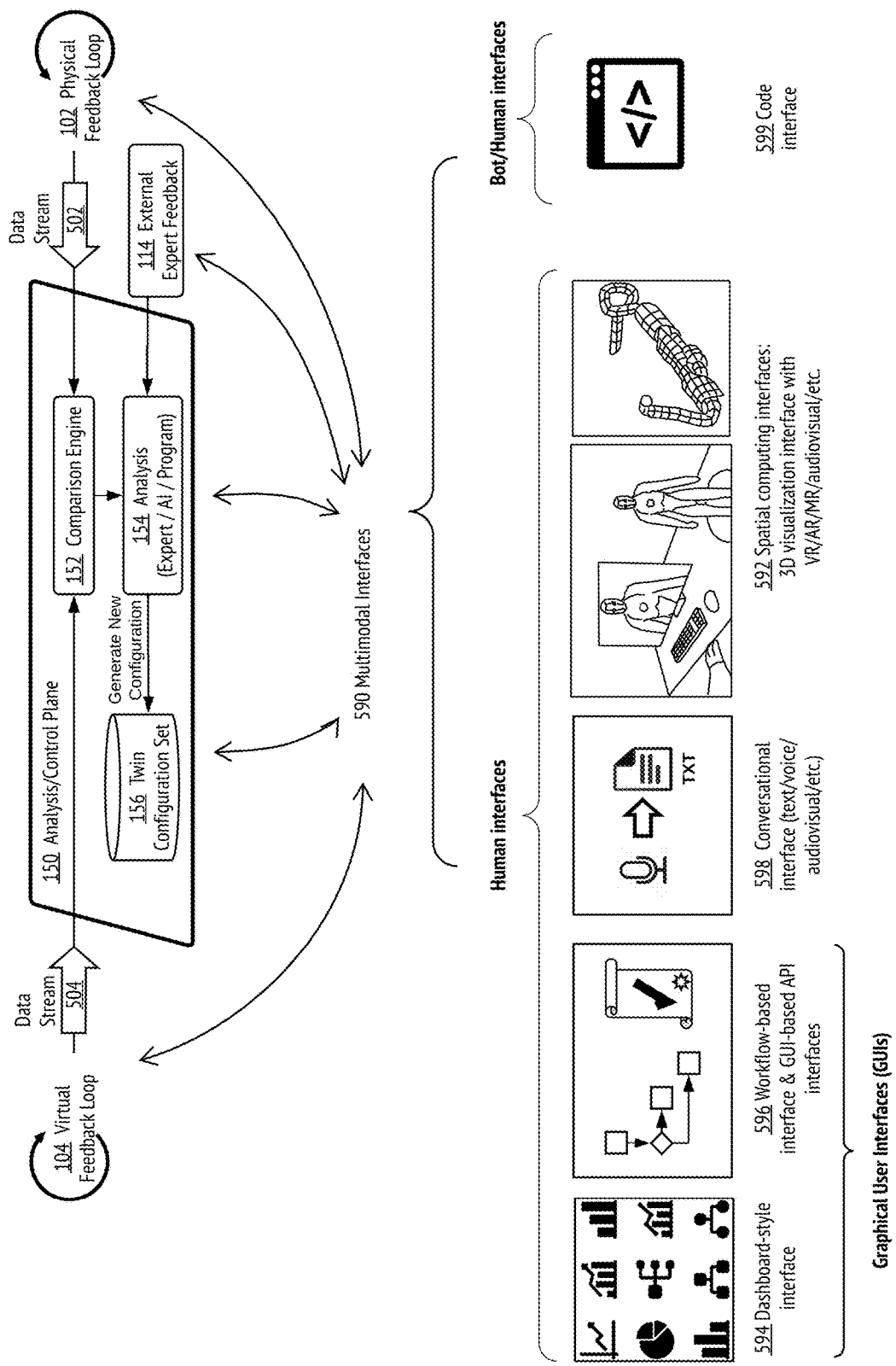
FIG. 5 shows exemplary multimodal interface designs for integration of feedback in am IDEP, in accordance with some embodiments of the present invention.

FIG. 5 illustrates the use of multimodal user interfaces 590 for the interconnected DE platform, which can handle various input and output modalities such as Virtual Reality (VR), Mixed Reality (MR), auditory, text, and code. These interfaces are designed to manage the complexity of data streams and decision-making processes, and provide decision support including option visualization, impact prediction, and specific decision invocation. Specifically, data streams 502 and 504 are processed in the Analysis & Control Plane (ACP) 150 of FIG. 1. The user interface may receive data streams from physical and virtual feedback loops 102 and 104, as well as external expert feedback 114, analysis module 154, and twin configuration set 156 of ACP 150.

The multimodal interfaces illustrated in FIG. 5 are configured to carry out all the DE tasks and actions described in the context of FIG. 1, by catering to both humans and bots/algorithms, handling the intricacies of data stream frequency and complexity, decision-making time scales, and latency impacts. In the case of human decision makers, the user interface may need to manage inputs and outputs while for algorithmic decision making, the user interface may need to present rationale and decision analysis to human users. Some examples of human interfaces include a dashboard-style interface 594, a workflow-based interface 596, conversational interfaces 598, spatial computer interfaces 592, and code interfaces 599.

Dashboard-style interface 594 offers a customizable overview of data visualizations, performance metrics, and system status indicators. It enables monitoring of relevant information, sectional review of documents, and decision-making based on dynamic data updates and external feedback. Such an interface may be accessible via web browsers and standalone applications on various devices.

Workflow-based interface 596 guides users through the decision-making process, presenting relevant data, options, and contextual information at each stage. It integrates external feedback and is designed as a progressive web app or a mobile app. In the context of alternative tool selection, workflow-based interface 596 may provide options on individual tools at each stage, or provide combinations of tool selections through various stages to achieve better accuracy or efficiency for the overall workflow.

Conversational interfaces 598 are based on the conversion of various input formats such as text, prompt, voice, audio-visual, etc. into input text, then integrating the resulting input text within the DE platform workflow. Outputs from the DE platform may undergo the reverse process. This enables interoperability with the DE platform, and specifically the manipulation of model splices. In the broad context of audio-visual inputs, the conversational interfaces may comprise data sonification, which involves using sound to represent data, information, or events, and using auditory cues or patterns to communicate important information to users, operators, or reviewers. Sonified alerts (e.g., alerts sent via sound, e.g., via a speaker) are especially useful when individuals need to process information quickly without having to visually focus on a screen. For example, sonified alerts can be used to notify security analysts of potential threats or breaches.

FIG. 5 also illustrates the use of spatial computing interfaces 592 and code interfaces 599 in the management of DTws and PTws. Spatial computing interfaces allow for more immersive and intuitive user experiences, and enable real-time synchronization between DTws and PTws. Code interfaces allow bots and digital engineers to interact with the DE platform through scripting and code. It also allows the collection of user preference, task history, and tool usage patterns for alternative tool selection purposes.

Digital Threads and Autonomous Data Linkages

As discussed previously, a "digital thread" is intended to connect two or more digital engineering (DE) models for traceability across the systems engineering lifecycle, and collaboration and sharing among individuals performing DE tasks. In a digital thread, appropriate outputs from a preceding digital model may be provided as the inputs to a subsequent digital model, allowing for information and process flow. That is, a digital thread may be viewed as a communication framework or data-driven architecture that connects traditionally siloed elements to enable the flow of information and actions between digital models.

Figure 6:
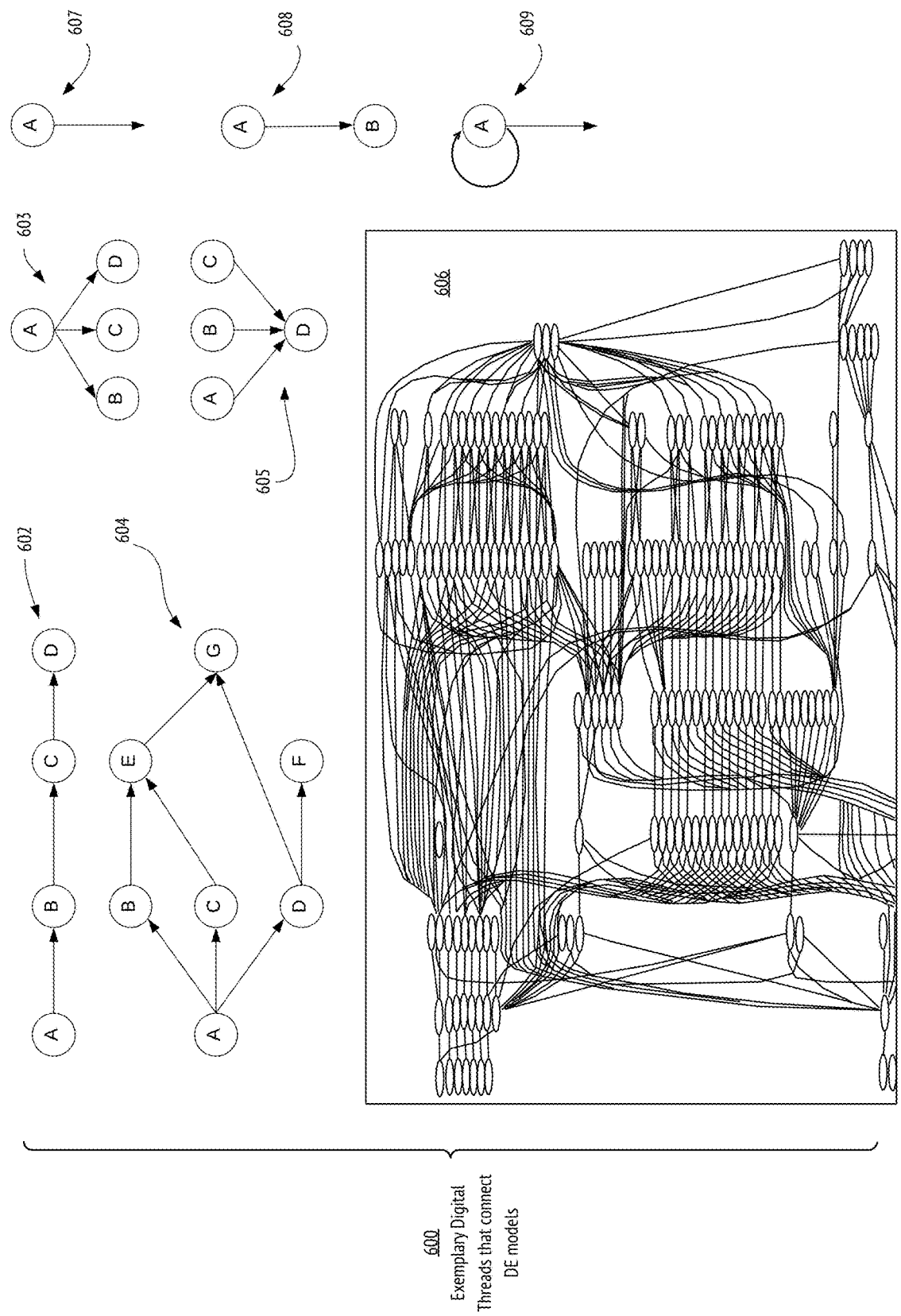
FIG. 6 is a schematic diagram comparing exemplary digital threads that connect DE models, in accordance with some embodiments of the present invention.

FIG. 6 describes the architecture and inherent complexity of digital threads, in accordance with the examples disclosed herein. Specifically, FIG. 6 is a schematic diagram comparing exemplary digital threads 600 of various complexities that manipulate and/or connect DE models, in accordance with some embodiments of the present invention. In the most basic sense, a digital thread may "thread" together DE models into a simple daisy-chain architecture 602 where modifications in any upstream DE model will affect all DE models downstream from the modified DE model. For example, a modification of any parameter or process of a DE model B will cause changes in DE model C, which in turn will cause changes in DE model D. Cause-and-effect changes will therefore cascade downstream. As another example, diagram 604 represents a more complex digital thread where a change in one DE model may affect more than one downstream model. In both 602 and 604, digital threads are represented by a directed acyclic graph (DAG).

DAGs are frequently used in many kinds of data processing and structuring tasks, such as scheduling tasks, data compression algorithms, and more. In the context of service platforms and network complexities, a DAG might be used to represent the relationships between different components or services within the platform. In digital thread 604, different models may depend on each other in different ways. Model A may affect models B, C, and D, with models B and C affecting model E, and models D and E affecting model G. Such dependencies are denoted as a DAG, where each node is associated with a component (e.g., a model), and each directed edge represents a dependency.

A major issue with dealing with interdependent DE models is that graph consistencies can be polynomial, and potentially exponential, in complexity. Hence, if a node fails (e.g., a model is unreliable), this can have a cascading effect on the rest of the digital thread, disrupting the entire design. Furthermore, adding nodes or dependencies to the graph does not yield a linear increase in complexity because of the interdependencies between models. If a new model is added that affects or depends on several existing models, the resulting increase in graph complexity is multiplicative in nature, hence potentially exponential. The multiplicative nature of digital thread consistencies is compounded by the sheer number of interconnected models, which may number in the hundreds or thousands. Diagram 606 is a partial representation of a real-world digital thread, illustrating the complexity of digital threads and its multiplicative growth.

FIG. 6 further shows special cases 603, 605, 607, 608, and 609 of exemplary simple digital threads. Diagram 607 represents a degenerate digital thread where data is shared from a single DE model. Diagram 608 represents a model-to-document digital thread where data (e.g., system attributes, performance attributes) extracted from a single DE model may be used to generate or update a text-based document (e.g., a Capability Development Document (CDD)). Diagrams 603 and 605 are generalized from 608 to represent cases where data extracted from a single model may be used to update multiple models, or vice versa. Specifically, diagram 605 may represent the dynamic updates of live or magic documents discussed in the context of FIG. 1. Here the logic to connect the DE models shown are very simple: data are extracted from multiple DE models A, B, and C to update a document model D. There are no interactions between the extracted data. Furthermore, diagram 609 shows a special case of a digital thread where data is loaded to and extracted from only a single model A. For example, as discussed in the context of FIG. 7 next, input splice functions of the model A shown in 609 may be executed to update the model, and output splice functions of model A shown in 609 may be executed to produce digital artifacts for sharing. For these special simple threads, the IDEP may provide a GUI-based interface to the user to connect the models and execute the digital threads. For complex threads such as 606, a code-based interface may be necessary.

Model Splicing for Digital Threading and Digital Twin Generation

As disclosed herein, model splicing encapsulates and compartmentalizes digital engineering (DE) model data and model data manipulation and access functionalities. As such, model splices provide access to selective model data within a DE model file without exposing the entire DE model file, with access control to the encapsulated model data based on user access permissions. Model splicing also provides the DE model with a common, externally-accessible Application Programming Interface (API) for the programmatic execution of DE models. Model splices thus generated may be shared, executed, revised, or further spliced independently of the native DE tool and development platform used to generate the input digital model. The standardization of DE model data and the generalization of API interfaces and functions allow the access of DE model type files outside of their native software environments, and enable the linking of different DE model type files that may not previously be interoperable. Model splicing further enables the scripting and codification of DE operations encompassing disparate DE tools into a corpus of normative program code, facilitating the generation and training of artificial intelligence (AI) and machine learning (ML) models for the purpose of manipulating DE models through various DE tools across different stages of a DE process, DE workflow, or a DE life cycle.

Digital threads are created through user-directed and/or autonomous linking of model splices. A digital thread is intended to connect two or more DE models for traceability across the systems engineering life cycle, and collaboration and sharing among individuals performing DE tasks. In a digital thread, appropriate outputs from a preceding digital model are provided as inputs to a subsequent digital model, allowing for information flow. That is, a digital thread may be viewed as a communication framework or data-driven architecture that connects traditionally siloed elements to enable the flow of information between digital models. The extensibility of model splicing over many different types of DE models and DE tools enables the scaling and generalization of digital threads to represent each and every stage of the DE life cycle.

A digital twin (DTw) is a real-time virtual replica of a physical object or system, with bi-directional information flow between the virtual and physical domains, allowing for monitoring, analysis, and optimization. Model splicing allows for making individual DE model files into executable splices that can be autonomously and securely linked, thus enabling the management of a large number of DE models as a unified digital thread. Such a capability extends to link previously non-interoperable DE models to create digital threads, receive external performance and sensor data streams (e.g., data that is aggregated from DE models or linked from physical sensor data), calibrate digital twins with data streams from physical sensors outside of native DTw environments, and receive expert feedback that provides opportunity to refine simulations and model parameters.

Unlike a DTw, a virtual replica, or simulation, is a mathematical model that imitates real-world behavior to predict outcomes and test strategies. Digital twins use real-time data and have bidirectional communication, while simulations focus on analyzing scenarios and predicting results. In other words, a DTw reflects the state of a physical system in time and space. A simulation is a set of operations done on digital models that reflects the potential future states or outcomes that the digital models can progress to in the future. A simulation model is a DE model within the context of the IDEP as disclosed herein.

When testing different designs, such as variations in wing length or chord dimensions, multiple DTws (sometimes numbering in 100s to 1,000s) may be created, as a bridge between design specifications and real-world implementations of a system, allowing for seamless updates and tracking of variations through vast numbers of variables, as detailed in the context of FIG. 1. As an example, if three variations of a system are made, each one would have its own DTw with specific measurements. These DTws may be accessed and updated via API function scripts, which allow for easy input of new measurements from the physical parts during the manufacturing process. By autonomous linking with appropriate data, a DTw may be updated to reflect the actual measurements of the parts, maintaining traceability and ensuring accurate data representation through hundreds or thousands of models.

Exemplary Model Splicing Setup

Figure 7:
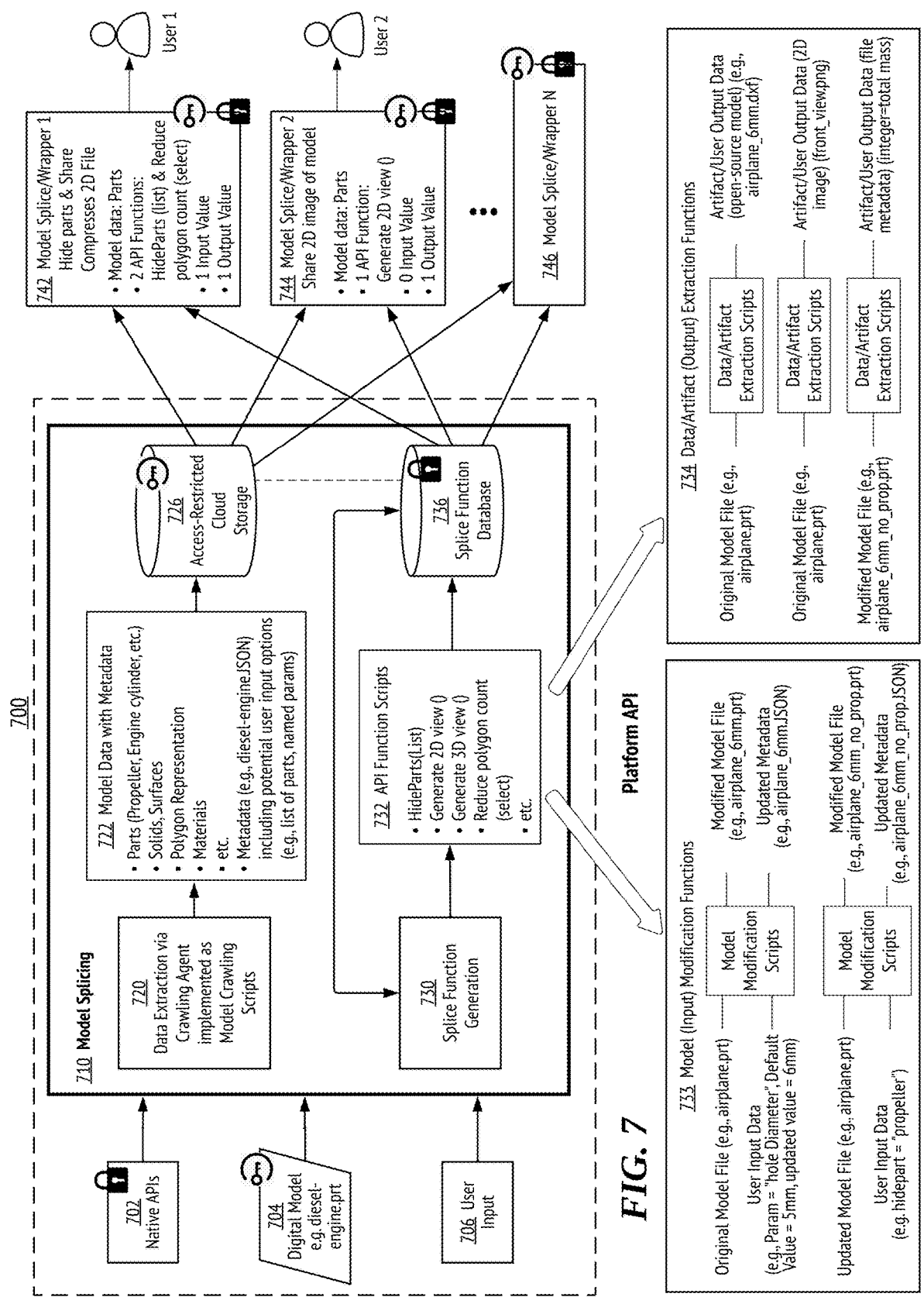
FIG. 7 is a schematic showing an exemplary DE model splicing setup, in accordance with some embodiments of the present invention.

FIG. 7 is a schematic 700 showing an exemplary model splicing setup, according to some embodiments of the present invention. Specifically, FIG. 7 is a schematic showing an embedded CAD model splicing example.

In the present disclosure, a "model splice", "model wrapper", or "model graft" of a given DE model file comprises locators to or copies of (1) DE model data or digital artifacts extracted or derived from the DE model file, including model metadata, and (2) splice functions (e.g., API function scripts) that can be applied to the DE model data. A model splice may take on the form of a digital file or a group of digital files. A locator refers to links, addresses, pointers, indexes, access keys, Uniform Resource Locators (URL) or similar references to the aforementioned DE digital artifacts and splice functions, which themselves may be stored in access-controlled databases, cloud-based storage buckets, or other types of secure storage environments. The splice functions provide unified and standardized input and output API or SDK endpoints for accessing and manipulating the DE model data. The DE model data are model-type-specific, and a model splice is associated with model-type-specific input and output schemas. One or more different model splices may be generated from the same input DE model file, based on the particular user application under consideration, and depending on data access restrictions. In some contexts, the shorter terms "splice", "wrapper", and/or "graft" are used to refer to spliced, wrapped, and/or grafted models.

Model splicing is the process of generating a model splice from a DE model file. Correspondingly, model splicers are program codes or uncompiled scripts that perform model splicing of DE models. A DE model splicer for a given DE model type, when applied to a specific DE model file of the DE model type, retrieves, extracts, and/or derives DE model data associated with the DE model file, generates and/or encapsulates splice functions, and instantiates API or SDK endpoints to the DE model according to input/output schemas. In some embodiments, a model splicer comprises a collection of API function scripts that can be used as templates to generate DE model splices. "Model splicer generation" refers to the process of setting up a model splicer, including establishing an all-encompassing framework or template, from which individual model splices may be deduced.

Thus, a DE model type-specific model splicer extracts or derives model data from a DE model file and/or stores such model data in a model type-specific data structure. A DE model splicer further generates or enumerates splice functions that may call upon native DE tools and API functions for application on DE model data. A DE model splice for a given user application contains or wraps DE model data and splice functions that are specific to the user application, allowing only access to and enabling modifications of limited portions of the original DE model file for collaboration and sharing with stakeholders of the given user application.

Additionally, a document splicer is a particular type of DE model splicer, specific to document models. A "document" is an electronic file that provides information as an official record. Documents include human-readable data that can be read by humans with or without specialized software, such as word processors and/or web services. Thus, a document is a special case of DE models, and may contain natural language-based text and/or graphics that are directly readable by a human without the need of additional machine compilation, rendering, visualization, or interpretation by a dedicated DE tool. A "document splice", "document model splice" or "document wrapper" for a given user application can be generated by wrapping document data and splice functions (e.g., API function scripts) that are specific to the user application, thus revealing text at the component or part (e.g., title, table of contents, chapter, section, paragraph) level via API or SDK endpoints, and allowing access to and enabling modifications of portions of an original document or document template for collaboration and sharing with stakeholders of the given user application, while minimizing manual referencing and human errors.

In the CAD model splicing example shown in FIG. 7, a CAD model file diesel-engine.prt 704 proceeds through a model splicing process 710 that comprises a data extraction step 720 and a splice function generation step 730. This input DE model 704 is in a file format .prt native to certain DE tools. Data extraction may be performed via a DE model crawling agent implemented as model crawling scripts within a model splicer to crawl through the input DE model file and to distill model data with metadata 722. Metadata are data that can be viewed without opening the entire input DE model file, and may include entries such as file name, file size, file version, last modified date and time, and potential user input options as identified from a user input 706. Model data are extracted and/or derived from the input DE model, and may include but are not limited to, parts (e.g., propeller, engine cylinder, engine cap, engine radiator, etc.), solids, surfaces, polygon representation, and materials, etc. When a model splicer crawls through the model file, it determines how model data may be organized and accessed, as fundamentally defined by a DE tool 702 that is being used in splicing the DE model, and establishes a model data schema. This data schema describes the structure and format of the model data, some of which are translated into, or used to create input/output API endpoints with corresponding input/output schemas. In some embodiments, model data with metadata 722 may be stored in an access-restricted storage 726, such as the "customer buckets" 312 within customer environment 310 in FIG. 3, so that model splices such as 742, 744, and 746 may be generated on-demand once an input DE model 704 has been crawled through.

The model splicer further generates splice functions (e.g., API function scripts) 732 from native APIs 702 associated with the input CAD model. In the present disclosure, "native" and "primal" refer to existing DE model files, functions, and API libraries associated with specific third-party DE tools, including both proprietary and open-source ones. Native API 702 may be provided by a proprietary or open-source DE tool. For example, the model splicer may generate API function scripts that call upon native APIs of native DE tools to perform functions such as: HideParts (parts_list), Generate2DView( ), etc. These model-type-specific splice functions may be stored in a splice function database 736, again for on-demand generation of individual model splices. A catalog or specification of splice functions provided by different model splices supported by the IDEP, and orchestration scripts that link multiple model splices, constitutes a Platform API. This platform API is a common, universal, and externally-accessible platform interface that masks native API 702 of any native DE tool integrated into the IDEP, thus enabling engineers from different disciplines to interact with unfamiliar DE tools, and previously non-interoperable DE tools to interoperate freely.

Next, based on user input or desired user application 706, one or more model splices or wrappers 742, 744, and 746 may be generated, wrapping a subset or all of the model data needed for the user application with splice functions or API function scripts that can be applied to the original input model and/or wrapped model data to perform desired operations and complete user-requested tasks. In various embodiments, a model splice may take on the form of a digital file or a group of digital files, and a model splice may comprise locators to or copies of the aforementioned DE digital artifacts and splice functions, in any combination or permutation. Any number of model splices/wrappers may be generated by combining a selective portion of the model data such as 722 and the API function scripts such as 732. As the API function scripts provide unified and standardized input and output API endpoints for accessing and manipulating the DE model and DE model data, such API handles or endpoints may be used to execute the model splice and establish links with other model splices without directly calling upon native APIs. Such API endpoints may be formatted according to an input/output scheme tailored to the DE model file and/or DE tool being used, and may be accessed by orchestration scripts or platform applications that act on multiple DE models.

In some embodiments, when executed, an API function script inputs into or outputs from a DE model or DE model splice. "Input" splice functions or "input nodes" such as 733 are model modification scripts that allow updates or modifications to an input DE model. For example, a model update may comprise changes made via an input splice function to model parameters or configurations. "Output" splice functions or "output nodes" 734 are data/artifact extraction scripts that allow data extraction or derivation from a DE model via its model splice. An API function script may invoke native API function calls of native DE tools. An artifact is an execution result from an output API function script within a model splice. Multiple artifacts may be generated from a single DE model or DE model splice. Artifacts may be stored in access-restricted cloud storage 726, or other similar access-restricted customer buckets.

One advantage of model splicing is its inherent minimal privileged access control capabilities for zero-trust implementations of the IDEP as disclosed herein. In various deployment scenarios discussed with reference to FIG. 4, and within the context of IDEP implementation architecture discussed with reference to FIG. 3, original DE input model 704 and model data storage 726 may be located within customer buckets 312 in customer environment 310 of FIG. 3. Splice functions 732 stored in database 736 call upon native APIs 702. The execution or invocation of splice functions 732 may rely on job-specific authentication or authorization via proprietary licenses of DE tools (e.g., residing within customer environment 310 of FIG. 3 and/or information security clearance levels of the requesting user. Thus, model splicing unbundles monolithic access to digital model-type files as whole files and instead provides specific access to a subset of functions that allow limited, purposeful, and auditable interactions with subsets of the model-type files built from component parts or atomic units that assemble to parts.

Digital Threading of DE Models Via Model Splicing

Figure 8:
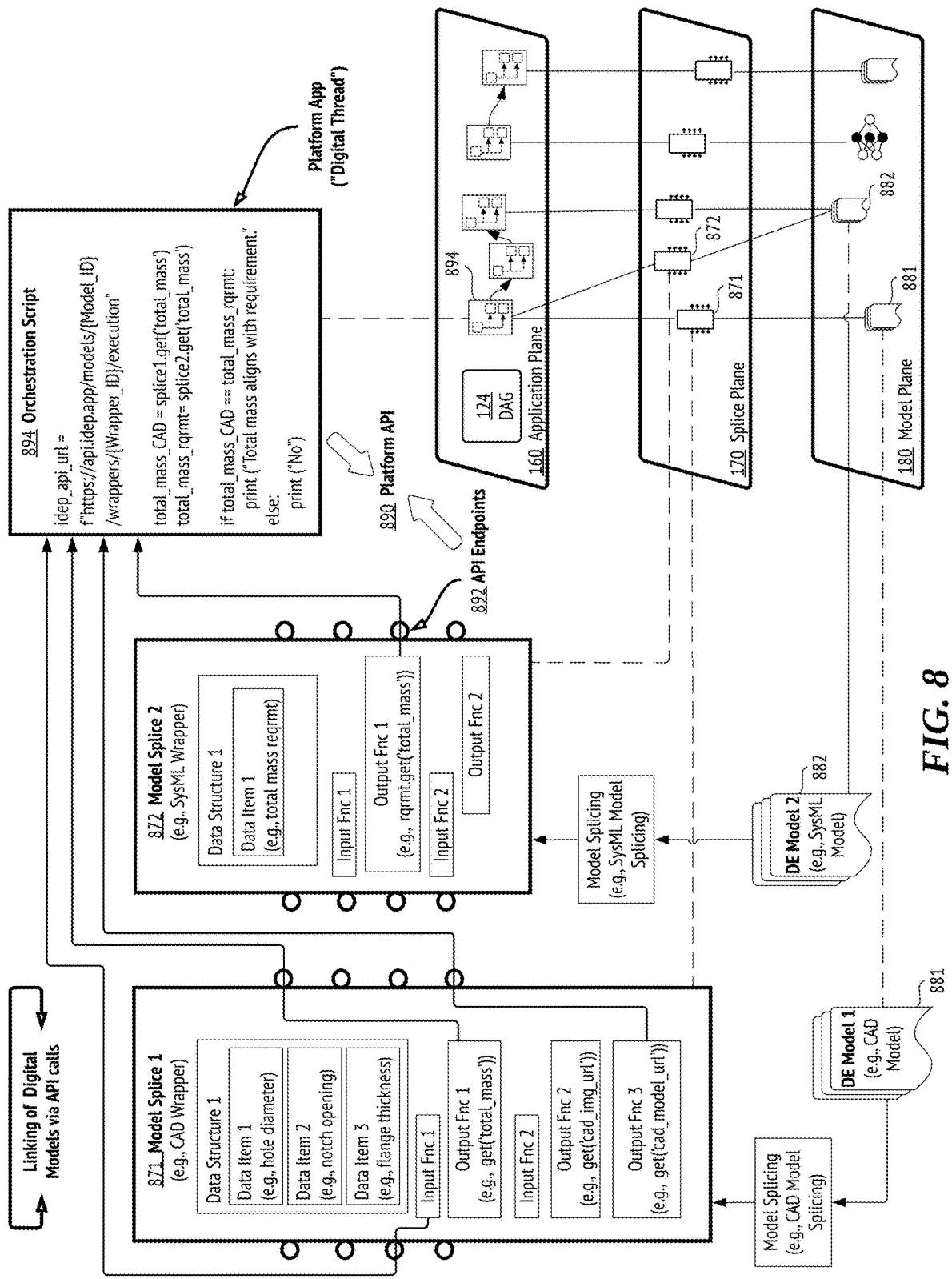
FIG. 8 is a schematic showing digital threading of DE models via model splicing, in accordance with some embodiments of the present invention.

FIG. 8 is a schematic showing digital threading of DE models via model splicing, according to some embodiments of the present invention. A digital thread is intended to connect two or more DE models for traceability across the systems engineering lifecycle, and collaboration and sharing among individuals performing DE tasks.

Linking of model splices generally refers to jointly accessing two or more DE model splices via API endpoints or splice functions. For example, data may be retrieved from one splice to update another splice (e.g., an input splice function of a first model splice calls upon an output splice function of a second model splice); data may be retrieved from both splices to generate a new output (e.g., output splice functions from both model splices are called upon); data from a third splice may be used to update both a first splice and a second splice (e.g., input splice functions from both model splices are called upon). In the present disclosure, "model linking" and "model splice linking" may be used interchangeably, as linked model splices map to correspondingly linked DE models. Similarly, linking of DE tools generally refers to jointly accessing two or more DE tools via model splices, where model splice functions that encapsulate disparate DE tool functions may interoperate and call each other, or be called upon jointly by an orchestration script or digital thread script to perform a DE task.

Thus, model splicing allows for making individual digital model files into model splices that can be autonomously and securely linked, enabling the management of a large number of digital models as a unified digital thread written in scripts. Within the IDEP as disclosed herein, a digital thread is a platform script that calls upon the platform API to facilitate, manage, or orchestrate a workflow through linked model splices. Model splice linking provides a communication framework or data-driven architecture that connects traditionally siloed elements to enable the flow of information between digital models via corresponding model splices. The extensibility of model splicing over many different types of digital models enables the scaling and generalization of digital threads to represent each and every stage of the DE lifecycle and to instantiate and update DTws as needed.

In the particular example shown in FIG. 8, an orchestration script 894 is written in Python code and designed to interact via API endpoints such as 892 to determine if a CAD model meets a total mass requirement. API endpoint 892 is an output splice function and part of a platform API 890. Platform API 890 comprises not only splice functions but also platform scripts or orchestration scripts such as 894 itself.

Orchestration script 894 is divided into three main steps:
1. Get Data From a CAD Model Splice: A POST request may be sent via the IDEP platform API to execute a computer-aided design (CAD) model splice 871. This model splice provides a uniform interface to modify and retrieve information about a CAD model 881. The parameters for the CAD model, such as hole diameter, notch opening, flange thickness, etc., may be sent in the request and set via an input splice function. The total mass of the CAD model may be derived from model parameters and retrieved via an output splice function. The response from the platform API includes the total mass of CAD model 881, and a Uniform Resource Identifier/Locator (URL) for the CAD model. The response may further comprise a URL for an image of the CAD model.
2. Get Data From a SysML Model Splice: Another POST request may be sent via the IDEP platform API to execute a Systems Modeling Language (SysML) model splice 872. SysML is a general-purpose modeling language used for systems engineering. Output function 892 of model splice 872 retrieves the total mass requirements for the system from a SysML model 882. The response from the platform API includes the total mass requirement for the system.
3. Align the Variables and Check If Requirement Met: The total mass from CAD model 881 is compared with the total mass requirement from SysML model 882. If the two values are equal, a message is printed indicating that the CAD model aligns with the requirement. Otherwise, a message is printed indicating that the CAD model does not align with the requirement.

In short, orchestration script 894, which may be implemented in application plane 160 of IDEP 100 shown in FIG. 1, links digital models 881 and 882 via model splice API calls. Orchestration script 894 is a scripted platform application that modifies a CAD model, retrieves the total mass of the modified CAD model, retrieves the total mass requirement from a SysML model, and compares the two values to check if the CAD model meets the requirement. In some embodiments, a platform application within IDEP 100 utilizes sets of functions to act upon more than one DE model.

Model Splice Plane

Figure 9:
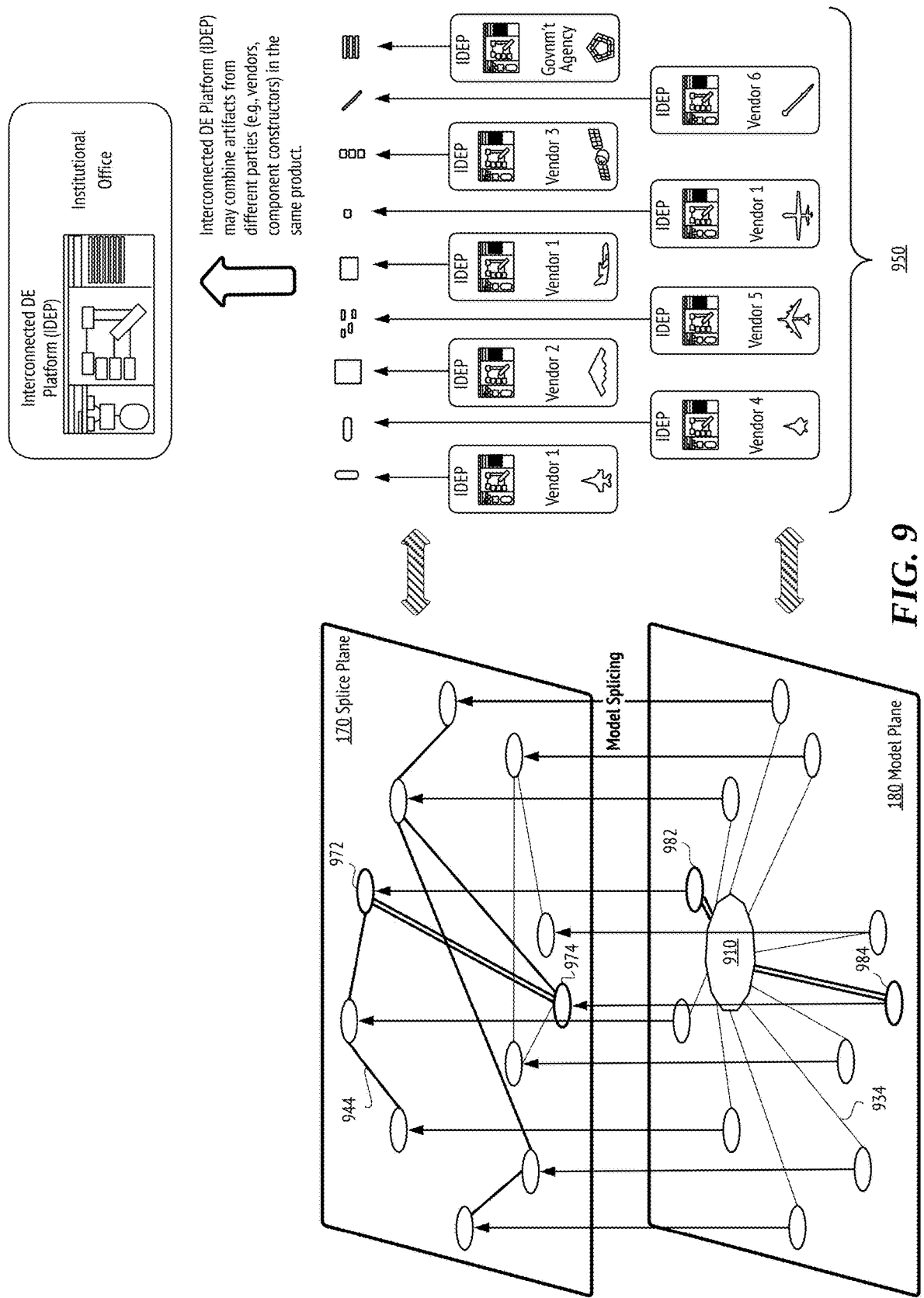
FIG. 9 is a schematic illustrating the linking of DE model splices in a splice plane and comparing digital threading with and without model splicing, in accordance with some embodiments of the present invention.

FIG. 9 is a schematic illustrating the linking of DE model splices in a splice plane and comparing digital threading with and without model splicing, according to some embodiments of the present invention. The bottom model plane 180 demonstrates current digital threading practices, where each small oval represents a DE model, and the linking between any two DE models, such as models 982 and 984, requires respective connections to a central platform 910, and potential additional linkages from every model to every other model. The central platform 910 comprises program code that is able to interpret and manipulate original DE models of distinct model types. For example, platform 910 under the control of a subject matter expert may prepare data from digital model 982 into formats that can be accessed by digital model 984 via digital model 984's native APIs, thus allowing modifications of digital model 982 to be propagated to digital model 984. Any feedback from digital model 984 to digital model 982 would require similar processing via platform 910 so that data from digital model 984 are converted into formats that can be accessed by digital model 982 via digital model 982's native APIs. This hub-and-spoke architecture 934 is not scalable to the sheer number (e.g., hundreds or thousands) of digital models involved within typical large-scale DE projects, as model updates and feedback are only possible through central platform 910.

In contrast, once the DE models are spliced, each original model is represented by a model splice comprising relevant model data, unified and standardized API endpoints for input/output, as shown in the upper splice plane 170. Splices within splice plane 170 may be connected through scripts (e.g., python scripts) that call upon API endpoints or API function scripts and may follow a DAG architecture, as described with reference to FIG. 1 and FIG. 6. Note that in FIG. 1, only the set of generated splices are shown within splice plane 170, while in FIG. 9, scripts that link model splices are also shown for illustrative purposes within the splice plane. Such scripts are referred to as orchestration scripts or platform scripts in this disclosure, as they orchestrate workflow through a digital thread built upon interconnected DE model splices. Further note that while splice plane 170 is shown in FIG. 1 as part of IDEP 100 for illustrative purposes, in some embodiments, splice plane 170 may be implemented behind a customer firewall and be part of an agent of the DE platform, as discussed in various deployment scenarios shown in FIG. 4. That is, individual API function scripts generated via model splicing by a DE platform agent may be tailored to call upon proprietary tools the customer has access to in its private environment. No centralized platform 910 with proprietary access to all native tools associated with all individual digital models shown in FIG. 9 is needed. Instead, orchestration scripts call upon universal API function scripts that may be implemented differently in different customer environments.

Hence, model splicing allows model splices such as model splice 972 from digital model 982 and model splice 974 from digital model 984 to access each other's data purposefully and directly, thus enabling the creation of a model-based "digital mesh" 944 via platform scripts and allowing autonomous linking without input from subject matter experts.

An added advantage of moving from the model plane 180 to the splice plane 170 is that the DE platform enables the creation of multiple splices per native model (e.g., see FIG. 7), each with different subsets of model data and API endpoints tailored to the splice's targeted use. For example, model splices may be used to generate multiple digital twins (DTws) that map a physical product or object design into the virtual space. Two-way data exchanges between a physical object and its digital object twin enable the testing, optimization, verification, and validation of the physical object in the virtual world, by choosing optimal digital model configuration and/or architecture combinations from parallel digital twins built upon model splices, each reacting potentially differently to the same feedback from the physical object.

Supported by model splicing, digital threading, and digital twining capabilities, the IDEP as disclosed herein connects DE models and DE tools to enable simple and secure collaboration on digital engineering data across engineering disciplines, tool vendors, networks, and model sources such as government agencies and institutions, special program offices, contractors, small businesses, Federally Funded Research and Development Centers (FFRDC), University Affiliated Research Centers (UARC), and the like. An application example 950 for the IDEP is shown on the right side of FIG. 9, illustrating how data from many different organizations may be integrated to enable cross-domain collaboration while maintaining data security, traceability, and auditability. Here DE models from multiple vendors or component constructors are spliced or wrapped by IDEP agents, and data artifacts are extracted with data protection. Turning DE models into data artifacts enables cross-domain data transfer and allows for the protection of critical information, so that model owners retain complete control over their DE models using their existing security and IT stack, continue to use DE tools that best fit their purposes, and also preserve the same modeling schema/ontology/profile that best fit their purposes. The IDEP turns DE models into micro-services to provide minimally privileged data bits that traverse to relevant stakeholders without the DE models ever leaving their home servers or being duplicated or surrogate. The IDEP also provides simple data access and digital threading options via secure web applications or secure APIs.

DAG Representation of Threaded Tasks

Figure 10:
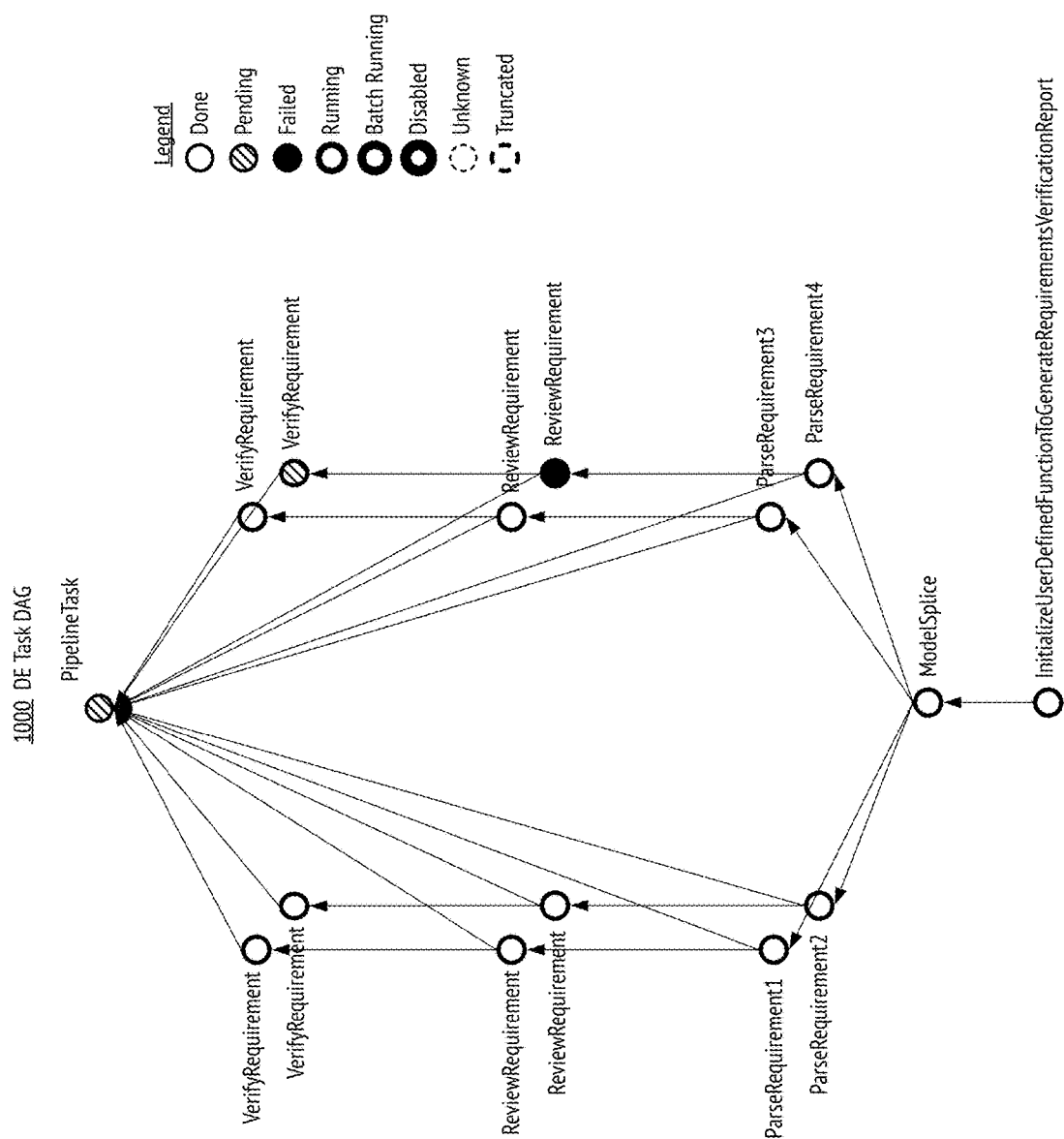
FIG. 10 shows an exemplary directed acyclic graph (DAG) representation of pipelined DE tasks related to digital threads, in accordance with some embodiments of the present invention.

Model splicing provides a unified interface among DE models, allowing model and system updates to be represented by interconnected and pipelined DE tasks. FIG. 10 shows an exemplary directed acyclic graph (DAG) representation 1000 of pipelined DE tasks related to digital threads, in accordance with some embodiments of the present invention. In diagram 1000, tasks performed through a digital thread orchestration script (e.g., 894) are structured as nodes within a DAG. Actions are therefore interconnected and carried out in a pipeline linking the DE model splices with a range of corresponding parameter values. Therefore, a digital thread can be created by establishing, via interpretable DE platform scripts, the right connections between any model splices for their corresponding models at the relevant endpoints.

Referring to FIGS. 1 and 8, DAGs of threaded tasks are built from digital threads and are part of the DE platform's application plane 160. Different DAGs may target different DE actions. For example, in FIG. 1, building or updating a DTw 122 in the virtual environment 120 has its own DAG 124. Model splicing turns DE models into data structures that can be accessed via API, thus enabling the use of software development tools, from simple python scripts to complex DAGs, in order to execute DE actions. A digital thread of model splices eliminates the scalability issue of digital thread management, and speeds up the digital design process, including design updates based on external feedback.

Following the above description of the basic elements and core aspects of the IDEP as disclosed herein, the machine learning engine that enhances the IDEP's functionality with respect to sharable script generation is described in detail next.

Overview of Machine Learning for Digital Workflow Enhancement

Broadly, the present invention relates to methods and systems for a continuously learning system that trains on digital tool documentations, digital platform resource-capability mappings, and historical digital workflows to suggest specific functions, use-cases, and digital workflows to a user upon request. A machine learning (ML) engine seeks to represent disparate data sources in a joint embedding space or a shared vector space, where data of different types or modalities can be represented and compared. Specifically, elements of digital workflows including digital models and specific atomic actions made on data artifacts from digital models may be codified and jointly embedded. A similarity measure or distance metric is defined in this joint embedding space to allow for comparisons between embedding vectors. The ML engine further comprises a template engine that learns characteristic components, properties, attributes or representative features of commonly accessed digital models, digital tasks and digital threads to create templates from IDMP documentations and historical usage data. Templates may be viewed as commonalities among workflow elements. Building upon the joint embedding space and a template database, the ML engine provides dynamic template recommendations by evaluating a user's requested digital task involving one or more digital models, potentially taking into account the user's historical usage patterns, to generate sharable scripts that streamline and enhance digital workflows while reducing manual input. For example, a recommended template embedding may be decoded to generate digital tool function scripts or digital thread orchestration scripts. As users interact with recommended templates and/or generated scripts, their feedback is collected and used to further refine the ML engine, thus continuously improving the accuracy and relevance of future template suggestions.

One use case for the present invention as disclosed herein is in enhancing the usability of digital models by tapping into the universality of model splicing and embedding to generate splice function scripts. Specifically, through continued learning, an ML engine can recognize an input digital model type-file, assign a matching or best-fit template, and suggest to a user, based on the template, Application Programming Interface (API) function scripts that may call upon third party digital tools and may be applicable to digital model data as structured within a corresponding model splice. Model splicing encapsulates and compartmentalizes digital model data and model data manipulation and access functionalities, enabling the scripting of digital model operations encompassing disparate digital tools into a corpus of normative program code. As a result, digital tasks involving digital models can be threaded into program code, enabling the generation and training of ML modules for the purpose of manipulating digital models to accomplish a given digital task. The ML engine can be trained on the history of prior workflows in an interconnected digital model platform (IDMP) with model splicing capability. The ML engine may monitor function calls and the digital models they operate on, and organize the details in a joint vector space. Vectors may be produced from the same embedding function, with dimensions corresponding to digital model types and other metadata. Similarities among different digital models may be measured via appropriate distance functions. Estimated similarities between a new digital model and existing digital models may be relied upon for suggesting templates having usable function scripts for the new digital model file. In other words, the ML engine as disclosed herein may suggest specific function scripts that are applicable to a newly uploaded digital model file, and in this process generates, refines, and/or expands a model splicer for the corresponding digital model type.

Another use case for the present invention as disclosed herein is in generating orchestration scripts that threads multiple digital models in a digital workflow to complete a given digital task. An ML engine may utilize various user actions, data artifacts, and historical digital workflows within an IDMP to create a joint embedding vector space over at least two data modalities selected from digital thread execution graph data, image data, and text data. This joint embedding space serves as a unified representation and comprehensive framework to infer from all types of digital models and data within the IDMP. A template engine within the ML engine may ingest a variety of input data types integral to operations within the IDMP, including but not limited to execution graphs for digital threads, and image and text data for digital artifacts, ensuring comprehensive coverage and applicability of the template engine across multiple domains and use cases. Embeddings for different data types may be generated and aligned through methods such as concatenation and projection, bilinear transformations, and attention mechanisms. The ML engine may be trained to generate, score, and validate exemplary templates, and in turn provide template recommendations or suggestions to users, whose feedback may be used further to refine the ML model.

In the context of increasing usage opportunities for users of the IDMP, embodiments of present invention allow users within the same organization or in the same industry across different organizations to learn from each other. The ML engine may be utilized as a mechanism through which this learning process is facilitated, by analyzing desensitized historical digital threads that have been composed by other users of the IDMP. Upon initial onboarding onto the platform, a user is likely to be familiar with an initial set of capabilities, tools, and functions, based on his or her prior experience and expertise. The ML engine as disclosed herein assists the user in expanding the scope of digital models and digital tools that he or she can utilize to complete specific tasks on the IDMP by learning from all users of the platform.

In various embodiments, the ML engine may be trained on a collection of known user inputs, digital tool documentations, digital platform resource-capability mappings, and the history of prior digital workflows. Digital platform resource-capability mapping may comprise platform API documentations describing existing digital model types, model splices, splice function scripts, and orchestration scripts. During training, the ML engine creates templates that capture similarities and characteristic attributes among digital models or digital threads that share elements, properties, and/or attributes. Potential boundary conditions may be established while the template is learned. Such generated templates may be subjected to a scoring system to evaluate their validity and effectiveness using metrics such as time saved, errors reduced, and user satisfaction. Those meeting a predefined efficacy threshold may be integrated into the system and persisted for further fine-tuning of the system. This scoring and validation process ensures that only the most effective templates are utilized, providing measurable benefits to ongoing projects.

Methods and systems disclosed herein are not limited to any specific digital model type or native environments. While a native digital model environment may recommend certain digital tool functions for specific digital model type files, embodiments of the present invention operate outside any particular native environment in a unified and scalable fashion, and link to a large database of model types and associated functions and digital thread orchestration scripts. This feature allows the system to provide a wider range of suggestions, increasing its utility to the user. Furthermore, the disclosed validation and feedback mechanism from physical constraints and/or platform-specific details does not rely on a user's familiarity with every one of the various tools involved.

Exemplary Process for Sharable Script Generation Using Machine Learning

In what follows, embodiments of the sharable script generation process and associated machine learning model design, training, and deployment processes are discussed in further detail within the context of the IDMP.

Figure 11:
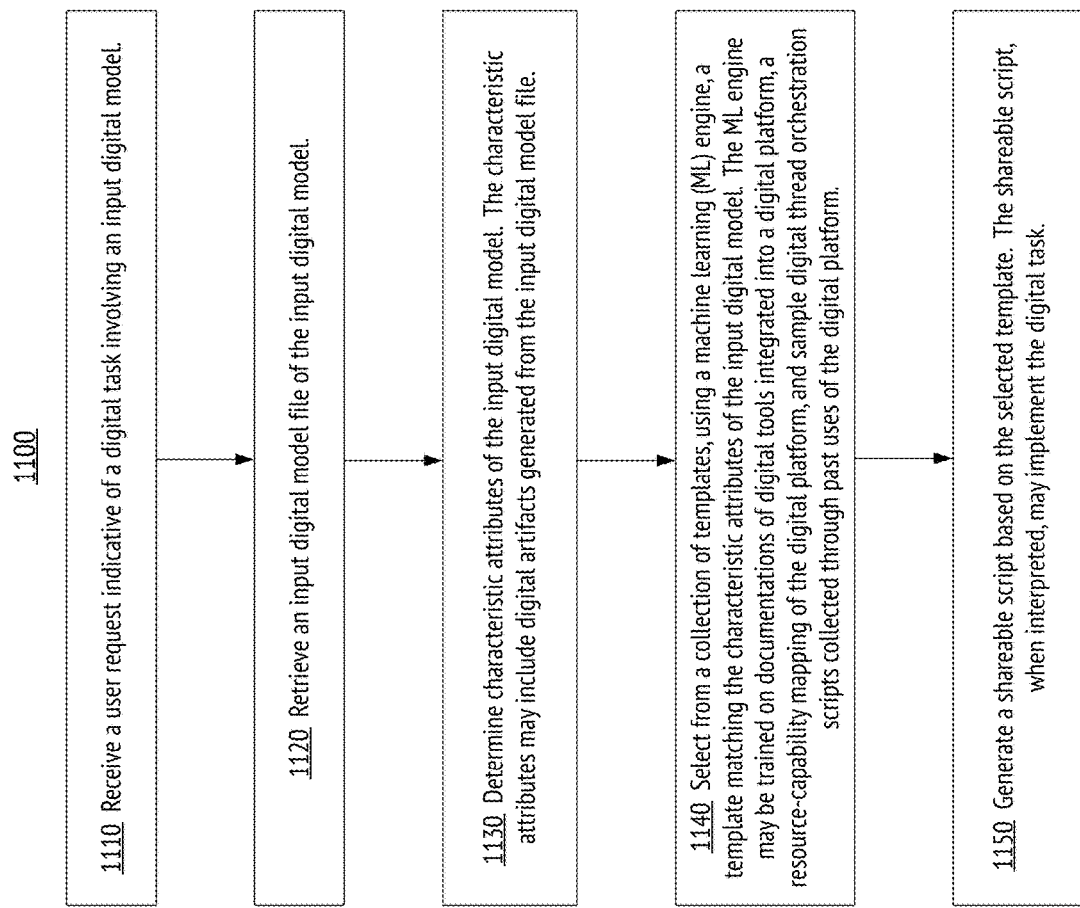
FIG. 11 is an exemplary flowchart showing a process for sharable script generation using machine learning, in accordance with some embodiments of the present invention.

FIG. 11 is an exemplary flowchart 1100 showing a process for sharable script generation using machine learning, in accordance with some embodiments of the present invention. In this illustrative example, upon initialization, a user request and an input digital model are received or retrieved at steps 1110 and 1120. The user request indicates a digital task involving the input digital model. A user may refer to a human user or an artificial user such as a computing entity, a bot, an algorithm, an AI module, or another component of the IDMP as disclosed herein. In some embodiments, the user request comprises natural language statements that describe a user intent in completing a particular digital task. In some embodiments, the user request may comprise a dynamically updated document or a script indicative of the digital task. For example, such a script may correspond to a digital thread that is representative of a digital workflow through multiple tasks involving a number of digital artifacts from multiple digital models. The desired task may be one step within the digital workflow, may specify the overall objective of the digital workflow, and the input digital thread script may provide context including inputs to and outputs from the desired task.

Next at a step 1130, characteristic attributes of the input digital model are determined. The characteristic attributes may comprise digital artifacts generated from the input digital model file. As discussed in the context of FIGS. 7 and 8, digital artifacts may refer to model components or properties extracted from the input digital model file using a crawler or parser script that calls upon native functions of a digital tool associated with the input digital model file. For example, digital artifacts from a structured computer-aided design (CAD) model may include characteristic components such as subassemblies and parts. In addition, a digital artifact may be derived from the extracted model data. An example is the center of gravity computed from a CAD model. Digital artifacts may further refer to metadata on the digital model file itself, or metadata on any extracted or derived model data. Such metadata may be included as part of the digital model file. In some embodiments, the characteristic attributes may include additional model descriptions or user comments on the digital model, stored separately from the digital model file itself. Furthermore, a digital model may comprise more than one digital model file. For example, a complex aircraft design may include CAD files for the airframe structure, computational fluid dynamics (CFD) files for aerodynamics analysis, finite element analysis (FEA) files for structural integrity, and systems engineering files in SysML format for overall system architecture. Electrical system design files, avionics software model files, and manufacturing process model files can also be considered as part of the aircraft model. While each file can be considered a digital model and may represent a different aspect or subsystems of the aircraft, together they form a comprehensive digital model of the entire aircraft. Such a multi-file approach allows different engineering teams to work on their specialized areas while maintaining a cohesive overall digital model of the aircraft. Thus, in step 1130, characteristic attributes of the digital model may be determined from multiple digital model files, or may include descriptive metadata over the multiple digital model files.

At a step 1140, a template is selected from a collection of templates using a machine learning (ML) engine. The selected template matches the characteristic attributes of the input digital model. The ML engine may have been trained on documentations of digital tools integrated into a digital platform, a resource-capability mapping of the digital platform, and sample digital thread orchestration scripts collected through past uses of the digital platform. In several implementations, the training data exclude sensitive data through tokenization or masking or variable-name substitution.

In some embodiments, the user-requested digital task is related to the template. That is, a template would only match to the input digital model if it has previously been used to perform the user-requested digital task or to perform a task similar to the user-requested digital task.

In some embodiments, the matching of the input digital model with the collection of templates is performed within an embedding vector space. An embedding in ML may refer to representing complex data such as words, images, or categorical variables as dense vectors of real numbers in a lower-dimensional space. By representing data in a continuous vector space, embeddings allow ML models to perform computations efficiently and to generalize to unseen examples. Various embedding techniques are available for different types of data. For example, word embeddings such as word2vec create vector representations of text based on surrounding words; embedding layers in neural networks learn representations of categorical variables or other discrete inputs; autoencoders are neural network architectures that learn compact representations of input data through unsupervised learning; graph embedding technique such as node2vec create vector representations of nodes in a graph to capture structural information. In the context of digital engineering, graph data may encompass representations of functions executed on an IDEP, exemplified by digital threads and magic documents, where each function constitutes a node in the graph. Model data such as from CAD models, simulation results spanning electrical, mechanical, thermodynamic, and fluid domains, electrical circuit models, and mechanical models may be represented as images or texts and embedded accordingly.

As characteristic attributes of the input digital model may be in different modalities such as text and image, the embedding vector space may be a joint embedding space that functions as a common language that allows different data classes to be interpreted without manual labeling or classification. Embeddings from various encoders may be aligned into this joint space through methods such as concatenation and projection, bilinear transformations, and attention mechanisms. Within the joint embedding space, an embedding vector of the characteristic attributes of the input digital model may be compared to template embeddings, and the template selected at step 1140 may have an embedding vector closest to the digital model embedding, as measured by a given distance function. Different distance functions such as Euclidean, Cosine, dot product, and the like, may be utilized in different implementations.

In some embodiments, the digital task received at step 1110 is also embedded and projected together with the digital model into the joint embedding space, such that an embedding of the digital task and characteristic attributes of the digital model may be compared to individual template embeddings to find a matching one. That is, each template embedding within the joint embedding space may comprise not only a model template portion but also a digital task portion. The comparison of embedding vectors therefore looks for similar digital models that are used to complete similar tasks. Furthermore, some templates generated from digital thread execution graphs or digital thread orchestration scripts may comprise multiple model template portions, digital task portions, function linkage or data linkage portions, and the like. As more digital models, digital tools, and digital threads are incorporated into the IDMP, various encoder models may be integrated to establish a unified presentation, more templates may be created, and this joint embedding space serves as a comprehensive and universal framework to reason about different types of digital model and data within the IDMP. Further details on template generation and ML engine training are provided in the context of FIG. 12.

At a step 1150, a sharable script is generated from the selected template, wherein the sharable script implements the digital task when interpreted. The sharable script may be a splice function script or a digital thread orchestration script. Note a splice function script may be viewed as a degenerate case of a digital thread orchestration script (e.g., 607 in FIG. 6). A splice function is a commonly-accessible script that provides an Application Programming Interface (API) or Software Development Kit (SDK) endpoint to access a given digital artifact by third-party applications and users. The generated sharable script may be an excerpted portion of the selected template, updated for the input digital model.

In one example where a splice function is to be generated, the template may be a digital model splice template with splice function scripts. In one instance, only characteristic model data of such a model splice template are encoded. Similarities among different encoding vectors may be measured via appropriate distance functions. Estimated similarities between a newly uploaded digital model and existing digital model templates may be relied upon to determine a matching template, from which one or more splice functions may be excerpted and updated appropriately (e.g. change file links, replacing a tool function from a proprietary CAD tool with a similar tool function from an open-source CAD tool, etc.) for use on the new digital model file. In another instance, splice functions of the template are also encoded.

Thus, through continued learning on spliced digital models and by monitoring model splice function calls on the IDMP, the ML engine may recognize an input digital model type file, assign a matching or best-fit template, and suggest to the requesting user, based on the template and a user request, API function scripts that call upon third-party digital tools and are applicable to a newly uploaded digital model. The ML engine assists in splicing the input digital model by providing candidate splice functions that the user can then review and accept.

As the matching between the input digital model and the selected template are not necessarily exact, a template splice function suggested by the ML engine may or may not be directly applicable to the input digital model. For example, the user at 1110 may request that a new splice be generated for an aircraft engine input model A using a digital tool ATool. At step 1140, a template aircraft engine model B that has previously been spliced with a tool BTool may be found to match or best-fit input model A. A HideParts splice function for model B written with BTool API functions may therefore not satisfy the user request directly. Instead, a HideParts splice function for model A may be composed using template model B's splice by finding corresponding tool functions, for example using AI assistance. Thus, the ML engine as disclosed herein suggests specific function scripts applicable to a newly uploaded digital model file, and in this process generates, refines, and/or expands a model splicer for the corresponding digital model type. In some embodiments, the ML engine may recommend a template with a confidence level to indicate how likely the template can be used to help complete the user-requested task.

In another example, embodiments of the present invention generate an orchestration script that threads multiple digital models into a digital workflow to complete a given digital task. Again, the ML engine may utilize various user actions, data artifacts, and historical digital workflows or digital thread orchestration scripts within the IDMP to create a joint embedding vector space over at least two data modalities selected from digital thread execution graph data, image data, and text data. Graph data may encompass representations of functions executed on the IDMP, exemplified by magic documents and digital threads, where each function constitutes a node in the graph. A magic document is a dynamically updated, live document linked to data sources such as digital models and is capable of updating its content in real-time or on-demand as the underlying data changes. Magic documents are updated through execution of digital thread scripts. In a digital thread, appropriate outputs from a preceding digital model are provided as inputs to a subsequent digital model, allowing for information flow. Once a template is selected, a portion of or the entire template may be excerpted and updated to generate the desired orchestration script.

In some embodiments, an autoencoder may be employed for graph data embedding generation, utilizing an adjacency matrix for edge connections, and a node feature matrix of functions at individual nodes to produce a lower-dimensional representation of the graph. A graph transformer network (GTN) may be utilized as an encoder model to generate embeddings for graph data as well. The ML engine compares an input model embedding to template embeddings, evaluates the context of the user's requested task, and provides recommendations of the most relevant template.

Template Generation and ML Engine Training

Figure 12:
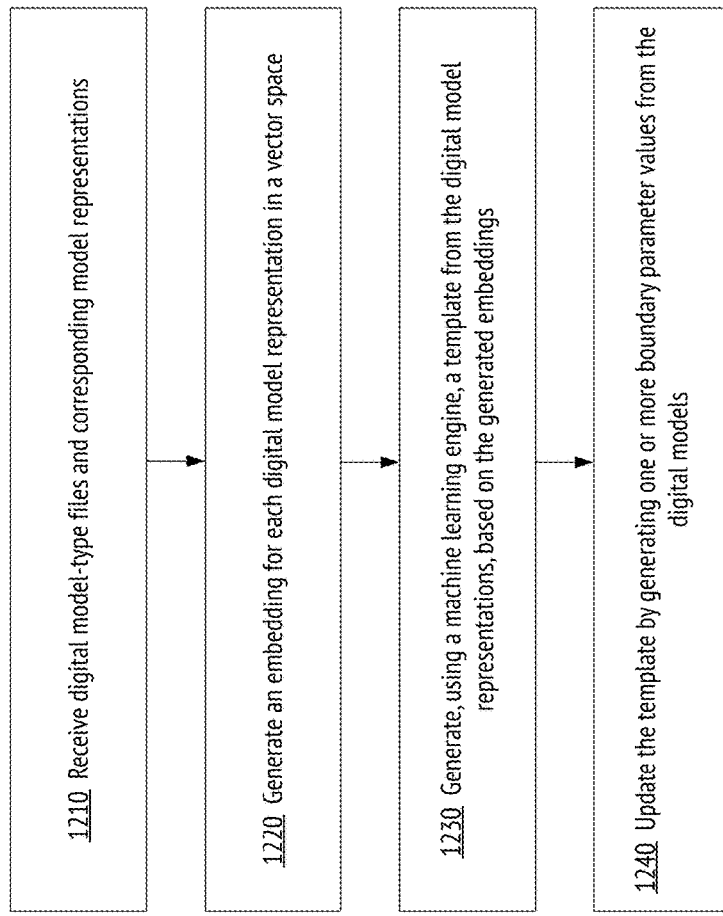
FIG. 12 is an exemplary flow chart showing a process for template generation, in accordance with some embodiments of the present invention.

FIG. 12 is an exemplary flowchart 1200 showing a process for template generation, in accordance with some embodiments of the present invention. The term "template" has been used in discussing model splicing and documentation generation in addition to ML-based script generation in the present disclosure. In the context of sharable script generation using an ML engine, a template refers to a predefined structure or framework used as a starting point for ML-based script generation on the IDMP. For example, a template may correspond to a model splicer having a collection of API function scripts from which individual DE model splices may be generated. For a given digital task, matching to the template may therefore lead to suggestions of individual API function scripts related to the digital task. In another example, a template may outline commonly used, standard procedures for various operations on digital models in a particular digital workflow, in the form of a digital thread orchestration script, a magic document, or a corresponding digital thread execution graph. For a given digital task, matching to the template may lead to suggestions of action sequences or orchestration scripts to streamline and enhance a digital workflow to complete the digital task. In the context of the joint embedding space, template embeddings are reference or prototype vector representations within the shared, multi-modal vector space. A template embedding vector may be derived from averaging multiple historical instance vectors, learned through optimization techniques, or manually defined based on domain expertise.

In FIG. 12, a template generation process 1200 is provided for the specific example of splice function script generation. This is an illustrative implementation only and is not meant to be limiting in scope. In particular, at a step 1210, multiple digital model-type files and corresponding model representations (e.g., model splices) are received. At a step 1220, an embedding for each digital model representation is generated in a vector space. At a step 1230, using an ML engine, a template is generated from the digital model representations, based on the generated embeddings in the vector space. That is, the ML engine may learn common features of the input digital models and patterns within the model data, for example during an unsupervised training process. At a step 1240, the template is updated by generating one or more boundary parameter values from the input digital models.

Expanding from the example shown in FIG. 12, an exemplary implementation of the training of the ML engine as in step 1230 may be performed on documentations of digital tools integrated into the IDMP, a resource-capability mapping of the IDMP, sample digital thread orchestration scripts collected through past uses of the IDMP, as well as historical user inputs, user actions, user scripts, digital threads, and magic documents with corresponding digital threads within the IDMP. Specifically, the training of the ML engine may involve (1) data extraction from the tool documentation, resource-capability mapping, and historical workflows involving digital models, (2) generation of exemplary templates of digital workflows, (3) scoring and validation of the generated templates, and (4) a template suggestion system to users whose feedback is used to further refine the ML engine.

A resource-capability mapping is a framework for identifying and linking available resources with the capabilities they enable or support. An exemplary resource-capability mapping is the IDMP API, or platform API, where the resource refers to third-party tools and functions integrated into and accessible via the IDMP, and where the exemplary capability refers to IDMP functions written in scripts for completing certain tasks using the available resource. Such resource-capability mappings may be used to identify how tool-specific resources such as tool functions, access and control capabilities, human-machine interfaces, processes, and objects can be allocated, invoked, and utilized efficiently and effectively to achieve specific IDMP platform functions or tasks. Resource capability mapping also assists with zero-knowledge implementations where the capability details are available to a user while the specific digital tool resource or its functions are only mapped within the customer environment.

During data extraction, the ML engine may parse digital models (e.g., CAD, FEA, and CFD model files as described in documentations, or as prior ingested by the IDMP) to identify model attributes (e.g., model components) and their interrelationships, with a particular focus on subassemblies and parts. This process may extract detailed information such as dimensions, material properties, and connection types. The extracted data helps in recognizing common patterns and dependencies within the models, such as how parts fit into subassemblies and how these subassemblies combine into larger structures.

During template generation, the ML engine may, based on the extracted model data and historical model and digital thread or workflow usage data collected via the IDMP, generate templates that outline standard procedures for various operations. For subassemblies, templates may be created to detail assembly, alignment, and testing procedures based on commonly used sequences from historical usage data. For individual parts, the templates may suggest standard adjustments like material changes or dimensional tweaks, tailored to the part's specific characteristics and historical modifications. These templates are designed to enhance efficiency and accuracy in digital workflows.

During scoring and validation, the generated templates may be subjected to a scoring system that evaluates their effectiveness using metrics such as time saved, errors reduced, and user satisfaction. Only those templates that meet a predefined efficacy threshold may be integrated into the system for ongoing use. This scoring and validation process ensures that only the most effective templates are utilized, providing real, measurable benefits to ongoing projects.

Furthermore, once deployed and through a continuous learning process, the ML engine may include a dynamic template suggestion system that evaluates the context of the user's current task and their historical usage patterns to provide real-time recommendations of the most relevant templates to streamline workflows and reduce manual input. Such historical usage patterns may include the user's historical usage pattern of unique digital thread scripts, and/or the template's historical usage patterns by different users for different tasks. The template's usage pattern may provide clustering insights about similar threads. As users interact with these suggested templates, their feedback may be collected and used to further refine the ML engine, continuously improving the accuracy and relevance of future template suggestions.

Exemplary Machine Learning Engine Implementation

Figure 13:
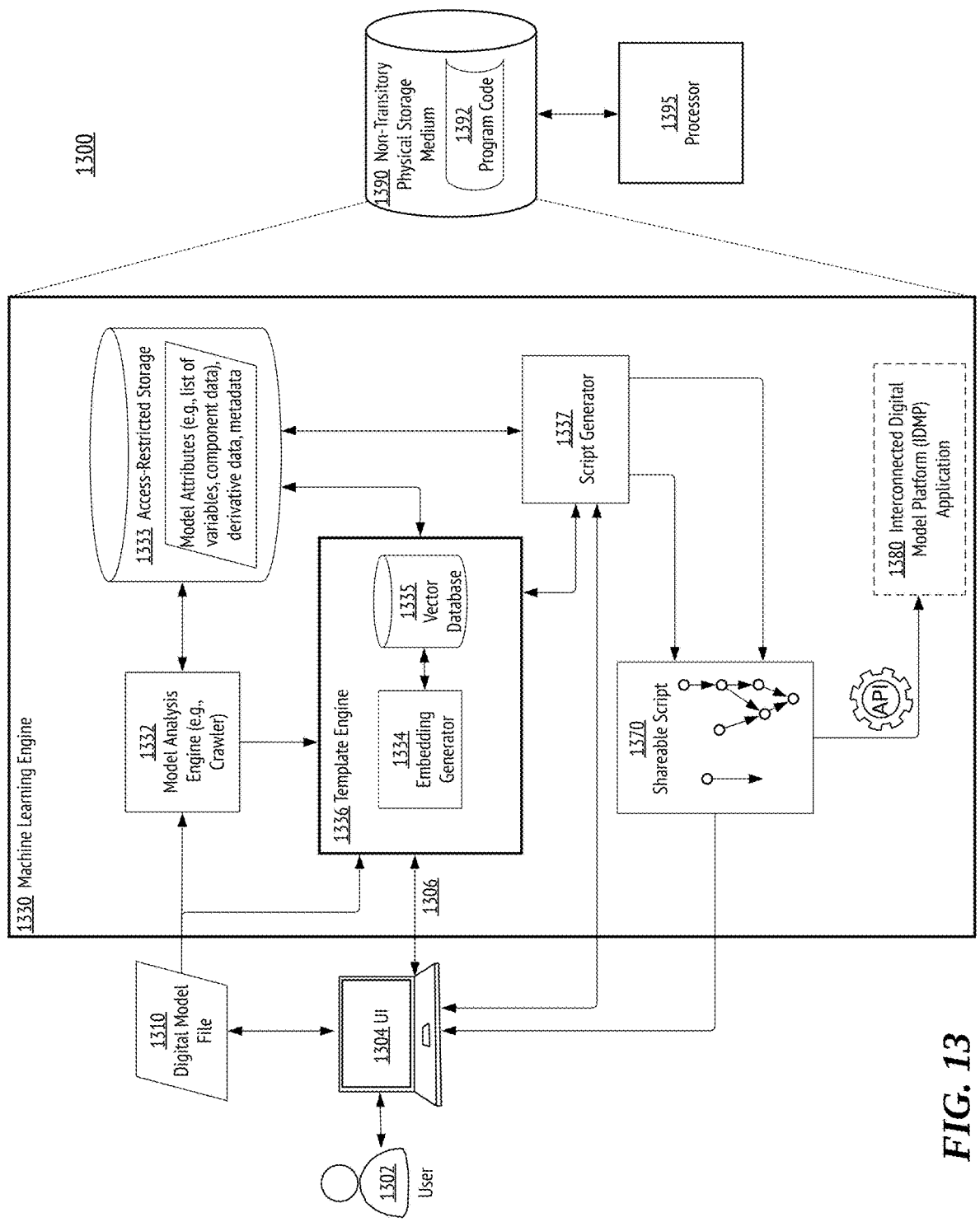
FIG. 13 is an exemplary system for generating a sharable script using a machine learning (ML) engine, in accordance with some embodiments of the present invention.

FIG. 13 is an exemplary system for generating a sharable script using a machine learning (ML) engine 1330, in accordance with some embodiments of the present invention. Specifically, a non-transitory physical storage medium 1390 is provided to store program code 1392, the program code executable by a hardware processor 1395 to cause the hardware processor to execute computer-implemented processes, including embedding generation, template selection, or generating a sharable script 1370 for an input digital model file 1310 to complete a user-request digital task 1306.

In some embodiments, program code 1392 comprises code to receive a digital model file 1310 of an input digital model, in a source file format (e.g., in a native document file format such as .dwg). In some embodiments, digital model file 1310 may be received from a user 1302 through a user interface (UI) 1304. User 1302 may be a human or a computing entity, and UI 1304 may be a graphical UI (GUI), a code interface such as an API/SDK interface, or a multimodal interface as discussed with reference to FIG. 5. For example, user 1302 may represent an artificial intelligence (AI) module that intends to complete a digital task of linking a first digital model (e.g., a CAD model) to a second digital mode (e.g., a document) to, by running a digital thread, update the second digital model with data extracted from the first digital model. User 1302 may provide an input 1306 that describes or is indicative of the desired digital task. Another example of user input 1306 may be a request for specific document artifacts that can be retrieved via splice functions on the input digital model file 1310. In some embodiments, digital model file 1310 may be received directly from a data source, for example, retrieved from an internal database, a cloud-based storage service, or the world wide web.

A model analysis engine 1332 then analyzes input digital model file 1310 to extract characteristic digital model attributes that may be stored in a data storage area 1333, which may be access-restricted, cloud-based, or may be located in customer buckets within customer environments for a zero-trust implementation. In some embodiments, model analysis engine 1332 may comprise a crawler or parser script that calls upon native functions of native digital tools associated with input file 1310 to parse the input digital model in detail to extract component data, identify metadata associated with the model file and/or component data, and generate a list of components. In some embodiments, model analysis engine 1332 may generate derivative data from the extracted model data, with or without AI-assistance. When a derivative datum is generated and stored in storage 1333, associated metadata may be stored as well, for example to identify a time of the derivation, code used for the derivation, user authorizing the derivation, and/or a version of the input digital model file at the time of the derivation. Such metadata may be crucial in applications that require near-instantaneous auditability and clear traceability to original sources of truth.

In some embodiments, an embedding generator 1334 within a template engine 1336 generates embedding vectors in a joint vector space. Template vector embeddings may be stored in a vector database 1335. In various embodiments of the ML engine 1330, template engine 1336 may utilize various data artifacts within the platform to create a joint embedding space and suggest templates as described below in more detail.

Once a template is suggested by template engine 1336, a script generator 1337 may build a digital thread orchestration script 1370 from a template suggested by template engine 1336. In some embodiments, script generator 1337 may interact with user 1302 to receive user feedback on the selected template and on the script generation process. Note that a splice function may be viewed as a degenerate digital thread (e.g., 607 in FIG. 6) that retrieves a digital artifact from a digital model. Digital thread orchestration script 1370 may be interpreted and executed as an IDMP application 1380, and may be shared with another user.

While model analysis engine 1332, database 1333, template engine 1336, and script generator 1337 are shown as separate modules within FIG. 13, in various embodiments of the present invention, these modules may be integrated in any combination to facilitate seamless data exchange and functional collaboration to optimize the overall performance of the ML engine 1330. In some embodiments, parts of ML engine 1330 may be implemented within a customer environment behind a customer firewall and be managed by an IDMP agent, so that customer data within storage 1333 is fully protected under a zero trust setting. Template vector database 1335, which may be desensitized from specific customer data, may be provided by the IDMP and accessed via the IDMP agent. In some implementations, as users interact with these suggested templates, their feedback provided through 1306 is collected and used to further refine the ML engine, continuously improving the accuracy and relevance of future template suggestions.

An Exemplary Template Engine Implementation

In various embodiments, template engine 1336 may be implemented using a number of techniques, including but not limited to, retrieval-augmented generation (RAG) architecture, low-rank adaptation of LLMs (LoRA), graph transformers, and reinforcement learning. In one example, the following steps may be carried out by the template engine.

First, template engine 1336 may ingest a variety of input data types integral to its operation within the IDMP. This data may include, but are not limited to, graph data, image data, and text data. Graph data encompasses representations of functions executed on the IDMP, exemplified by magic documents and digital threads, where each function constitutes a node in the graph. Additionally, model data such as CAD models, simulation results (spanning electrical, mechanical, thermodynamic, and fluid domains), electrical circuit models, and mechanical models are incorporated. This diverse set of inputs ensures comprehensive coverage and applicability of the template engine across multiple domains and use cases.

Next, embeddings for different data types may be generated by embedding generator 1334. For graph data, an autoencoder may be employed, utilizing an adjacency matrix for edge connections and a node feature matrix to produce a lower-dimensional representation of the graph. An autoencoder is a type of artificial neural network architecture used for unsupervised learning and dimensionality reduction. An autoencoder typically consists of an encoder network that compresses the input data into a lower-dimensional representation, and a decoder network that attempts to reconstruct the original input from this compressed representation. Features learned in this process by the autoencoder can serve in other ML tasks such as constructing one or more templates. As autoencoders are trained to reconstruct their input data, they effectively use the input as both the features and the target output, thus can be considered as performing unsupervised or self-supervised learning. This autoencoder architecture for graph data embedding, through a constricting layer, derives the embedding vectors by minimizing reconstruction loss, typically using a mean square error loss function. To avoid overgeneralization and high training costs, separate autoencoders may be used for distinct graph classes. On the other hand, image data embeddings may be generated using pre-existing encoder models suited for image processing. Similarly, text data embeddings may leverage established encoders like BERT (Bidirectional Encoder Representations from Transformers) and Word2Vec, facilitating the integration of textual information into the system.

Template engine 1336 may further create the joint embedding space to enable the integration and processing of diverse data types autonomously. This joint embedding space functions as a common language, allowing the ML engine 1330 to relate and interpret different data classes without manual labeling or classification. Aligning embeddings from various encoders into this joint space can be achieved through methods such as concatenation and projection, bilinear transformations, and attention mechanisms. Concatenation and projection involve combining embeddings from different modalities and projecting them into a unified space via a neural network. Bilinear transformations offer another technique for embedding alignment, while attention mechanisms dynamically weigh and merge embeddings, enhancing the model's focus on relevant features. This joint embedding space enables the template engine 1336 to predict graph representations of workflows based on user input effectively, as discussed in detail with reference to FIG. 17, and in turn suggest templates for script generation by script generator module 1337.

A Graph Transformer Network for the Template Engine

Thus, the template engine seeks to represent disparate data sources in a common *lingua* franca to enable similarity search between different data sources. It consists of a set of encoder models, each designed to handle a specific type of data, such as graph data, image data, and text data. Graph data is a special subset within the IDMP, representing digital threads involving different types of digital models and digital artifacts in different formats. In one perspective, graph data may overlap with other data modalities; for example, edge connections may be stored in text or numerical formats, and function nodes may be associated with digital artifacts of various formats.

A Graph Transformer Network (GTN) may be utilized as an encoder model to generate embeddings for graph data. However, the joint embedding space created by the template engine 1336 may be broader and more generic than that by a GTN. This joint embedding space serves as a comprehensive framework to reason about all types of engineering models and data within the IDMP Platform, integrating various encoder models to establish a unified representation.

A CAD Model Example for Model Data Having Different Modalities

Figure 14:
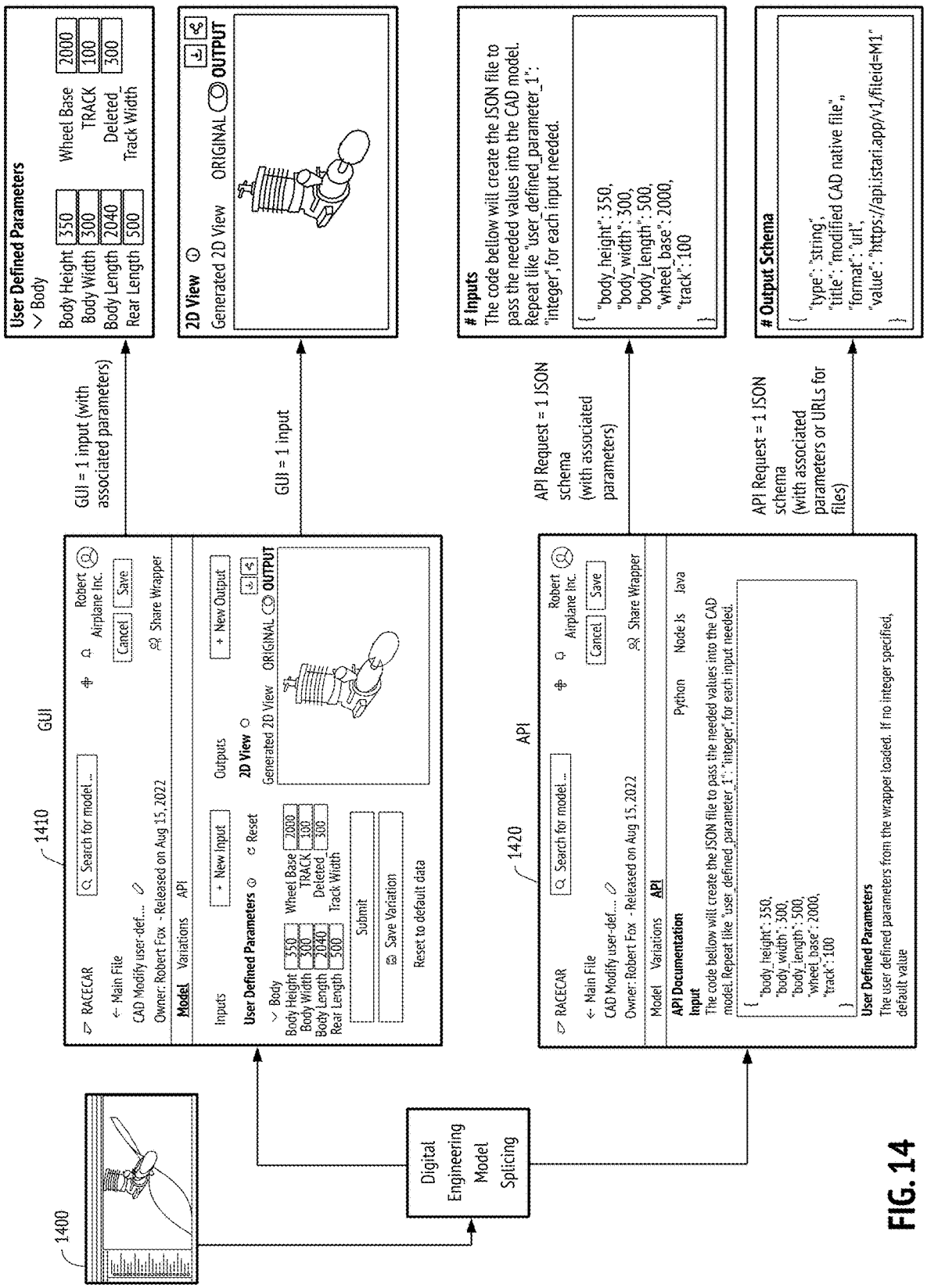
FIG. 14 shows an illustrative example of CAD model splicing results within the IDMP, in accordance with some embodiments of the present invention.

As an illustration of model data having different modalities and revisiting the splice function generation use case for ML-based script generation, FIG. 14 shows an illustrative example of CAD model splicing results within the IDMP, in accordance with some embodiments of the present invention. In this example, an input CAD file 1400 for a propeller engine is spliced into model data and splice functions written as scripts that call upon native digital tool APIs. Exemplary model data are shown in an GUI interface 1410 with input parameter fields (e.g., text data) on the left, and an output visualization (e.g., image data) on the right. Data schemas and/or API scripts may be accessed via a separate tab 1420 in the GUI, listing input schemas and output schemas for splice functions or API endpoints to pass needed values into the CAD model, or for providing output locations of modified native files. Once ingested into machine learning engine 1330, this model splice may be utilized by template engine 1336 in creating CAD model templates.

An Exemplary Use Case for ML-Based Script Generation

Figure 15:
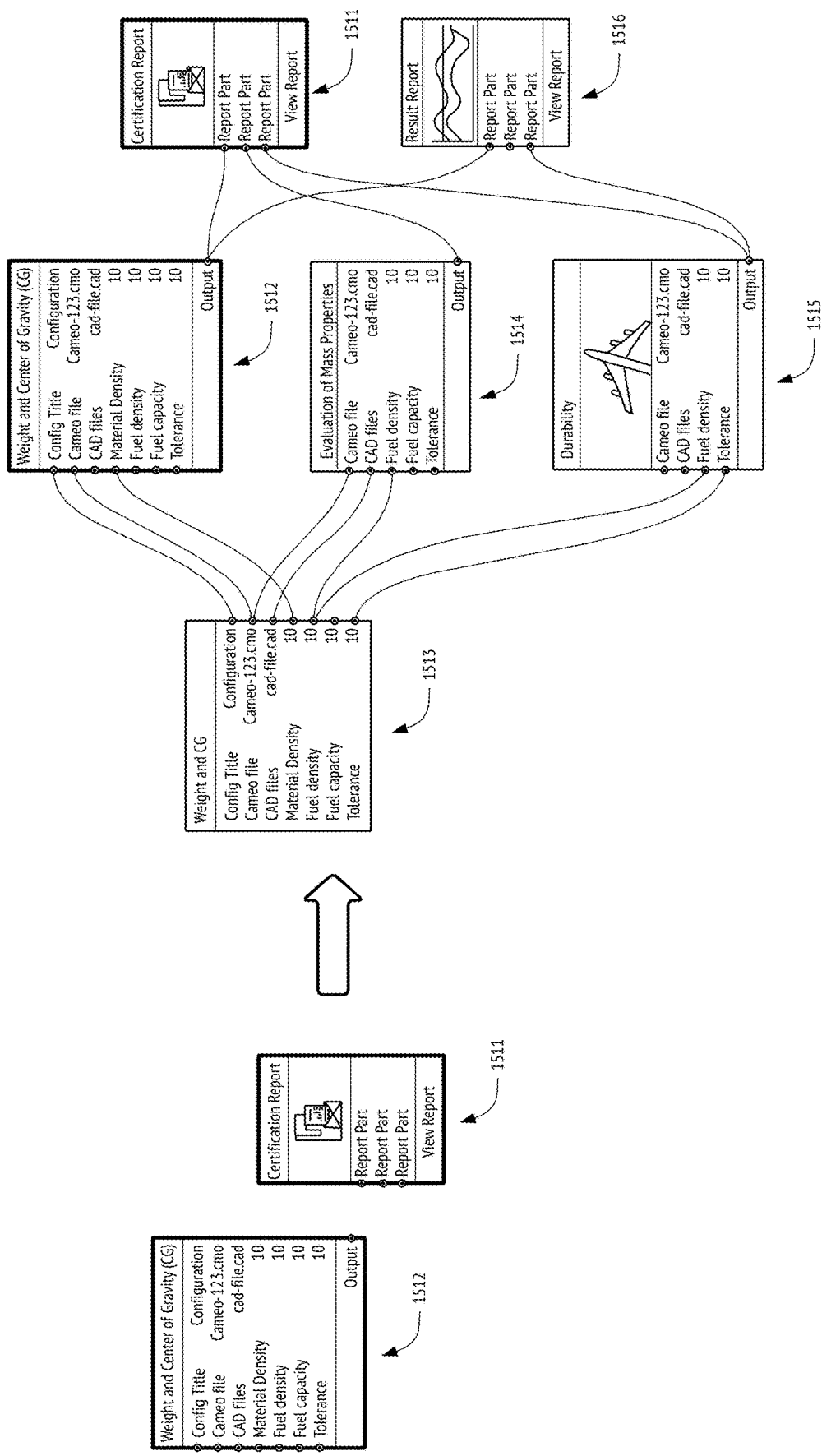
FIG. 15 shows an example for using ML in suggesting and linking digital model splices for a given digital task on the IDMP, in accordance with some embodiments of the present invention.

To illustrate the utility of ML-based script generation as disclosed herein, FIG. 15 shows an example for using ML in suggesting and linking digital model splices for a given digital task on the IDMP, in accordance with some embodiments of the present invention. In this example, a user uploads an example or template report 1511 (e.g., an Aircraft certification report) to be completed, and a set of requirements or user needs 1512 (e.g., an excel file with range, weight, cost, etc.) that has previously been prepared. The user requests that the IDMP assist in completing the certification report and generate a results report. The IDMP may identify from the requirements file one or more input digital model files and perform model splicing of uploaded or identified files. The system as disclosed herein may then analyze characteristic attributes of such input digital models obtained (e.g., via model splicing or model data parsing) to find a matching template that can be used to generate a digital thread orchestration script to link multiple digital models and generate the desired reports. For instance, a generated digital thread orchestration script may access model splices 1513, 1514, 1515, and 1516, and provide linkages or connections among these model splices. Thus, the IDMP provides to the user a set of digital models that are appropriately linked to meet the user's request of completing the certification report and generating a result report. Note that in a degenerate case, the user may request that a splice function script be created for accessing a digital artifact needed to complete a portion of the certification report, instead of a full digital thread orchestration script that accesses multiple digital models.

Machine Learning Data Pipeline

Figure 16:
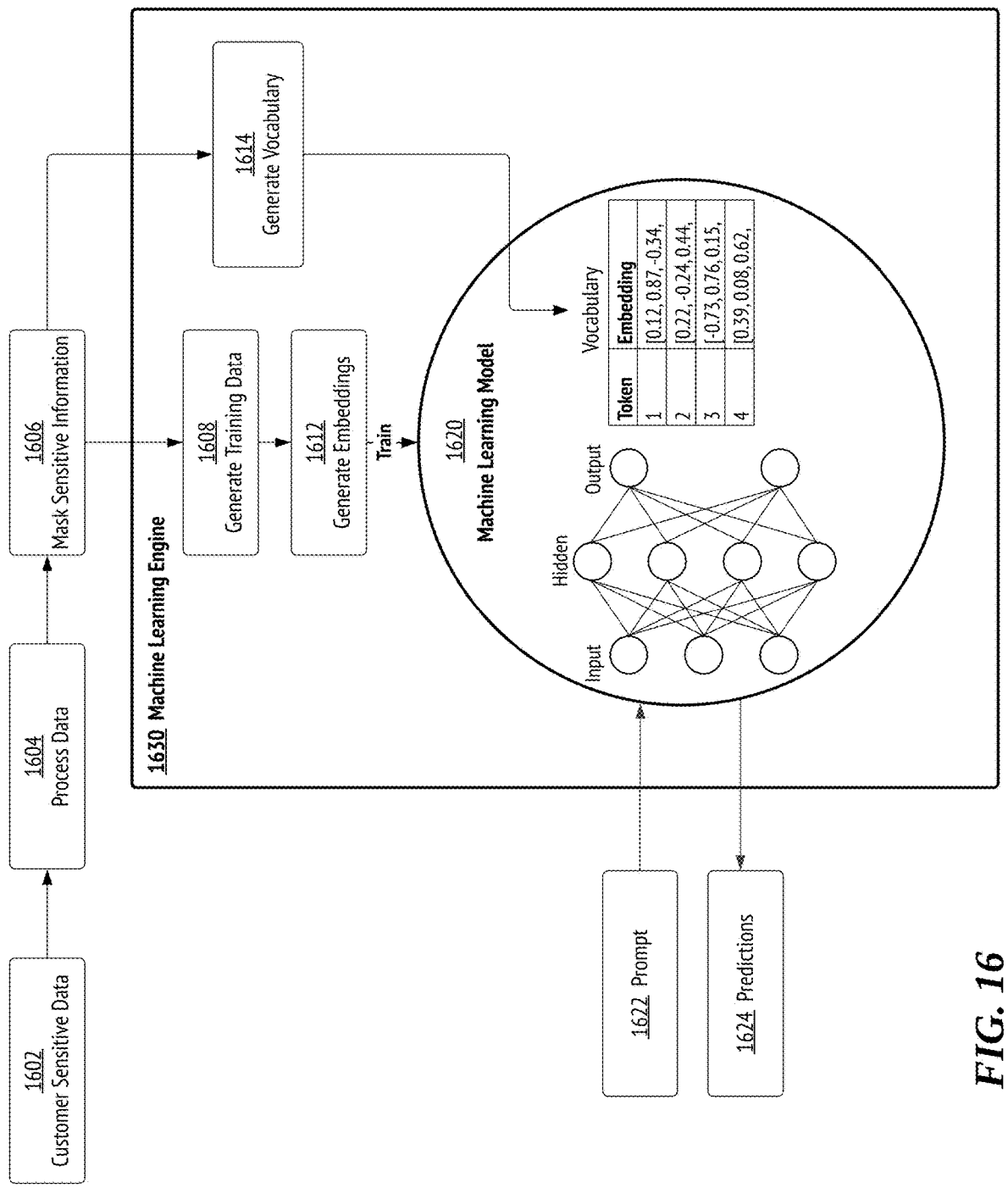
FIG. 16 shows an illustrative privacy-preserving data pipeline for an ML engine within the IDMP, in accordance with some embodiments of the present invention.

FIG. 16 shows an illustrative privacy-preserving data pipeline for a ML engine such as 1330 within the IDMP, in accordance with some embodiments of the present invention. This example provides a high-level description of the ML data flow, separating a training phase involving steps 1602 to 1612 and a deployment phase involving steps 1622 and 1624. In the specific example shown in FIG. 18 later, training is continuous where model attributes from validated and reviewed templates are added into the training data set.

The overall process in FIG. 16 begins with the collection of usage data at a step 1602, which can be in various forms such as digital model files, model splices, API scripts, orchestration scripts for digital workflows, and endpoint metadata for API scripts at the endpoints. It is important to note that some of this data may contain sensitive customer information, such as proprietary design parameters or cost information.

The data may then be processed at a step 1604 by the IDMP, which may involve identifying the data type and adding metadata to reflect the context at the time of data collection. In the example shown in FIG. 16, it is assumed that the input data include model splices, and data processing step 1604 as well as a sensitive information masking step 1606 may be conducted on such model splices. In some embodiments, model splicing may be performed within step 1604 and additionally, in some examples, within step 1606.

In some embodiments, sensitive customer information masking step 1606 may involve user input and may be validated further with user feedback. For example, one implementation could employ placeholder anonymization, which replaces sensitive parameters with placeholder variables, ensuring data sovereignty is maintained. Once the sensitive information is masked, the data may be prepared for use as training data for the ML engine 1630. In one embodiment, the detection and replacement of sensitive data such as design parameters is carried out by an ML or AI model trained using DE platform data and other sensitive data. In some embodiments, steps 1604 and/or 1606 may be optional, and data in step 1602 may be collected from prior workflows within the IDMP.

ML engine 1630 may analyze the input data and create a vocabulary at a step 1614 based on the data corpus with all sensitive information masked. Concurrently, the platform generates, at a step 1608, a training dataset, which may include appropriate test and validation datasets. Embeddings are then created at a step 1612, which are fed into a ML algorithm or ML model 1620 for training. The ML model 1620 may be evaluated and tested to fine-tune its performance on specific digital tasks. Once adequately trained, ML engine 1630 can be used to make suggestions and predictions 1624 based on input prompts 1622, which may comprise a digital model file, a model splice, and/or a natural language prompt from a user. Such user prompts may be analyzed with AI-assistance using an LLM-based chat bot to identify a desired digital task to be completed by suggested scripts 1624.

In some embodiments, to handle highly proprietary customer data, such as specific aircraft design details, the pipeline may include additional data security measures such as encryption, so as to ensure that the data is handled in a secure and confidential manner. Additional measures to ensure that the ML and AI models do not memorize or leak sensitive data during the training or inference process, thus maintaining data security and propriety, are also relevant.

Embeddings of Data Having Different Modalities

As discussed previously in reference to FIG. 14, embeddings in ML converts non-numerical data into numerical representations of objects or entities, such as words, phrases, items, digital mode components and properties or even function scripts in a continuous vector space. These embeddings help uncover the relationships and patterns between these entities by mapping them into lower-dimensional vectors. For example, in natural language processing, word embeddings are commonly used to represent words in a way that preserves their semantic meaning and context.

In the present disclosure, joint embeddings are used to represent user inputs, digital entities, and interrelationships including user actions, feedback, digital models, subsystems, objects, attributes, components, properties, materials, functionalities, relative positions and connections, API endpoint input/output schemas, API scripts, and digital thread orchestration scripts etc. in a way that captures and preserves the specific context and inter-dependencies of digital models and digital workflows. Such embeddings may be learned by the ML engine during training, and enable the ML engine to better understand and process digital model data and digital tasks written as program code, and to perform targeted tasks such as code generation to produce useful insights and complete requested tasks.

A joint embedding refers to an ML technique where multiple types or modalities of data are mapped into a shared vector space. Joint embeddings allow different types of data (e.g., text, image, audio, 3D projections, etc.) to be represented in the same vector space, and enable the capture of relationships between different data modalities and unified learning from multiple data sources. Joint embeddings also allow correlating elements across different modalities, such as matching images with their textual descriptions. Aligning embeddings from various encoders into the joint space can be achieved through methods such as concatenation and projection, bilinear transformations, and attention mechanisms. Concatenation and projection involve combining embeddings from different modalities and projecting them into a unified space via a neural network. A neural network may model with multiple input branches, each processing a different data modality, converging into a shared representation. Bilinear transformations offer another technique for embedding alignment, while attention mechanisms dynamically weigh and merge embeddings of different modalities in transfer-base architectures to enhance the model's focus on relevant features.

Large Language Models such as GPT rely heavily on using embeddings for training due to their model architecture involving transformers. In the transformers architecture, encoders and decoders process sequential data, which is often represented as a series of embeddings. Such sequential data may comprise natural language (e.g., text), in which case the input and output sequences consist of word, sub-word, or character embeddings. In the present invention, such sequential data may further comprise program code that represent digital model data and scripts spliced from digital models. The encoder is a key component of the transformer architecture and is responsible for processing and encoding the input sequence into a continuous representation. It consists of a stack of identical layers that capture the context and relationships between elements in the input sequence. Each layer processes the input vector and generates a new vector that contains updated contextualized information obtained from other tokens in the input sequence. The final layer of the encoder produces a vector that contains comprehensive contextual information for the token, which may then be used for various tasks.

In the present disclosure, "embedding" and "encoding" are used interchangeably to refer to the conversion of digital model splice data and digital thread orchestration scripts into numerical representations. An exemplary encoder architecture that may be used is BERT (Bidirectional Encoder Representations from Transformers). BERT is based on the transformer architecture. Specifically, BERT is composed of transformer encoder layers. Another exemplary encoder is CodeBERT, a bimodal pre-trained BERT model for programming language (PL) in addition to natural language (NL). CodeBERT extends BERT's capabilities from natural language to source code, understanding programming language-related tasks. It has been pre-trained on a massive dataset containing both natural language and source code, enabling it to learn to depict the relationships between code tokens and comprehend code semantics. By pre-training on a large body of code and natural language, CodeBERT can generate embeddings/encodings for code snippets, functions, or even entire scripts. Yet another exemplary encoder is a graph transformer network for embedding a digital thread execution graph, where each node represents a task or a function to be performed. These embeddings/encodings can subsequently be used as input to various downstream tasks, such as code completion, summarization, search, and generation.

Sharable Script Generation Data Pipeline

Figure 17:
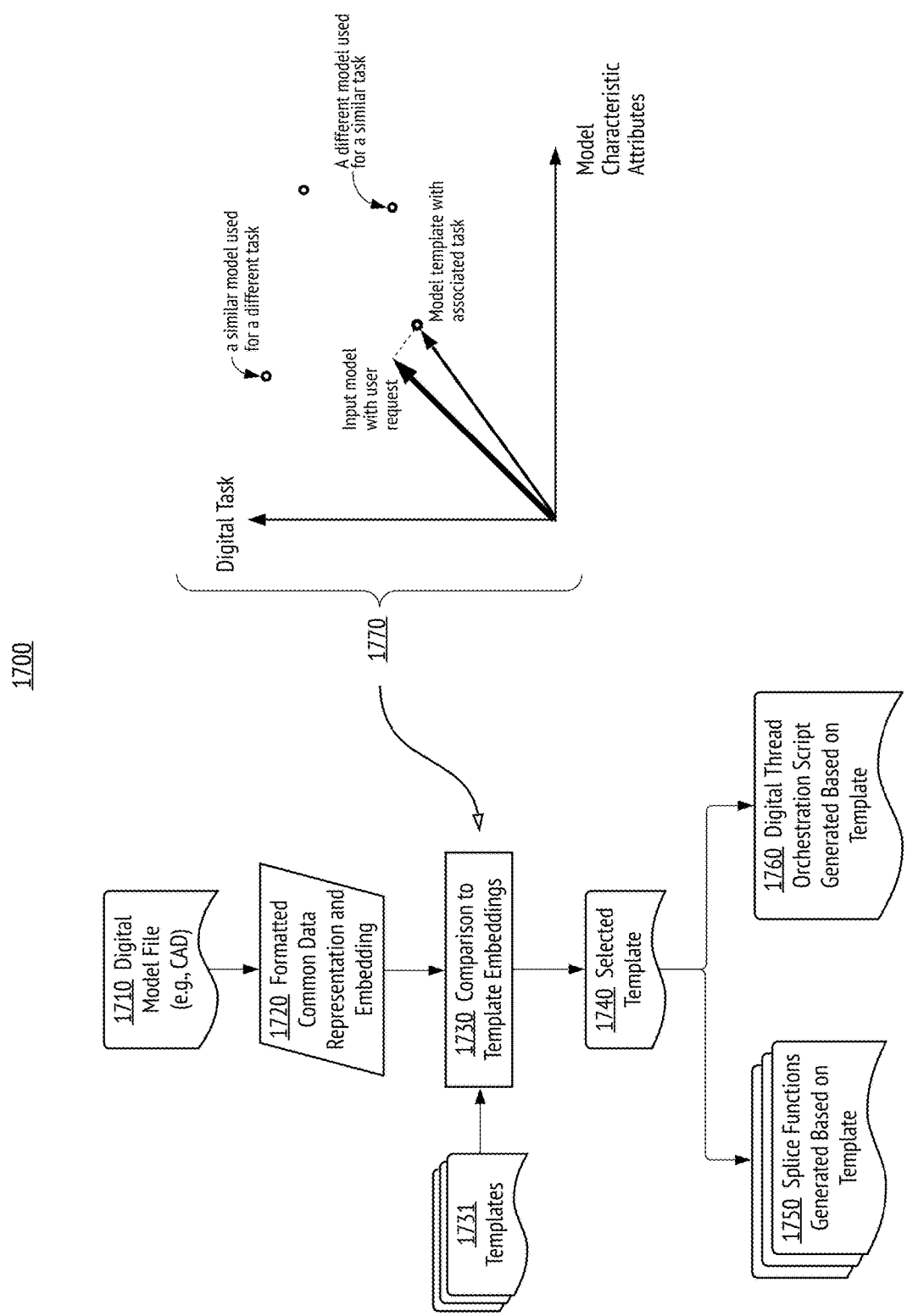
FIG. 17 shows an illustrative data flow diagram through an ML engine, in accordance with some embodiments of the present invention.
Figure 18:
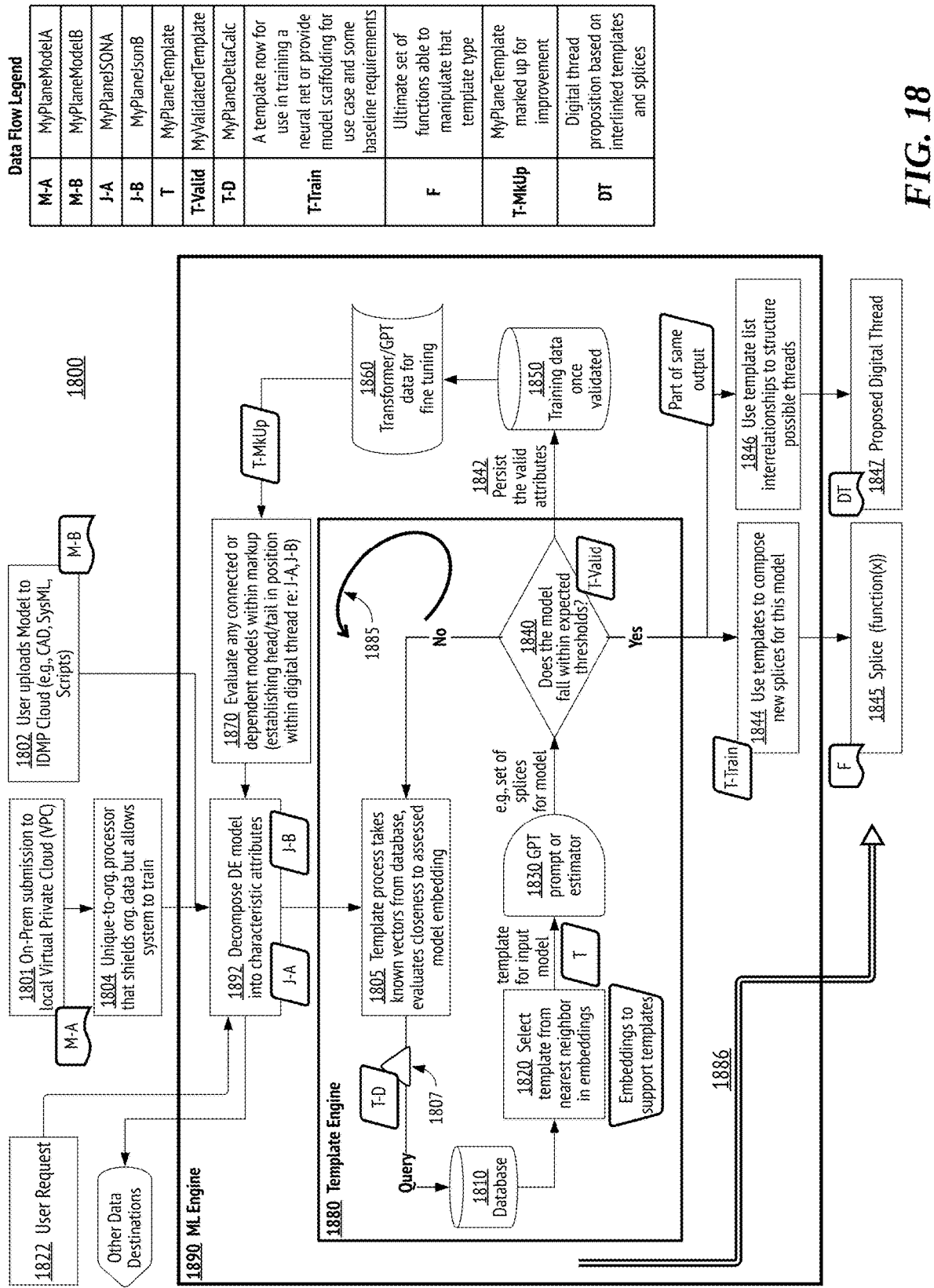
FIG. 18 shows illustrative process and data flows through an ML engine for IDMP script generation, in accordance with some embodiments of the present invention.

FIG. 17 shows an illustrative data flow diagram 1700 through ML engine 1330 shown in FIG. 13, and ML engine 1890 shown in FIG. 18, in accordance with some embodiments of the present invention. Here an input model (e.g., CAD) 1710 is first analyzed and embedded to generate formatted common data representations and embedding (e.g., mode splices encoded into embedding vectors) 1720. A comparison to template embeddings of a set of templates 1731 is then performed at a step 1730 to determine a selected template 1740. Based on the selected template, splice functions 1750 and/or digital thread orchestration scripts 1760 may be generated by the ML engine. Note that a splice function may be viewed as a degenerate digital thread (e.g., 607 in FIG. 6) that retrieves a digital artifact from a digital model.

A simplified joint vector space representation 1770 illustrates how an input digital model file is compared to existing templates. Two axes "model characteristic attributes" and "digital task" are shown, and the embedding vector for the input model with the user request indicating the desired digital task is drawn with this vector space. A matching model template would have similar model characteristic attributes while also being related to or associated with a similar digital task.

Machine Learning Engine

Figure 19:
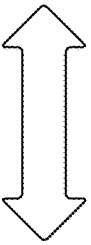
FIG. 19 shows exemplary digital model characteristic attributes for two different aircrafts, in accordance with some embodiments of the present invention.

FIG. 18 shows illustrative process and data flows 1800 through an ML engine 1890 for IDMP script generation, in accordance with some embodiments of the present invention. As discussed in reference to FIG. 8, platform API 890 comprises splice functions and platform scripts or orchestration scripts such as 894. In the context of ML-based script generation, "IDMP script" and "platform script" both refer to any script accessible via the IDMP, and would include splice function scripts as well as digital thread orchestration scripts. In FIG. 18, the illustrative ML engine 1890 is a continuous learning model that trains on tool documentations, IDMP documentations, as well as the history of prior digital workflows by users of the IDMP to suggest user-specific actions, digital model splices, API endpoints, splice function scripts, and/or digital thread orchestration scripts when a new digital model file is uploaded. Correspondingly, FIG. 19 shows exemplary model splices of two different aircrafts that can be compared, according to some embodiments of the present invention.

Specifically, the following steps are performed in the process flow shown in FIG. 18 once ML engine 1890 is deployed. A digital engineering CAD model for an airplane or aircraft is considered here as an illustrative example of an input digital model only, and is not meant to be limiting in scope.

1. Data Intake: At steps 1801 and 1802, a variety of input data types integral to operations within the IDMP may be ingested by ML engine 1890. In the example shown, a input digital model such as a user generated model (e.g., MyPlaneModelA (M-A) or MyPlaneModelB (M-B)) may enter the ML engine 1890 either via a customer's Virtual Private Cloud (VPC) or via a public-facing Software-as-a-Service (SaaS) platform associated with the IDMP. A user request 1822 may also be received by the ML engine. The user request may identify or describe a digital task to be implemented or completed by a script generated by ML engine 1890.
   a. At a step 1804, in the case of the customer's VPC pathway, a privacy preserving method may be applied to the data to ensure that the customer's Intellectual Property (IP) is protected while the ML models are trained on the data.
   b. In some embodiments, input data 1801 or 1802 may be model splices. For example, a user may upload a model splice to see what other functionalities and use-cases may be applicable to the model splice.
   c. In some embodiments, input data 1801 or 1802 may be scripts themselves. For example, a user may upload a digital thread orchestration script, which may in turn be analyzed to identify the digital task completed by the digital thread and digital models involved in the digital thread. Alternatively, the user may provide an explicit request 1822 describing his or her intention. For example, the user may request that the ML engine 1890 extend the input digital thread further to complete a given task. In some embodiments, AI-assistance may be utilized to identify one or more digital models involved in the input digital thread.
2. Model Decomposition and Encoding: At a step 1892, the input model is analyzed to determine characteristic attributes. For example, it may be disassembled into fundamental engineering building blocks (e.g., MyPlaneJSONA (J-A) or MyPlaneJSONB (J-B)) using a crawler, parser, or model splicer. For an input aircraft model, model components or model data blocks may include fuselage, wings, engines, propellers, tail assembly, aerodynamics, and the like.
   a. The fundamental attributes or building blocks produced by the disassembly or model decomposition process 1892 may be defined by the IDMP. In the context of digital engineering, such building blocks are the fundamental basis of the engineering discipline(s) involved in the model(s). Consequently, different components, properties, and model types may be associated with different basis vectors once encoded, and basis vector sets associated with different model types may overlap.
   b. Recall CAD model splice examples HideParts and ListParts as described with reference to FIG. 7. Parts in these splices are elementary engineering components that can be made into basis vectors.
   c. In some embodiments, for the CAD model splice example, model information and associated metadata (e.g., cost, material, fitting to adjacent part or other component within structure) as contained within a model splice may be passed through an embedding function as well. The input model structure is therefore encoded into a numerical vector representation of component or property embeddings. Different model attributes or model components may have different data modalities, including but not limited to, text data (e.g., parameter fields, alphanumeric data, time series, tables, etc.) image data (e.g., 2D views, 3D views, wireframes, plots, etc.), audio or video data (e.g., recorded user comments the digital model).
   d. In some embodiments, especially during training, the input to the ML engine 1890 may be a digital thread orchestration script or a corresponding digital thread execution graph where each node represents a function within the digital thread. For such graph data, an autoencoder may be employed. Separate autoencoders may be used for distinct graph classes, such as graph attention auto-encoders or variational graph auto-encoders that can answer within a graph's data or expand on the graph data, where each graph class may further correspond to context hierarchy of a digital model and its derived artifacts, or digital threads as DAGs. Image data may be embedded using pre-existing encoder models suited for image processing. Similarly, text data may be embedded by leveraging established encoders such as BERT and word2vec.
  e. In some embodiments, for CAD models, the model embedding process may be done through a CAD Embedding Transformer (CADET), which encodes CAD-related data from meshes into vectors. CADET enables effective similarity searches with higher confidence, but other encoder models can also be used in various implementations of the ML engine. For example, a BERT encoder such as CodeBERT may be used.
  f. A transformer model (e.g., CodeBERT) for model type file embedding may be fine-tuned on model splicer API scripts, and the syntax and metadata in digital model type files.
  g. In the more general case where different digital models are placed into the same vector space, a digital engineering embedding transformer (DEMET) may be used. Again, one possible DEMET is CodeBERT. An embedding transformer processes input texts of model data and function scripts, and converts them into numerical representations that capture the relationships between words and their context in the input.
  h. Spans of such vectors from the same embedding function occupies an embedding space. As an illustration, consider a 2-dimensional matrix of this organized data. This embedding plane may then be extended into more dimensions, where adjacent nodes from one plane to the next may describe material with respect to a particular assembly data.
3. Model Comparisons, including Comparison to Templates Using a Template Engine: At a step 1805, a similarity search using one or more distance metrics may be used to determine similarity between two embeddings, such as between two existing models each with corresponding model splices, or between a user's input model and a template. In some embodiments, similarities may be captured among more than two models, for example, for use in creating model templates. In some embodiments, the similarity measure is determined from delta differences 1807 (e.g., MyPlaneDeltaCalc) calculated between vectors.
  a. The template process 1805 is a utility for establishing user data and actions on their models translated through the IDMP's platform API. This process can be viewed as reverse capability mapping.
  b. Model template embedding vectors, rather than text, may be stored in a vector database 1810. For example, BERT encoding analogues may be stored.
  c. Similarity between two given embedding vectors may be measured by a distance function, for example, Euclidean, Cosine, dot product, Hamming Distance, and the like. These distances provide a "closeness" metric, which can inform characteristic components, properties, or script parts for inclusion in a template, or for further computation with respect to operations a user may demand, for example, force estimation on a wing type or geometry.
  d. In some embodiments, the type of data and data distribution inform the decision of which distance metric to use.
  e. In some embodiments, the distance functions may be used to build supervised learning algorithms, such as K-nearest neighbors (KNN). KNN is a classification algorithm that uses the distances between the embedded vectors to create clusters and classify the data. New data that is close to one cluster is incorporated into that cluster and the predicted label of the data is the label that is owned by the cluster.
  f. At a step 1820, the closest known model to the input model, or the nearest neighbor in embeddings (e.g., MyPlaneTemplate (T)), may be selected as a template for the input model. That is, if a template embedding is closest to the input model embedding in distance, the corresponding template may be considered as "matching" to the input model. In some embodiments, a template may correspond to a digital thread involving multiple digital models and atomic actions on digital artifacts. A comparison of an input digital model to such a template may be performed on a selected number of dimensions of the joint embedding space, possibly configured through the distance function. Similarly, a comparison of an input digital thread to such a template may be performed on a selected number of dimensions of the joint embedding space, possibly configured based on the user request and through the distance function. In various embodiments, the template selection process 1820 may be implemented using any supporting metric or tuning style as wished-distance in a vector database via embeddings, including but not limited to, Retrieval-Augmented-Generation (RAG), Low-Rank Adaption of LLMs (LoRA), and self-attention.
4. Template Update: In some embodiments, a generative pre-trained transformer (GPT) estimator at 1830 may estimate probabilities or relevance scores for components of the selected template, given the user request, and further construct a recommend template from such components, for example based on the input model's parameters (e.g. specified as M-A). The estimation produced by GPT may undergo evaluation using the mechanisms in step 5 next. While alternative methods are possible, GPT may optimize the process through instructive prompting. It tokenizes the input, performs matching with subwords or context using basic neural networks or directed acyclic graphs (DAG), or related syntax trees. GPT's advantage lies in its pre-existing context embeddings and potential fine-tuning, which simplify the task. Ultimately, the template engine 1880 may leverage the template created or updated by GPT 1830, employs the input model, and provides predictions for digital thread linking the input model to other models.
5. New Template Validation: At a step 1840, a newly generated set of model splices (e.g., input model data with newly generated splice functions) or digital threads (e.g., input model data with newly generally orchestration scripts) may be validated, for example against boundary conditions or boundary parameter values (e.g., expected thresholds).

a. For example, if a model splice is invalid, the process may repeat.
b. At a step 1842, attributes from validated model splices or orchestration scripts (e.g., MyValidatedTemplate (T-Valid)) may be further persisted (e.g., in the case of a set of wings or airfoils, an attribute can be a shape, referring to the 2D cross section of a wing. Another attribute can be a constraint, which includes the limitations imposed on the wing's shape based on learned "span" of parameters describing the airfoil), reviewed via GPT prompts, and stored in a local database 1850 as training data 1860 for further fine-tuning the embedding transformer at a step 1870.

6. Script Generation
    a. At a step 1844, if a model splice is valid, it may be added to a model splice template (e.g., T-Train) for generating new splice functions 1845 for the input data model. This template may be used in training a neural net or providing model scaffolding for use cases and some baseline requirements.
    b. At a step 1846, digital threads 1847 may be structured using template list interrelationships to complete the input digital task.

Compared with FIG. 16, there are two main process flows in FIG. 18: ML engine training and template creation (represented by arrow 1885, and as a specific implementation of 1608 and 1612), ML engine deployment and template update (represented by arrow 1886, and as a specific implementation of 1622 and 1624).

In yet another exemplary training and template creation process for splice function generation, the following steps may be performed:
1. Receive or retrieve a list of model-type files and valid associated splicers.
2. Create a database of all the similarities between all of those model-type files and their associated API scripts or splice function scripts (types).
3. Capture a template from those similarities, using the ML engine, specifying shared elements or properties.
4. Establish potential boundary conditions (e.g., parameter values) as the template is learned, e.g., a max weight, max thrust, etc.
5. Persist each training example to a vector database of several dimensions, corresponding to model types and other metadata on each subsequent layer.

The ML engine then understands a form of embedding specified by, for example, CADET or other digital model data embedding process. When a new user comes along and uploads a new model during deployment, there is already sufficient groundwork laid from past users and their manipulations of their models on the platform to propose a template with automatically generated splices.

In an exemplary deployment and template update process, the following steps may be performed:
1. A new model is uploaded by a user.
    a. This new input model is spliced and encoded into embedding vector(s).
    b. Assumption: the system may contain similarly labeled models already (e.g., model splice metadata that link to or identify model type, name, list of components/parts/subparts etc.). Text syntax comparison may be performed between labels of the uploaded model to a database of uploaded models. If no match, a new entry may be created in a table of digital model type files. A max likelihood estimation may then be applied to identify other similar model type files.
    c. There already exists a vector database of model type files for similarity matching on parts.
    d. Model type file embeddings process is done through a transformer model (e.g., CodeBERT) that can be fine-tuned on model splicer API scripts and the syntax and metadata in DE model type files.
2. The new model is ingested into an analyzer for comparison and similarity matching on parts
    a. Closeness to existing model database template entries in the vector database is determined.
    b. Based on similarity, labels are applied with some level of certainty.
3. A new model splice is generated: as existing models from previous experience have already been spliced and are associated with existing API script, orchestration scripts, API ends, etc., apply a similar structure to suggest, from matching model splice template(s), API scripts, orchestration scripts, API endpoints, etc., for inclusion in a new model splice.
    a. A user prompt may be used to decide if a suggested API script is to be included in the new model splice. Alternatively, the system may rely on AI-assistance to decide.
    b. A newly generated model splice may be validated and added to the vector database. This user-in-the-loop model splice then becomes training data for fine-tuning the transformers/GPT as discussed previously.

Exemplary Digital Model Characteristic Attributes

FIG. 19 shows exemplary digital model characteristic attributes for two different aircrafts, in accordance with some embodiments of the present invention. Specifically, the listings shown in FIG. 19 may be via model crawling and parsing as part of a model splicing process. FIG. 19 lists the JSON files of the two exemplary, existing model splices J-A and J-B of two different aircrafts in FIG. 18, according to some embodiments of the present invention. Comparing these two examples, similarities include components from fuselage to wings, but there are minute differences such as passengerCabin within the fuselage. That is, by examining the similarities in their parameters, the system may understand and learn that a template for an aircraft has at least a fuselage and wings. This example can be extended to other types of aircrafts, such as jets and Cessnas. Additionally, comparing such existing model splices enables the inferences of properties and physical constraints, or parameter values, that can be used as boundary conditions, for example, for wing length and fuselage length ratio. Such a boundary condition may be considered another learned element for template generation.

Exemplary View of a Live Document Associated with a Digital Thread

Figure 20:
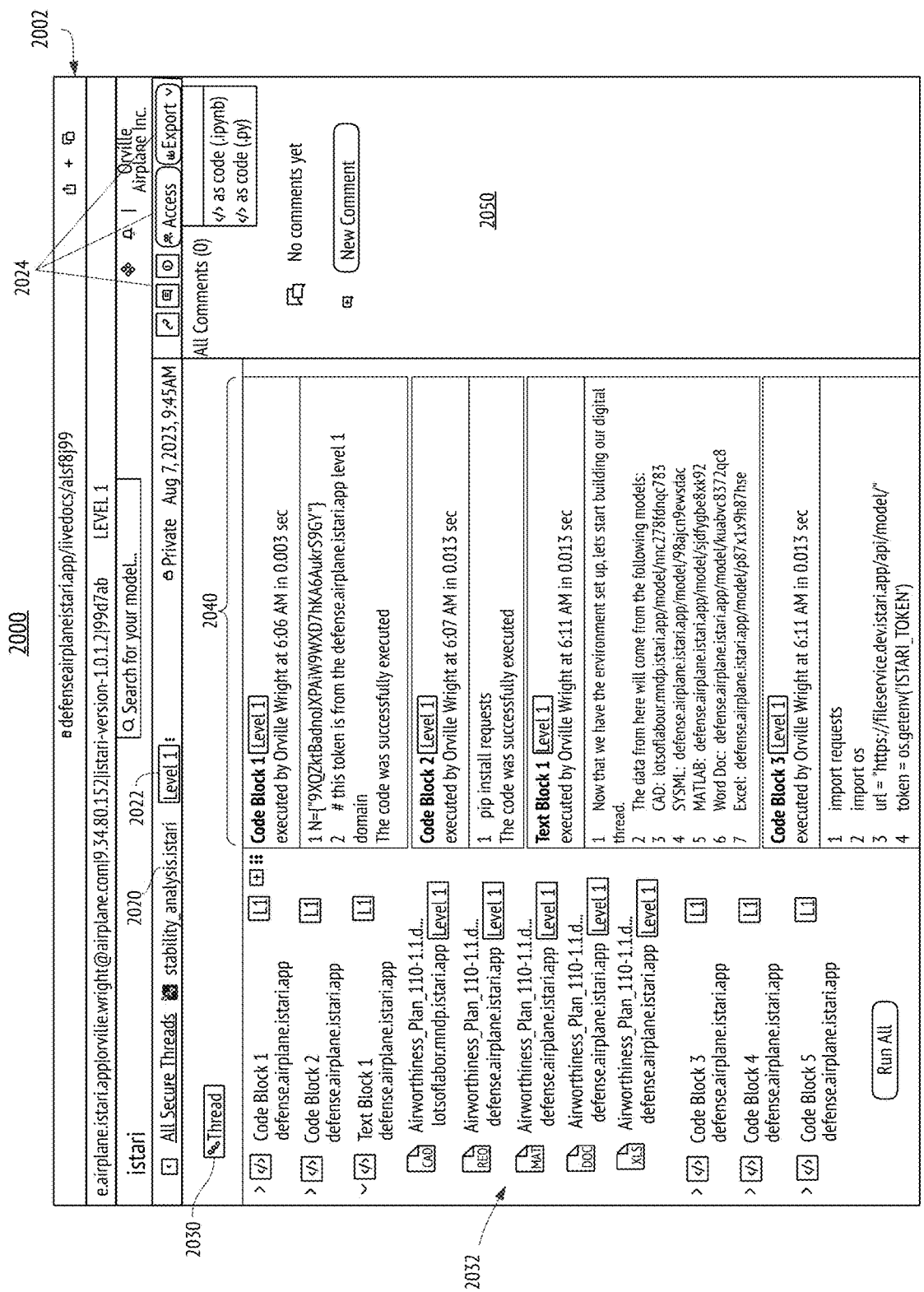
FIG. 20 shows a screenshot of a live document associated with a digital thread within the IDMP, in accordance with some embodiments of the present invention.

FIG. 20 shows a screenshot 2000 of a live document associated with a digital thread within the IDMP, in accordance with some embodiments of the present invention. In various embodiments, a software-code-defined digital thread may be associated with a companion live document or magic document that provides explainability for the digital thread and allows an audit trail for the digital thread itself. That is, the magic document is linked to a "model splice" of the digital thread, and reflects changes to and actions on the digital thread. This magic document may be generated with the help of AI or ML, elucidating the process through which the digital thread efficiently converts a user's intent into IDMP orchestration scripts that include relevant model splices, document splices, and splice functions. Specifically, a magic document associated with or accompanying a digital thread may explain how the digital thread implements a user intent, how the digital thread completes a digital task to achieve a specific objective, and may comprise pseudocode, scripts, data fields, natural language-based descriptions, and the like. When a digital thread script is executed to perform a digital task, the companion magic document may record the task completion for auditability. A digital thread script may comprise orchestration scripts in sequence. One or more corresponding magic documents for a digital thread may invoke a subset of data points and orchestration script examples as needed. In some embodiments, a script-generating ML model receiving as input pseudocode or detailed user instructions derived from a user's intent, may be trained on prior IDMP digital threads, models, documents, and optionally the IDMP platform API documentation. In addition to generating a digital thread (with orchestration scripts and comments), the script-generating ML model may also be configured to generate a magic doc that explains how the generated digital thread addresses the user intent.

In FIG. 20, a browser window header 2002 provides a document link for easy navigation. Correspondingly, a digital thread name field 2020 displays the associated digital thread's name, and may include its version. A digital thread security level indicator 2022 displays a security level (e.g., "Level 1") of the digital thread being accessed. In one embodiment, using an expandable security level menu adjacent to the digital thread security level indicator 2022, the user may select the digital thread's target security access level "view", thus filtering only the parts of the digital thread accessible through a given security level. In other embodiments, the user may use the digital thread security level indicator 2022 to down-select the security level while sharing the digital thread or an associated magic document for the digital thread, thus sharing portions of the digital thread that correspond to the specified security level. Only security access levels below the user's security level (e.g., "Level 1" in FIG. 20) would be available for the user to view and share. The user interface buttons 2024 include options to copy the digital thread link, open a comment section, access digital thread information, manage sharing access, and export the digital thread.

As discussed previously, digital threads are orchestration scripts that facilitate the selective exchange of data among documents and digital model files. A magic document associated with a digital thread records all the resources relevant to accomplishing a given digital task, including relevant sections of the orchestration script, relevant digital models and documents, as well as relevant context information and metadata.

For secure digital thread organization and navigation, the illustrative GUI of FIG. 20 features a digital thread outline viewer 2030 on the left, providing links to the digital thread's individual sections. At the center of FIG. 20, a section viewer 2040 displays the content of each secure digital thread section, including but not limited to, code blocks that may carry out individual subtasks within the orchestration script (e.g., Code Block 1), and text blocks that provide contextual and/or parametric information on linked DE models (e.g., Text Block 1). On the right of FIG. 20, a comment pane 2050 exhibits relevant comments from past viewers of the digital thread and the magic document, and may include functionalities for comment sharing and resolution.

Within section viewer 2040, exemplary code blocks are shown to list portions of the associated digital thread script and latest execution metadata including time stamps, user IDs, and execution status statements (e.g., "executed by Orville Wright at 6:06 am in 0.003 sec", "executed by Orville Wright at 6:07 AM in 0.013 sec", "The code was successfully executed"). A code block may be added to the magic document upon each user-requested execution of a portion of the digital thread. Similarly, an exemplary text block "Text Block 1" is also shown in FIG. 20, explaining, identifying, and listing DE models and documents that are interconnected by the underlying digital thread. Such a text block may be added to the magic document when a user uploads these digital models and documents, through manual selection or with AI-assistance in identifying relevant digital models and documents given an intended purpose for the digital thread. In FIG. 20, all blocks including code blocks and text blocks are ordered chronologically in execution time. In some embodiments, when a code section of the digital thread script is executed a second time, the magic document shown may include yet another corresponding code block, or update an existing code block with new execution metadata.

Within digital thread outline viewer 2030, a code or text block may be expanded in view. For example, expanded view 2032 of Text Block 1 shows linked digital models, related magic documents, and source IT domains, each tagged with an appropriate information security level (e.g., "L1" or "Level 1"). In some embodiments, the information security tag on a code block indicates a restriction on executing the code block. That is, a code block may only be run by an user entity with an equal or higher information security level. In some embodiments, the information security tag may indicate a viewing privilege, so the code block is only presented and viewable by an user entity with an equal or higher information security level.

In some embodiments, if sections of a secure digital thread contain content requiring a higher security level for viewing, the user may be presented with an option to request access. Were the user to request such access, an authorized user with access at a higher security level may be notified for their review. In other embodiments, if sections of a digital thread contain content requiring a higher security level for viewing, such sections may not be shown for display, nor will the user be provided with any prompt for requesting access.

An Exemplary Digital Thread Execution Graph for a User-Defined Digital Thread

Figure 21:
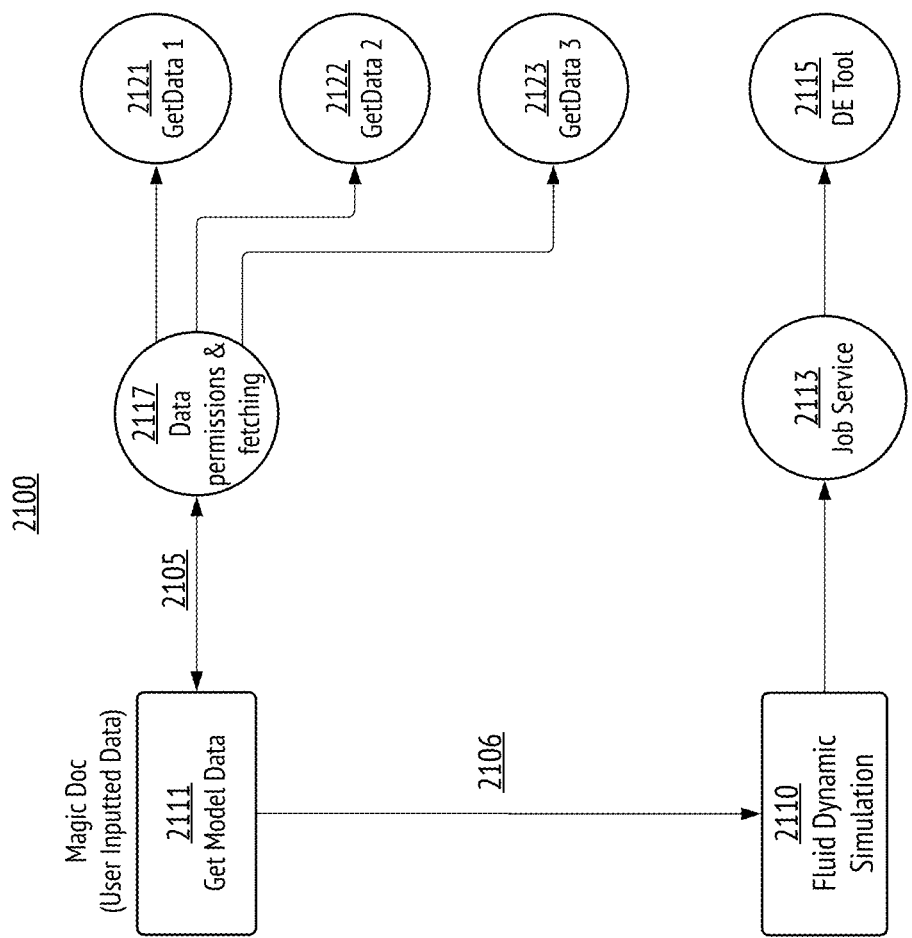
FIG. 21 shows an exemplary graph representation of an illustrative digital thread, in accordance with some embodiments of the present invention.

FIG. 21 shows an exemplary graph representation 2100 of an illustrative digital thread, in accordance with some embodiments of the present invention. In this example, a user defines or composes a digital thread through a magic document interface such as shown in FIG. 20. The IDMP may create a corresponding graph of operations 2100 consistent with the digital thread. This graph of operations 2100 may alternatively be called a digital thread computation graph, or a digital thread execution graph. Each node represents a function in the digital workflow, and edges represent corresponding data flows. That is, graph 2100 is a data structure that helps codify the digital thread, indicating where digital thread endpoints are in the model attribute or model splice space. When model data are extracted, they are represented as information flow through edges connecting the function nodes. In this example, the function nodes acknowledge that data was fetched from particular model splices retrieved from agents, sent to a fluid dynamic simulation model and serviced. End nodes 2121, 2122, and 2123 represent splice functions that retrieve specific data artifacts from input digital models provided via the magic document.

Recall from FIG. 10 that digital threads can be utilized as Directed Acyclic Graphs (DAGs) in practice. Thus, the bidirectional edge 2105 may be implemented iteratively in a DAG setup. The magic document and the digital thread 2111 may be used to create a DAG, which may then be used as part of the template engine training data. That is, the user in composing the digital thread via the magic doc, provides edge 2106 and endpoints 2121, 2122, and 2123 via a data fetching function 2117. These user-defined connections and end points help the IDMP and the ML engine learn that data like these are related to fluid dynamic simulations 2110 which utilizes DE tool 2115 via job service 2113. Consequently, the template engine within the ML engine may be trained and employed to predict a digital thread for a fluid dynamic simulation task.

Graph Transformer Training Data Collection

Figure 22:
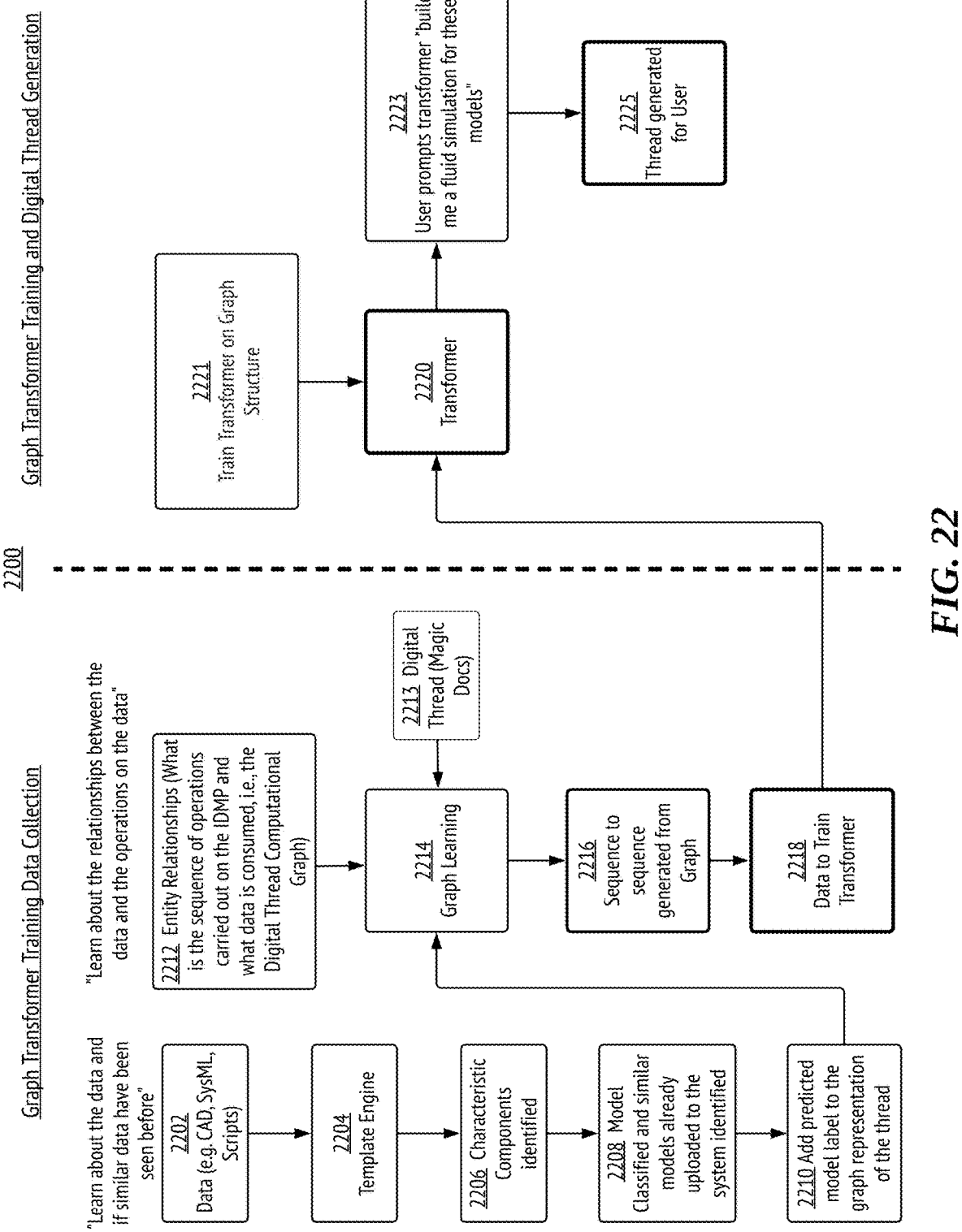
FIG. 22 shows an illustrative process for collecting training data for a graphical neural network that generates digital thread scripts, in accordance with some embodiments of the present invention.

FIG. 22 shows an illustrative process 2200 for collecting training data for a graphical neural network that generates digital thread scripts, in accordance with some embodiments of the present invention. On the left of FIG. 22 are exemplary process steps for graph transformer training data collection; on the right are exemplary process steps for graph transfer training and digital thread generation.

Specifically, given API documentation of existing tools on the IDMP, resource-capability mapping, and historical usage data of the IDMP, known model data 2202 from different types of digital models may be passed into the ML engine and processed through the template engine 2204, to "learn about the data and determine if similar data have been seen before." For a given digital model, characteristic attributes or characteristic components may be identified at a step 2206 and examined at a step 2208 to classify the model and identify similar models already uploaded to the system. For example, a clustering algorithm may be utilized. This predicted model label may then be added to a graph representation of a digital thread involving the digital model at a step 2210.

Moreover, given historical usage data of the IDMP, entity relationships 2212 may be identified to "learn about the relationships between the data and the operations on the data" at a step 2214. Graph representations of known digital threads may be created to produce operation sequences 2216. The graph representations of known digital threads becomes training data 2218 for a graph transformer 2220, which is trained at step 2221.

Similarly, a user-defined digital thread 2213 may contribute to this graph learning process, where a graph is generated with edges and nodes added depending on how the user composes the digital workflow. In the example shown in FIG. 21, the graph 2100 represents transitions from the model to the ultimate needed simulation function call. This graph representation also becomes an element of the training data 2218 for the graph transformer 2220. This continuous learning process with user-defined digital threads may be implemented with RAG or LoRA.

Once trained, graph transformer 2220 may be prompted at step 2223 to generate a digital thread 2225 for the use. For example, the user may prompt the transformer to "build a fluid simulation for input models A and B", and the graph transformer may generate a digital thread orchestration script to facilitate the fluid simulation.

Machine Learning (ML) and Neural Networks

Machine learning (ML) algorithms are characterized by the ability to improve their performance at a task over time without being explicitly programmed with the rules to perform that task (i.e., learn). An ML model is the output generated when a ML algorithm is trained on data. As described herein, embodiments of the present invention use one or more artificial intelligence (AI) and ML algorithms to perform template recommendation. Various exemplary ML algorithms are within the scope of the present invention. The following description describes illustrative ML techniques for implementing various embodiments of the present invention.

Neural Networks

Figure 23:
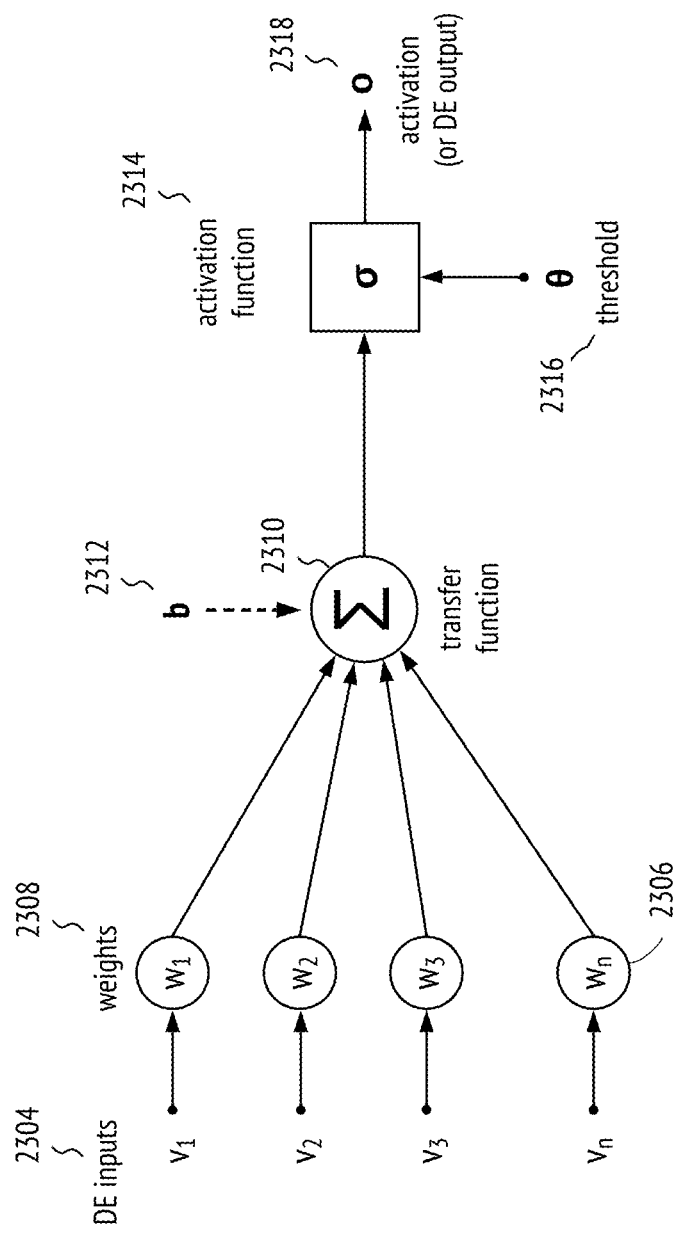
FIG. 23 describes neural network operation fundamentals, in accordance with some embodiments of the present invention.

A neural network is a computational model comprising interconnected units called "neurons" that work together to process information. It is a type of ML algorithm that is particularly effective for recognizing patterns and making predictions based on complex data. Neural networks are widely used in various applications such as image and speech recognition and natural language processing, due to their ability to learn from large amounts of data and improve their performance over time. FIG. 23 describes neural network operation fundamentals, according to exemplary embodiments of the present invention.

FIG. 23 shows a single-layered neural network, also known as a single-layer perceptron. The operation of a single-layered neural network involves the following steps:

1. Input: Receiving a DE input vector v 2304 with elements $v_j$, with $j \in [1, n]$ representing the $j^{th}$ DE input, and where each element of the vector corresponds to an element 2306 in the input layer. For an exemplary neural network model (e.g., to implement a script recommender engine) trained to determine whether a target template is to be recommended based on user input, the DE input vector v 2304 may take the form of a user prompt. A DE input can be a user prompt, a DE document, a DE model, DE program code, function script, digital thread orchestration script, system data from the IDMP, and/or any useful form of data in digital engineering.

2. Transfer Function: Multiplying each element of the DE input vector by a corresponding weight $w_j$ 2308. These weighted inputs are then summed together as the transfer function, yielding the net input to the activation function $E_{j=1}^{n} v_j \cdot w_j$ 2310.

Each neuron in a neural network may have a bias value 2312, which is added to the weighted sum of the inputs to that neuron. Both the weights and bias values are learned during the training process. The purpose of the bias is to provide every neuron with a trainable constant value that can help the model fit the data better. With biases, the net input to the activation function is $\Sigma_{j=1}^{n} \{v_j \cdot w_j\} + b$.

In the exemplary neural network model described above (e.g., to implement a script recommender engine), the value of the transfer function 2310 may represent the probability that the target template will be recommended.

3. Activation Function: Passing the net input through an activation function 2314. The activation function σ determines the activation value o 2318, which is the output of the neuron. It is typically a non-linear function such as a sigmoid or ReLU (Rectified Linear Unit) function. The threshold θ 2316 of the activation function is a value that determines whether a neuron is activated or not. In some activation functions, such as the step function, the threshold is a specific value. If the net input is above the threshold, the neuron outputs a constant value, and if it's below the threshold, it outputs a zero value. In other activation functions, such as the sigmoid or ReLU (Rectified Linear Unit) functions, the threshold is not a specific value but rather a point of transition in the function's curve.

In the exemplary neural network model described above (e.g., to implement a script recommender engine), the activation function σ 2314 may be a ReLU that is activated at a threshold θ 2316 representing the minimum probability for the target template to be recommended. Hence, the activation function 2314 will yield a positive recommendation when the recommendation likelihood exceeds the threshold θ 2316.

4. Output: The activation value o 2318 is the output of the activation function. This value is what gets passed on to the next layer in the network or becomes the final DE output in the case of the last layer. In the exemplary neural network model described above (e.g., to implement a script recommender engine), the activation value o 2318 is a DE output that is a boolean or binary parameter taking a positive value when the target template is to be recommended and a negative value otherwise. A DE output can be a DE document, a DE model, DE program code, or any useful form of data in digital engineering.

In the exemplary neural network discussions of FIG. 23, examples are provided with respect to a particular recommender engine implementation using neural networks. Analogous approaches can be used to implement any other NN-based components of the systems and subsystems described herein.

Figure 24:
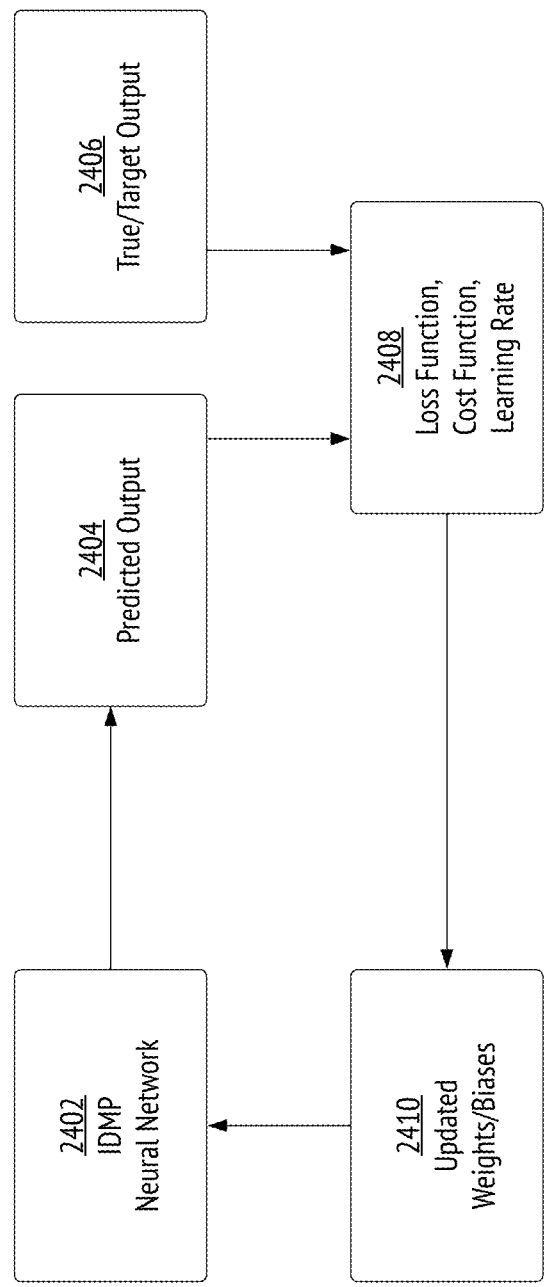
FIG. 24 shows an overview of an IDMP neural network training process, in accordance with some embodiments of the present invention.

FIG. 24 shows an overview of an IDMP neural network training process, according to exemplary embodiments of the present invention.

The training of the IDMP neural network involves repeatedly updating the weights and biases 2410 of the network to minimize the difference between the predicted output 2404 and the true or target output 2406, where the predicted output 2404 is the result produced by the network when a set of inputs from a dataset is passed through it. The predicted output 2404 of an IDMP neural network 2402 corresponds to the DE output 2318 of the final layer of the neural network. The true or target output 2406 is the true desired result. The difference between the predicted output and the true output is calculated using a loss function 2408, which quantifies the error made by the network in its predictions.

The loss function is a part of the cost function 2408, which is a measure of how well the network is performing over the whole dataset. The goal of training is to minimize the cost function 2408. This is achieved by iteratively adjusting the weights and biases 2410 of the network in the direction that leads to the steepest descent in the cost function. The size of these adjustments is determined by the learning rate 2408, a hyperparameter that controls how much the weights and biases change in each iteration. A smaller learning rate means smaller changes and a slower convergence towards the minimum of the cost function, while a larger learning rate means larger changes and a faster convergence, but with the risk of overshooting the minimum.

For an IDMP neural network model 2402 based on the exemplary neural network model (e.g., to implement a script recommender engine) discussed above in the context of FIG. 23, and trained to determine whether a target template is to be recommended based on user instructions:

the weights and biases 2410 are the IDMP neural network's hyperparameters that get updated at each iteration of the training process, as discussed in the context of FIG. 23, the predicted output 2404 is the binary prediction on whether the target template is to be recommended based on a sample user prompt, (or a normalized score ranking prioritizing the order of templates to be displayed to the user), the true/target output 2406 is the correct decision (i.e., sample ground truth output) on whether to recommend the target data based on the sample user prompt, the loss function 2408 is the difference between the evaluation and the true output (e.g., a binary error indicating whether the IDMP neural network's decision was correct), the cost function 2408 is the average of all errors over a training dataset including sample user prompts and corresponding binary recommendations on the target template, and the learning rate 2408 is the rate at which the cost function 2408 in consecutive training epochs approaches a pre-specified tolerable cost function.

Neural network training combines the processes of forward propagation and backpropagation. Forward propagation is the process where the input data is passed through the network from the input layer to the output layer. During forward propagation, the weights and biases of the network are used to calculate the output for a given input. Backpropagation, on the other hand, is the process used to update the weights and biases 2410 of the network based on the error (e.g., cost function) 2408 of the output. After forward propagation through the IDMP neural network 2402, the output 2404 of the network is compared with true output 2406, and the error 2408 is calculated. This error is then propagated back through the network, starting from the output layer and moving towards the input layer. The weights and biases 2410 are adjusted in a way that minimizes this error. This process is repeated for multiple iterations or epochs until the network is able to make accurate predictions.

The neural network training method described above, in which the network is trained on a labeled dataset (e.g., sample pairs of input user prompts and corresponding output recommendations), where the true outputs are known, is called supervised learning. In unsupervised learning, the network is trained on an unlabeled dataset, and the goal is to discover hidden patterns or structures in the data. The network is not provided with the true outputs, and the training is based on the intrinsic properties of the data. Furthermore, reinforcement learning is a type of learning where an agent learns to make decisions from the rewards or punishments it receives based on its actions. Although reinforcement learning does not typically rely on a pre-existing dataset, some forms of reinforcement learning can use a database of past actions, states, and rewards during the learning process. Any neural network training method that uses a labeled dataset is within the scope of the methods and systems described herein, as is clear from the overview below.

FIG. 24 describes a supervised learning process where training data are labeled with correct outputs. On the other hand, in unsupervised learning, which may be used to train the template engine 1880 in FIG. 18, input training data are unlabeled. Instead of comparing an output to a corresponding correct output, in unsupervised training, the ML algorithm, which may be a clustering method or contain an autoencoder, may be initialized with random parameters. During training, the model iteratively processes the training data, attempting to discover inherent patterns, structures, or representations without explicit guidance. The ML algorithm adjusts its internal parameters based on an objective function, such as minimizing reconstruction error or maximizing data likelihood, and the formation of data clusters or latent representations. As training progresses, the model refines its understanding of the data distribution, potentially identifying anomalies or outliers. The quality of the learned representations or clusters may be evaluated using intrinsic metrics or domain-specific criteria. Hyperparameters might be tuned to optimize performance, and the training process may be repeated with different initializations to ensure robust results. Upon completion, the trained model can be used for tasks such as data compression, feature learning, or as a foundation for downstream supervised learning tasks.

Figure 25:
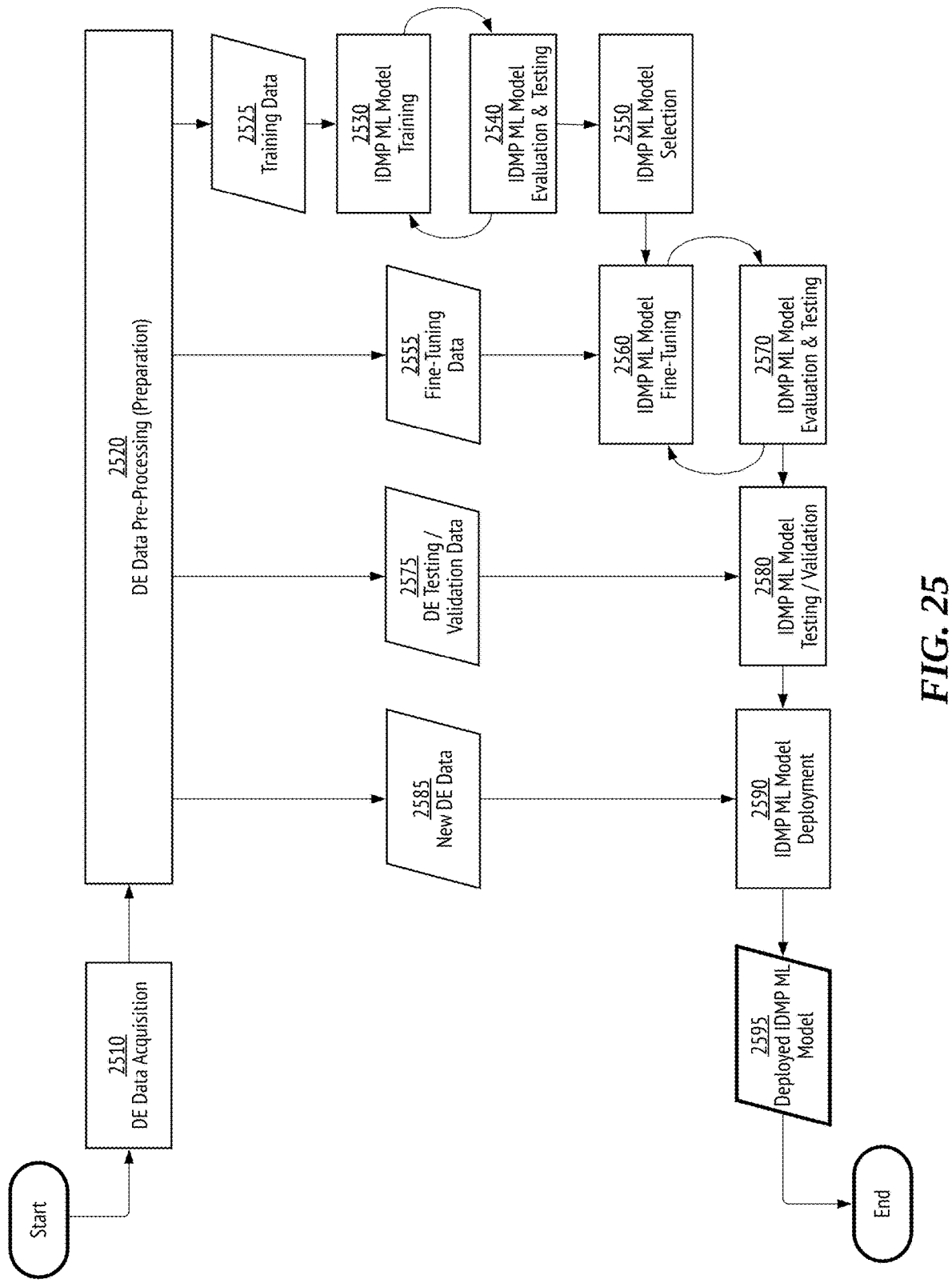
FIG. 25 is an illustrative flow diagram showing the different phases and datasets involved in training an IDMP machine learning model, in accordance with some embodiments of the present invention.

FIG. 25 provides additional details on the training process or an IDMP machine learning model, according to exemplary embodiments of the present invention.

Transformer Model Architecture

The transformer architecture is a neural network design that was introduced in the paper "Attention is All You Need" by Vaswani et al. published in June 2017 (available at https://arxiv.org/abs/1706.03762), and incorporated herein by reference as if fully set forth herein. Large Language Models (LLMs) heavily rely on the transformer architecture.

The architecture (see FIG. 1 in Vaswani et al.) is based on the concept of "attention", allowing the model to focus on different parts of the input sequence when producing an output. Transformers consist of an encoder and a decoder. The encoder processes the input data and the decoder generates the output. Each of these components is made up of multiple layers of self-attention and point-wise, fully connected layers.

The layers of self-attention in the transformer model allow it to weigh the relevance of different parts of the input sequence when generating an output, thereby enabling it to capture long-range dependencies in the data. On the other hand, the fully connected layers are used for transforming the output of the self-attention layers, adding complexity and depth to the model's learning capability.

The transformer model is known for its ability to handle long sequences of data, making it particularly effective for tasks such as machine translation and text summarization. In the transformer architecture, positional encoding is used to give the model information about the relative positions of the words in the input sequence. Since the model itself does not have any inherent sense of order or sequence, positional encoding is a way to inject some order information into the otherwise order-agnostic attention mechanism.

The Embeddings Vector Space

In the context of neural networks, tokenization refers to the process of converting the input and output spaces, such as natural language text or programming code, into discrete units or "tokens". This process allows the network to effectively process and understand the data, as it transforms complex structures into manageable, individual elements that the model can learn from and generate.

In the training of neural networks, embeddings serve as a form of distributed word representation that converts discrete categorical variables (i.e., tokens) into a continuous vector space (i.e., embedding vectors). This conversion process captures the semantic properties of tokens, enabling tokens with similar meanings to have similar embeddings. These embeddings provide a dense representation of tokens and their semantic relationships. Embeddings are typically represented as vectors, but may also be represented as matrices or tensors.

The input of a transformer typically requires conversion from an input space (e.g., the natural language token space) to an embeddings space. This process, referred to as "encoding", transforms discrete inputs (tokens) into continuous vector representations (embeddings). This conversion is a prerequisite for the transformer model to process the input data and understand the semantic relationships between tokens (e.g., words). Similarly, the output of a transformer typically requires conversion from the embeddings space to an output space (e.g., natural language tokens, programming code tokens, etc.), in a process referred to as "decoding". Therefore, the training of a neural network and its evaluation (i.e., its use upon deployment) both occur within the embeddings space.

In this document, the processes of tokenization, encoding, decoding, and de-tokenization may be assumed. In other words, the processes described below occur in the "embeddings space". Hence, while the tokenization and encoding of training data and input prompts may not be represented or discussed explicitly, they may nevertheless be implied. Similarly, the decoding and de-tokenization of neural network outputs may also be implied.

Training and Fine-Tuning Machine Learning (ML) Modules

FIG. 25 is an illustrative flow diagram showing the different phases and datasets involved in training an IDMP ML model, according to exemplary embodiments of the present invention.

The training process starts at step 2510 with DE data acquisition, retrieval, assimilation, or generation. At step 2520, acquired DE data are pre-processed, or prepared. At step 2530, the IDMP ML model is trained using training data 2525. At step 2540, the IDMP ML model is evaluated, validated, and tested, and further refinements to the IDMP ML model are fed back into step 2530 for additional training. Once its performance is acceptable, at step 2550, optimal IDMP ML parameters are selected.

Training data 2525 is a dataset containing multiple instances of system inputs (e.g., user inputs, user prompts, existing model splices, past digital thread usage history, etc.) and correct outcomes (e.g., templates, scripts, etc.). It trains the IDMP ML model to optimize the performance for a specific target task, such as the prediction of a specific splice function for a given digital model type. In FIG. 25, training data 2525 may also include subsets for validating and testing the IDMP ML model, as part of the training iterations 2530 and 2540. For an NN-based ML model, the quality of the output may depend on (a) NN architecture design and hyperparameter configurations, (b) NN coefficient or parameter optimization, and (c) quality of the training data set. These components may be refined and optimized using various methods. For example, training data 2525 may be expanded via a document database augmentation process.

In some embodiments, an additional fine-tuning 2560 phase including iterative fine-tuning 2560 and evaluation, validation, and testing 2570 steps, is carried out using fine-tuning data 2555. Fine-tuning in machine learning is a process that involves taking a selected 2550 pre-trained model and further adjusting or "tuning" its parameters to better suit a specific task or fine-tuning dataset 2555. This technique is particularly useful when dealing with deep learning models that have been trained on large, general training datasets 2525 and are intended to be applied to more specialized tasks or smaller datasets. The objective is to leverage the knowledge the model has already acquired during its initial training (often referred to as transfer learning) and refine it so that the model performs better on a more specific task at hand.

The fine-tuning process typically starts with a model that has already been trained on a large benchmark training dataset 2525, such as ImageNet (available at https://image-net.org/) for image recognition tasks. The model's existing weights, which have been learned from the original training, serve as the starting point. During fine-tuning, the model is trained further on a new fine-tuning dataset 2555, which may contain different classes or types of data than the original training set. This additional training phase allows the model to adjust its weights to better capture the characteristics of the new fine-tuning dataset 2555, thereby improving its performance on the specific task it is being fine-tuned for.

In some embodiments, additional test and validation 2580 phases are carried out using DE test and validation data 2575. Testing and validation of a ML model both refer to the process of evaluating the model's performance on a separate dataset 2575 that was not used during training, to ensure that it generalizes well to new unseen data. Validation of a ML model helps to prevent overfitting by ensuring that the model's performance generalizes beyond the training data.

While the validation phase is considered part of ML model development and may lead to further rounds of fine-tuning, the testing phase is the final evaluation of the model's performance after the model has been trained and validated. The testing phase provides an unbiased assessment of the final model's performance that reflects how well the model is expected to perform on unseen data, and is usually carried out after the model has been finalized to ensure the evaluation is unbiased.

Once the IDMP ML model is trained 2530, selected 2550, and optionally fine-tuned 2560 and validated/tested 2580, the process ends with the deployment 2590 of the IDMP ML model. Deployed IDMP ML models 2595 usually receive new DE data 2585 that was pre-processed 2580.

In machine learning, data pre-processing 2520 is tailored to the phase of model development. During model training 2530, pre-processing involves cleaning, normalizing, and transforming raw data into a format suitable for learning patterns. For fine-tuning 2560, pre-processing adapts the data to align with the distribution of the specific targeted task, ensuring the pre-trained model can effectively transfer its knowledge. Validation 2580 pre-processing mirrors that of training to accurately assess model generalization without leakage of information from the training set. Finally, in deployment 2590, pre-processing ensures real-world data matches the trained model's expectations, often involving dynamic adjustments to maintain consistency with the training and validation stages.

Machine Learning Algorithms

Various exemplary ML algorithms are within the scope of the present invention. Such machine learning algorithms include, but are not limited to, random forest, nearest neighbor, decision trees, support vector machines (SVM), Adaboost, gradient boosting, Bayesian networks, evolutionary algorithms, various neural networks (including deep learning networks (DLN), convolutional neural networks (CNN), and recurrent neural networks (RNN)), etc.

ML modules based on transformers and Large Language Models (LLMs) are particularly well suited for the tasks described herein. The online article "*Understanding Large Language Models—A Transformative Reading List*", by S. Raschka (posted Feb. 7, 2023, available at https://sebastianraschka.com/blog/2023/ll m-reading-list.html), describes various LLM architectures that are within the scope of the methods and systems described herein, and is hereby incorporated by reference in its entirety herein as if fully set forth herein.

The input to each of the listed ML modules is a feature vector comprising the input data described above for each ML module. The output of the ML module is a feature vector comprising the corresponding output data described above for each ML module.

Prior to deployment, each of the ML modules listed above may be trained on one or more respective sample input datasets and on one or more corresponding sample output datasets. The input and output training datasets may be generated from a database containing a history of input instances (e.g., digital models, scripts, and user data) and output instances (e.g., splice functions, digital threads), or may be generated synthetically by subject matter experts.

Exemplary System Architecture

An exemplary embodiment of the present disclosure may include one or more servers (management computing entities), one or more networks, and one or more clients (user computing entities). Each of these components, entities, devices, and systems (similar terms used herein interchangeably) may be cloud-based, and in direct or indirect communication with, for example, one another over the same or different wired or wireless networks. All of these devices, including servers, clients, and other computing entities or nodes may be run internally by a customer (in various architecture configurations including private cloud), internally by the provider of the IDMP (in various architecture configurations including private cloud), and/or on the public cloud.

Figure 26:
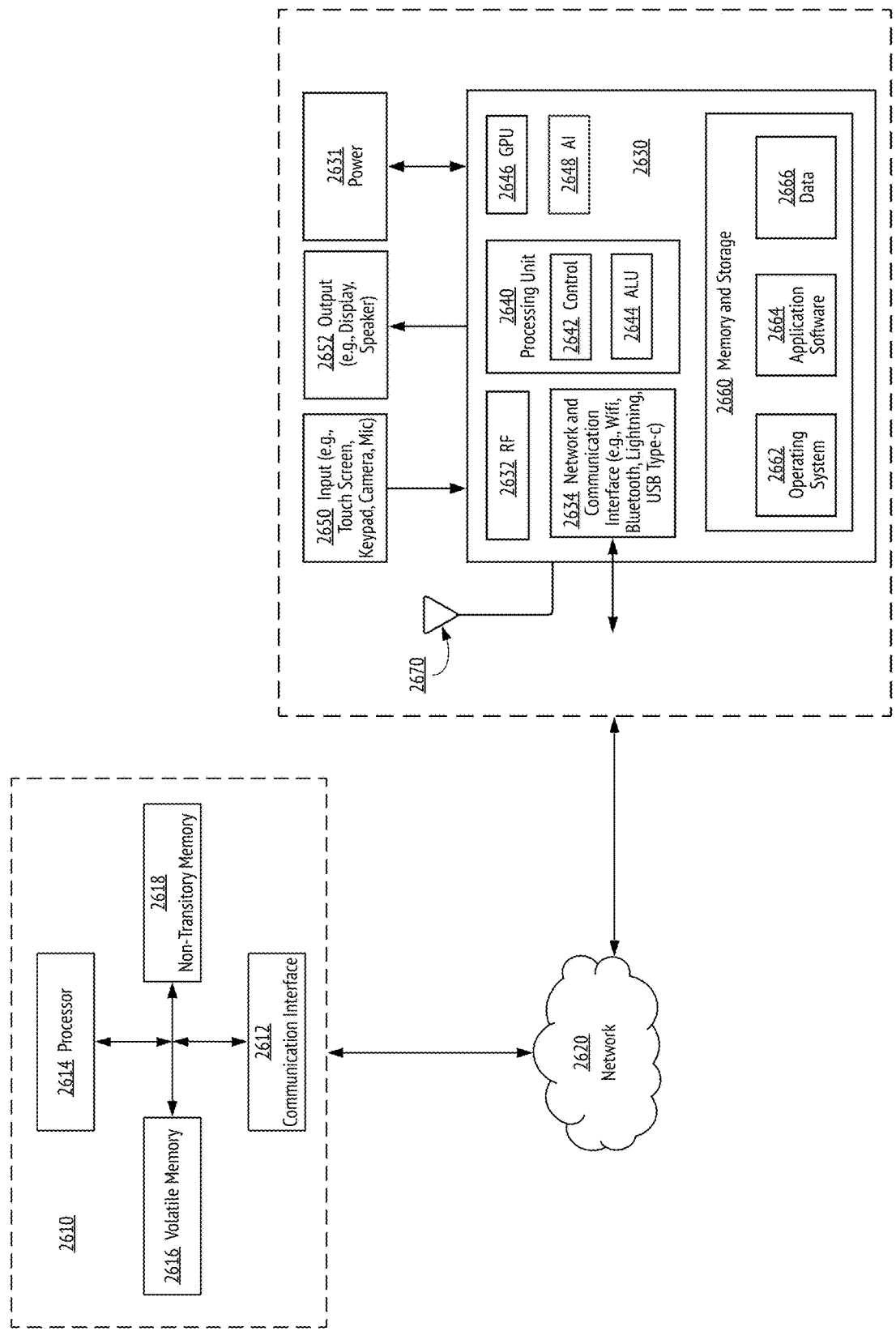
FIG. 26 provides illustrative schematics of a server (management computing entity) and a client (user computing entity) used for documentation within an IDMP, in accordance with some embodiments of the present invention.

FIG. 26 provides illustrative schematics of a server (management computing entity) 2610 connected via a network 2620 to a client (user computing entity) 2630 used for documentation within an IDMP, according to some embodiments of the present invention. While FIG. 26 illustrates the various system entities as separate, standalone entities, the various embodiments are not limited to this particular architecture. Additionally, the terms "client device", "client computing entity", "edge device", and "edge computing system" are equivalent and are used interchangeably herein.

Exemplary Management Computing Entity

An illustrative schematic is provided in FIG. 26 for a server or management computing entity 2610. In general, the terms computing entity, computer, entity, device, system, and/or similar words used herein interchangeably may refer to, for example, one or more cloud servers, computers, computing entities, desktop computers, mobile phones, tablets, phablets, notebooks, laptops, distributed systems, gaming consoles, watches, glasses, iBeacons, proximity beacons, key fobs, radio frequency identification (RFID) tags, earpieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, crawling, displaying, storing, determining, creating/generating, monitoring, evaluating, and/or comparing (similar terms used herein interchangeably). In one embodiment, these functions, operations, and/or processes can be performed on data, content, and/or information (similar terms used herein interchangeably), as they are used in a digital engineering process.

In one embodiment, management computing entity 2610 may be equipped with one or more communication interfaces 2612 for communicating with various computing entities, such as by exchanging data, content, and/or information (similar terms used herein interchangeably) that can be transmitted, received, operated on, processed, displayed, stored, and/or the like. For instance, management computing entity 2610 may communicate with one or more client computing devices such as 2630 and/or a variety of other computing entities. Network or communications interface 2612 may support various wired data transmission protocols including, but not limited to, Fiber Distributed Data Interface (FDDI), Digital Subscriber Line (DSL), Ethernet, Asynchronous Transfer Mode (ATM), frame relay, and data over cable service interface specification (DOCSIS). In addition, management computing entity 2610 may be capable of wireless communication with external networks, employing any of a range of standards and protocols, including but not limited to, general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High-Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

As shown in FIG. 26, in one embodiment, management computing entity 2610 may include or be in communication with one or more processors 2614 (also referred to as processors and/or processing circuitry, processing elements, and/or similar terms used herein interchangeably) that communicate with other elements within management computing entity 2610, for example, via a bus. As will be understood, processor 2614 may be embodied in a number of different ways. For example, processor 2614 may be embodied as one or more complex programmable logic devices (CPLDs), microprocessors, multi-core processors, co-processing entities, application-specific instruction-set processors (ASIPs), graphical processing units (GPUs), microcontrollers, and/or controllers. The term circuitry may refer to an entire hardware embodiment or a combination of hardware and computer program products. Thus, processor 2614 may be embodied as integrated circuits (ICs), application-specific integrated circuits (ASICs), field-programmable gate arrays (FPGAs), programmable logic arrays (PLAs), hardware accelerators, other circuitry, and/or the like. As will therefore be understood, processor 2614 may be configured for a particular use or configured to execute instructions stored in volatile or non-volatile (or non-transitory) media 2616 and 2618, or otherwise accessible to processor 2614. As such, whether configured by hardware or computer program products, or by a combination thereof, processor 2614 may be capable of performing steps or operations according to embodiments of the present disclosure when configured accordingly.

In one embodiment, management computing entity 2610 may further include or be in communication with non-transitory memory 2618 (also referred to as non-volatile media, non-volatile storage, non-transitory storage, physical storage media, memory, memory storage, and/or memory circuitry—similar terms used herein interchangeably). In one embodiment, the non-transitory memory or storage may include one or more non-transitory memory or storage media, including but not limited to hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. As will be recognized, the non-volatile (or non-transitory) storage or memory media may store cloud storage buckets, databases, database instances, database management systems, data, applications, programs, program modules, scripts, source code, object code, byte code, compiled code, interpreted code, machine code, executable instructions, and/or the like. The term database, database instance, and/or database management system (similar terms used herein interchangeably) may refer to a collection of records or data that is stored in a computer-readable storage medium using one or more database models, such as a hierarchical database model, network model, relational model, entity-relationship model, object model, document model, semantic model, graph model, and/or the like.

In one embodiment, management computing entity 2610 may further include or be in communication with volatile memory 2616 (also referred to as volatile storage, memory, memory storage, memory and/or circuitry—similar terms used herein interchangeably). In one embodiment, the volatile storage or memory may also include one or more volatile storage or memory media, including but not limited to RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, processor 2614. Thus, the cloud storage buckets, databases, database instances, database management systems, data, applications, programs, program modules, scripts, source code, object code, byte code, compiled code, interpreted code, machine code, executable instructions, and/or the like may be used to control certain aspects of the operation of management computing entity 2610 with the assistance of processor 2614 and an operating system.

Although not shown, management computing entity 2610 may include or be in communication with one or more input elements, such as a keyboard input, a mouse input, a touch screen/display input, motion input, movement input, audio input, pointing device input, joystick input, keypad input, and/or the like. Management computing entity 2610 may also include or be in communication with one or more output elements, also not shown, such as audio output, visual output, screen/display output, motion output, movement output, spatial computing output (e.g., virtual reality or augmented reality), and/or the like.

As will be appreciated, one or more of the components of management computing entity 2610 may be located remotely from other management computing entity components, such as in a distributed system. Furthermore, one or more of the components may be combined and additional components performing functions described herein may be included in management computing entity 2610. Thus, management computing entity 2610 can be adapted to accommodate a variety of needs and circumstances. As will be recognized, these architectures and descriptions are provided for exemplary purposes only and are not limited to the various embodiments.

Exemplary User Computing Entity

A user may be a human individual, a company, an organization, an entity, a department within an organization, a representative of an organization and/or person, an artificial user such as algorithms, artificial intelligence, or other software that interfaces, and/or the like. FIG. 26 further provides an illustrative schematic representation of a client user computing entity 2630 that may be used in conjunction with embodiments of the present disclosure. In various embodiments, computing device 2630 may be a general-purpose computing device with dedicated modules for performing digital engineering-related tasks. It may alternatively be implemented in the cloud, with logically and/or physically distributed architectures.

As shown in FIG. 26, user computing entity 2630 may include a power source 2631, an antenna 2670, a radio transceiver 2632, a network and communication interface 2634, and a processor unit 2640 that provides signals to and receives signals from the network and communication interface. The signals provided to and received may include signaling information in accordance with air interface standards of applicable wireless systems. In this regard, user computing entity 2630 may be capable of operating with one or more air interface standards, communication protocols, modulation types, and access types. More particularly, user computing entity 2630 may operate in accordance with any of a number of wireless communication standards and protocols, such as those described above with regard to management computing entity 2610. Similarly, user computing entity 2630 may operate in accordance with multiple wired communication standards and protocols, such as those described above with regard to management computing entity 2610.

Via these communication standards and protocols, user computing entity 2630 may communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). User computing entity 2630 may also download changes, add-ons, and updates, for instance, to its firmware, software (e.g., including executable instructions, applications, program modules), and operating system.

In some implementations, processing unit 2640 may be embodied in several different ways. For example, processing unit 2640 may be embodied as one or more complex programmable logic devices (CPLDs), microprocessors, multi-core processors, co-processing entities, application-specific instruction-set processors (ASIPs), graphical processing units (GPUs), microcontrollers, and/or controllers. Further, processing unit 2640 may be embodied as one or more other processing devices or circuitry. The term circuitry may refer to an entirely hardware embodiment or a combination of hardware and computer program products. Thus, processing unit 2640 may be embodied as integrated circuits, application specific integrated circuits (ASICs), field programmable gate arrays (FPGAs), programmable logic arrays (PLAs), hardware accelerators, other circuitry, and/or the like. As will therefore be understood, processing unit 2640 may be configured for a particular use or configured to execute instructions stored in volatile or non-volatile media or otherwise accessible to the processing unit. As such, whether configured by hardware or computer program products, or by a combination thereof, processing unit 2640 may be capable of performing steps or operations according to embodiments of the present invention when configured accordingly.

In some embodiments, processing unit 2640 may comprise a control unit 2642 and a dedicated arithmetic logic unit (ALU) 2644 to perform arithmetic and logic operations. In some embodiments, user computing entity 2630 may comprise a graphics processing unit (GPU) 2646 for specialized parallel processing tasks, and/or an artificial intelligence (AI) module or accelerator 2648, also specialized for applications including artificial neural networks and machine learning. In some embodiments, processing unit 2640 may be coupled with GPU 2646 and/or AI accelerator 2648 to distribute and coordinate digital engineering related tasks.

In some embodiments, computing entity 2630 may include a user interface, comprising an input interface 2650 and an output interface 2652, each coupled to processing unit 2640. User input interface 2650 may comprise any of a number of devices or interfaces allowing computing entity 2630 to receive data, such as a keypad (hard or soft), a touch display, a mic/speaker for voice/speech/conversation, a camera for motion or posture interfaces, and appropriate sensors for spatial computing interfaces. User output interface 2652 may comprise any of a number of devices or interfaces allowing computing entity 2630 to provide information to a user, such as through the touch display, or a speaker for audio outputs. In some embodiments, output interface 2652 may connect computing entity 2630 to an external loudspeaker or projector, for audio and/or visual output. In some embodiments, user interfaces 2650 and 2652 integrate multimodal data in an interface that caters to human users. Some examples of human interfaces include a dashboard-style interface, a workflow-based interface, conversational interfaces, and spatial-computing interfaces. As shown in FIG. 5, computing entity 2630 may also support bot/algorithmic interfaces such as code interfaces, text-based API interfaces, and the like.

User computing entity 2630 can also include volatile and/or non-volatile storage or memory 2660, which can be embedded and/or may be removable. For example, the non-volatile or non-transitory memory may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile (or non-transitory) storage or memory 2660 may store an operating system 2662, application software 2664, data 2666, databases, database instances, database management systems, data, applications, programs, program modules, scripts, source code, object code, byte code, compiled code, interpreted code, machine code, executable instructions, and/or the like to implement functions of user computing entity 2630. As indicated, this may include a user application that is resident on the entity or accessible through a browser or other user interface for communicating with management computing entity 2610 and/or various other computing entities.

In some embodiments, user computing entity 2630 may include one or more components or functionalities that are the same or similar to those of management computing entity 2610, as described in greater detail above. As will be recognized, these architectures and descriptions are provided for exemplary purposes only and are not limited to the various embodiments.

In some embodiments, computing entities 2610 and/or 2630 may communicate to external devices like other computing devices and/or access points to receive information such as software or firmware, or to send information from the memory of the computing entity to external systems or devices such as servers, computers, smartphones, and the like.

In some embodiments, two or more computing entities such as 2610 and/or 2630 may establish connections using a network such as 2620 utilizing any of the networking protocols listed previously. In some embodiments, the computing entities may use network interfaces such as 2612 and 2634 to communicate with each other, such as by communicating data, content, information, and/or similar terms used herein interchangeably that can be transmitted, received, operated on, processed, displayed, stored, and/or the like.

Additional Hardware & Software Implementation Details

Although an example processing system has been described above, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The terms "processor", "computer," "data processing apparatus", and the like encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, code, program code, and the like) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read only memory or a random-access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a backend component, e.g., as an information/data server, or that includes a middleware component, e.g., an application server, or that includes a frontend component, e.g., a client computer having a graphical user interface or a web browser through which a user can interact with an implementation of the subject matter described herein, or any combination of one or more such back end, middleware, or front end components. The components of the system can be interconnected by any form or medium of digital information/ data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship with each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any embodiment or of what may be claimed, but rather as descriptions of features specific to particular embodiments. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

In some embodiments of the present invention, the entire system can be implemented and offered to the end-users and operators over the Internet, in a so-called cloud implementation. No local installation of software or hardware would be needed, and the end-users and operators would be allowed access to the systems of the present invention directly over the Internet, using either a web browser or similar software on a client, which client could be a desktop, laptop, mobile device, and so on. This eliminates any need for custom software installation on the client side and increases the flexibility of delivery of the service (software-as-a-service), and increases user satisfaction and ease of use. Various business models, revenue models, and delivery mechanisms for the present invention are envisioned, and are all to be considered within the scope of the present invention.

In general, the method executed to implement the embodiments of the invention, may be implemented as part of an operating system or a specific application, component, program, object, module, or sequence of instructions referred to as "program code," "computer program(s)", "computer code(s)," and the like. The computer programs typically comprise one or more instructions set at various times in various memory and storage devices in a computer, and that, when read and executed by one or more processors in a computer, cause the computer to perform operations necessary to execute elements involving the various aspects of the invention. Moreover, while the invention has been described in the context of fully functioning computers and computer systems, those skilled in the art will appreciate that the various embodiments of the invention are capable of being distributed as a program product in a variety of forms, and that the invention applies equally regardless of the particular type of machine or computer-readable media used to actually affect the distribution. Examples of computer-readable media include but are not limited to recordable type media such as volatile and non-volatile (or non-transitory) memory devices, floppy and other removable disks, hard disk drives, optical disks, which include Compact Disk Read-Only Memory (CD ROMS), Digital Versatile Disks (DVDs), etc., as well as digital and analog communication media.

Terminology

Some illustrative terminologies used with the IDMP are provided below to assist in understanding the present invention, but these are not to be read as restricting the scope of the present invention. The terms may be used in the form of nouns, verbs, or adjectives, within the scope of the definition.

Digital engineering (DE): According to the Defense Acquisition University (DAU) and the Department of Defense (DOD) Digital Engineering Strategy published in 2018, digital engineering is "an integrated digital approach to systems engineering, using authoritative sources of systems' data and models as a continuum across disciplines to support lifecycle activities from concept through disposal." Digital engineering incorporates digital technological innovations into an integrated, model-based approach that empowers a paradigm shift from the traditional design-build-test methodology of systems engineering to a new model-analyze-build methodology, thus enabling systems design, prototyping, and testing all in a virtual environment.

DE data: Digital engineering (DE) data comprises project management, program management, product management, design review, and/or engineering data.

DE data field: A data field for DE data, for example, in a DE document template.

Phases: The stages within a DE product lifecycle, including but not limited to, stakeholder analysis, concept studies, requirements definition, preliminary design and technology review, system modeling, final design, implementation, system assembly and integration, prototyping, verification and validation on system, subsystem, and component levels, and operations and maintenance.

DE model, also referred to as a "digital model": A computer-generated model that represents characteristics or behaviors of a complex product or system. A DE model can be created or modified using a DE tool, and a DE model may be represented by one or more DE model files. A DE model file is the computer model file created or modified using the DE tool. In the present disclosure, the terms "digital model", "DE model" and "DE model file" may be used interchangeably, as the context requires. A DE model within the IDEP as disclosed herein refers to any digital file uploaded onto the platform, including documents that are appropriately interpreted, as defined below. For example, a computer-aided design (CAD) file, a Systems Modeling Language (SysML) file, a Systems Requirements Document (SDR) text file, and a Neural Network Model JSON file may each be considered a DE model, in various embodiments of the present invention. A DE model may be machine-readable only, may be human-readable as well but written in programming codes, or may be human-readable and written in natural language-based texts. For example, a word-processing document comprising a technical specification of a product, or a spreadsheet file comprising technical data about a product, may also be considered a DE model.

Digital Model: A computer-generated model that represents characteristics or behaviors of a complex product, system, or process. Digital models include DE models but are not limited to the field of digital engineering. For example, digital models include medical model files used to build digital twins of patients (e.g., digital patients), such as clinical documentation, laboratory results, physiological test results, psychological test results, patient communications and reports, patient medical data, health records, remote monitoring data, and the like. Digital models also include the financial models used to build digital twins of financial assets, such as enterprise data, business financial data, process data (e.g., manufacturing, logistics, sales, supply chain), research results, etc. Other examples of digital models are also within the scope of the present invention, for example, scientific models, geophysical models, climate models, biological models, biochemical models, chemical models, drug models, petrochemical models, oceanographic models, business process models, management science models, economic models, econometric models, sociological models, population dynamics models, socioeconomic models, planetary science models, mining models, mineral models, metallurgical models, supply chain logistics models, manufacturing models, and so on. Digital models include one or more digital artifacts, where each digital artifact is accessible with a security network. A model file can be created or modified using a software tool. A model file within the Interconnected Digital Model Platform (IDMP) as disclosed herein refers to any digital file uploaded onto the platform. All the terms and concepts defined above and included herein, including model splicing, model splices, and software-defined digital threads, apply in the context of the digital model and within the context of the IDMP.

Interconnected Digital Engineering Platform (IDEP), also referred to as a "Digital Engineering and Certification Ecosystem": According to the DAU, a "DE ecosystem" is the "interconnected infrastructure, environment, and methodology (process, methods, and tools) used to store, access, analyze, and visualize evolving systems' data and models to address the needs of the stakeholders." Embodiments of the IDEP as disclosed herein comprise software platforms running on hardware to realize the aforementioned capabilities under zero-trust principles. A DE and certification ecosystem performs verification and validation tasks, defined next. An IDEP is a type of Interconnected Digital Model Platform (IDMP), defined below. In general, any reference to an IDEP in the specification and drawings can be considered equivalent to a reference to an IDMP, and vice versa.

Interconnected Digital Model Platform (IDMP): Embodiments of the IDMP as disclosed herein include interconnected infrastructure, environment, and methodology (process, methods, and tools) used to store, access, analyze, visualize, and modify data and digital models associated with a product or system. In some embodiments, IDMPs include software platforms running on hardware to realize the aforementioned capabilities under zero-trust principles. Specifically, an embodiment of the IDMP is a software platform that interconnects a plurality of spliced model files through one or more software-defined digital threads.

Verification: According to the DAU, verification "confirms that a system element meets design-to or build-to specifications. Through the system's life cycle, design solutions at all levels of the physical architecture are verified through a cost-effective combination of analysis, examination, demonstration, and testing." Verification refers to evaluating whether a product, service, or system meets specified requirements and is fit for its intended purpose, checking externally against customer or stakeholder needs. For example, in the aerospace industry, a verification process may include testing an aircraft component to ensure it can withstand the forces and conditions it will encounter during flight.

Validation: According to the DAU, validation is "1) the review and approval of capability requirement documents by a designated validation authority. 2) The process by which the contractor (or as otherwise directed by the DoD component procuring activity) tests a publication/technical manual for technical accuracy and adequacy. 3) The process of evaluating a system or software component during, or at the end of, the development process to determine whether it satisfies specified requirements." Thus, validation refers to evaluating whether the overall performance of a product, service, or system is suitable for its intended use, including its compliance with regulatory requirements, and its ability to meet the needs of its intended users, checking internally against specifications and regulations. For example, for an industrial product manufacturing, a validation process may include consumer surveys that inform product design, modeling and simulations for validating the design, prototype testing for failure limits and feedback surveys from buyers.

Common Verification & Validation (V&V) products: Regulatory and certification standards, compliances, calculations, and tests (e.g., for the development, testing, and certification of products and/or solutions) are referred to herein as "common V&V products."

DE tool: A tool or DE tool is a DE application software (e.g., a CAD software), computer program, and/or script that creates or manipulates a DE model during at least one stage or phase of a product lifecycle. A DE tool may comprise multiple functions or methods.

Application Programming Interface (API): A software interface that provides programmatic access to services by a software program, thus allowing application software to exchange data and communicate with each other using standardized requests and responses. It allows different programs to work together without revealing the internal details of how each works. A DE tool is typically provided with an API library for code-interface access.

Script: A sequence of instructions that is interpreted and run within or carried out by another program, without compilation into a binary file to be run by itself through a computer processor without the support of other programs.

API scripts: Scripts that implement particular functions available via the IDEP as disclosed herein. An API script may be an API function script encapsulated in a model splice, or an "digital thread orchestration script," "orchestration script," "digital thread script," or "platform script," that orchestrates a workflow through a digital thread built upon interconnected model splices.

Platform API or ISTARI API: A library of API scripts available on the IDEP as disclosed herein.

API function scripts, "splice functions," "splice methods," "ISTARI functions," or "function nodes": A type of API scripts. When executed, an API function script inputs into or outputs from a DE model or DE model splice. An "input" function, input method, or "input node" allows updates or modifications to an input DE model. An "output" function, output method, or "output node" allows data extraction or derivation from an input DE model via its model splice. An API function script may invoke native API function calls of native DE tools, where the terms "native" and "primal" may refer to existing DE model files, functions, and API libraries associated with specific third-party DE tools, including both proprietary and open-source ones.

Endpoints: an endpoint in the context of software and networking is a specific digital location or destination where different software systems communicate with each other. It enables external systems to access the features or data of an application, operating system, or other services. An API endpoint is the point of interaction where APIs receive requests and return data in response. A software development kit (SDK) endpoint or SDK-defined endpoint similarly provides a service handle for use with an SDK. References to API endpoints in the present disclosure are equally applicable to SDK endpoints.

Artifact: According to the DAU, a digital artifact is "an artifact produced within, or generated from, a DE ecosystem" to "provide data for alternative views to visualize, communicate, and deliver data, information, and knowledge to stakeholders." In the present disclosure, a "digital artifact" or "artifact" is an execution result from an output API function script within a model splice. Multiple artifacts may be generated from a single DE model or DE model splice.

Model splice: Within the present disclosure, a "model splice", "model wrapper", or "model graft" of a given DE model file comprises locators to or copies of (1) DE model data or digital artifacts extracted or derived from the DE model file, including model metadata, and (2) splice functions (e.g., API function scripts) that can be applied to the DE model data. The splice functions provide unified and standardized input and output API endpoints for accessing and manipulating the DE model data. The DE model data are model-type-specific, and a model splice is associated with model-type-specific input and output schemas. One or more different model splices may be generated from the same input DE model file(s), based on the particular user application under consideration, and depending on data access restrictions. In some contexts, the shorter terms "splice", "wrapper", and/or "graft" are used to refer to spliced, wrapped, and/or grafted DE models.

Model representation: Within the present disclosure, "model representation" of a given DE model includes any embodiment of the engineering model in the form of DE model file(s), model splices, or collections of digital artifacts derived from the DE model. In some embodiments, a DE model representation comprises model-type-specific locators to DE model data and metadata, potentially including standardized input and output API endpoints for accessing and manipulating the DE model data. Discussions related to the usage of model splices in the present disclosure are applicable to any other forms of model representation as well.

Model splicing or DE model splicing: A process for generating a model splice from a DE model file. DE model splicing encompasses human-readable document model splicing, where the DE model being spliced is a human-readable text-based document.

Model splicer: Program code or script (uncompiled) that performs model splicing of DE models. A DE model splicer for a given DE model type, when applied to a specific DE model file of the DE model type, retrieves, extracts, or derives DE model data associated with the DE model file, generates and/or encapsulates splice functions and instantiates API endpoints according to input/output schemas.

Model splice linking: Generally refers to jointly accessing two or more DE model splices via API endpoints or splice functions. For example, data may be retrieved from one splice to update another splice (e.g., an input splice function of a first model splice calls upon an output splice function of a second model splice); data may be retrieved from both splices to generate a new output (e.g., output splice functions from both model splices are called upon); data from a third splice may be used to update both a first and a second splice (e.g., input splice functions from both model splices are called upon). In the present disclosure, "model linking" and "model splice linking" may be used interchangeably, as linked model splices map to correspondingly linked DE models.

Digital thread, Software-defined digital thread, Software-code-defined digital thread, or Software digital thread: According to the DAU, a digital thread is "an extensive, configurable and component enterprise-level analytical framework that seamlessly expedites the controlled interplay of authoritative technical data, software, information, and knowledge in the enterprise data-information-knowledge systems, based on the digital system model template, to inform decision makers throughout a system's lifecycle by providing the capability to access, integrate, and transform disparate data into actionable information." Within the IDEP as disclosed herein, a digital thread is a platform script that calls upon the platform API to facilitate, manage, or orchestrate a workflow through linked model splices to provide the aforementioned capabilities. That is, a digital thread within the IDEP is a computer-executable script that connects data from one or more DE models, data sources, or physical artifacts to accomplish a specific mission or business objective, and may be termed a "software-defined digital thread" or "software digital thread" that implements a communication framework or data-driven architecture that connects traditionally siloed DE models to enable seamless information flow among the DE models via model splices. In various embodiments, a digital thread associated with a digital twin is configured to execute a scripted workflow associated with the digital twin.

Tool linking: Similar to model splice linking, tool linking generally refers to jointly accessing two or more DE tools via model splices, where model splice functions that encapsulate disparate DE tool functions are called upon jointly to perform a DE task.

Zero-trust security: An information security principle based on the assumption of no implicit trust between any elements, agents, or users. Zero trust may be carried out by implementing systematic mutual authentication and least privileged access, typically through strict access control, algorithmic impartiality, and data isolation. Within the IDEP as disclosed herein, least privileged access through strict access control and data isolation may be implemented via model splicing and the IDEP system architecture.

Zero-knowledge approach: A zero-knowledge approach in data operations refers to a method where computational processes and data analyses are conducted such that the underlying data remains completely confidential and undisclosed to the parties performing the operations. This technique enables the validation, aggregation, and processing of data without exposing the actual data content, thereby preserving privacy and confidentiality.

Hyperscale capabilities: The ability of a system architecture to scale adequately when faced with massive demand.

IDEP enclave or DE platform enclave: A central command hub responsible for the management and functioning of DE platform operations. An enclave is an independent set of cloud resources that are partitioned to be accessed by a single customer (i.e., single-tenant) or market (i.e., multi-tenant) that does not take dependencies on resources in other enclaves.

IDEP exclave or DE platform exclave: A secondary hub situated within a customer environment to assist with customer DE tasks and operations. An exclave is a set of cloud resources outside enclaves managed by the IDEP, to perform work for individual customers. Examples of exclaves include virtual machines (VMs) and/or servers that the IDEP maintains to run DE tools for customers who may need such services.

Digital twin: According to the DAU, a digital twin is "a virtual replica of a physical entity that is synchronized across time. Digital twins exist to replicate configuration, performance, or history of a system. Two primary sub-categories of digital twin are digital instance and digital prototype." A digital instance is "a virtual replica of the physical configuration of an existing entity; a digital instance typically exists to replicate each individual configuration of a product as-built or as-maintained." A digital prototype is "an integrated multi-physical, multiscale, probabilistic model of a system design; a digital prototype may use sensor information and input data to simulate the performance of its corresponding physical twin; a digital prototype may exist prior to realization of its physical counterpart." Thus, a digital twin is a real-time virtual replica of a physical object or system, with bi-directional information flow between the virtual and physical domains. In some embodiments, a digital twin is a digital replica configured to run in a virtual environment and instantiated through a scripted digital thread, where the digital thread accesses data (e.g., digital artifacts) from a set of digital models through splicing. A digital twin may be instantiated, run, or executed, through a digital thread. Updating a digital twin may include the actions of modifying, deleting, and/or adding data to its twin configuration, to an associated digital thread, or to an associated digital model associated with the updated digital twin. In one embodiment, digital twins may be ephemeral and may have in-built time and space restrictions (see "twin configuration" definition below). In various embodiments, a physical twin is a physical object instantiated in a physical environment based on a set of model files through an MBSE manufacturing and/or prototyping process. In various embodiments, digital twins can be created for both physical products and physical processes. They are not limited to tangible items like machinery or vehicles; they can also simulate complex physical processes, such as manufacturing workflows or supply chain logistics, to improve efficiency and predict outcomes. This flexibility allows digital twins to be applied across various industries and scenarios.

Authoritative twin: A reference design configuration at a given stage of a product life cycle. At the design stage, an authoritative twin is the twin configuration that represents the best design target. At the operational stage, an authoritative twin is the twin configuration that best responds to the actual conditions on the ground or "ground-truths".

Admins or Administrators: Project managers or other authorized users. Admins may create templates in the documentation system and have high-level permissions to manage settings in the IDEP.

Requesters: Users who use the platform for the implementation of the modeling and simulations towards certification and other purposes, and who may generate documentation in the digital documentation system, but do not have admin privileges to alter the required templates, document formats, or other system settings.

Reviewers/Approvers: Users who review and/or approve templates, documents, or other system data.

Contributors: Users who provide comments or otherwise contribute to the IDEP.

AI Agent or Tool Agent: a software entity or module that takes instructions from the enclave and acts on behalf of a user or another program to perform specific tasks or operations related to an AI model or a DE tool. An AI agent or a tool agent may be designed as part of the IDMP but deployed by a customer within a secured customer environment to interface in-between the IDMP, AI models, and/or proprietary tools the customer is licensed for. Inside the customer environment, modular agents interact directly with the domain-specific tools and models to allow for bi-directional data flow across distributed tools.

Security Network: A set of networked resources having identical access control restrictions (e.g., a security level), where each networked resource provides access to one or more digital model files. Information security networks are security networks that are configured to maintain the confidentiality, integrity, and availability of digital information (e.g., digital model data) through cybersecurity measures such as encryption, firewalls, intrusion detection systems, and access controls.

External Feedback: In various embodiments, external feedback comprises feedback data from at least one source external to a given digital twin, including digital twin performance data as received, analyzed or processed by the IDMP. External feedback may also include physical twin performance data, data from a virtual sensor, data from a physical sensor, user input (e.g., a user prompt, or a user response over a GUI), data from a simulation, a product certification file, or a product requirements file. In some embodiments, external feedback may also include feedback from control algorithms or processes in the IDMP that track digital twin performance (e.g., tracking error levels and/or tolerance between digital and corresponding physical twin data). External feedback data can also include feedback data that is external to the IDMP.

Workflow: A workflow typically representing an entire process or sequence of operations that achieves a specific goal or outcome. It encompasses the complete set of activities, from initiation to completion, that are required to fulfill a business process or software function. Workflows often involve multiple participants, systems, or departments and can be complex, involving branching paths, decision points, and parallel processes.

Digital Workflow: A digital workflow refers to a series of digital tasks and process steps that are carried out electronically to achieve a specific outcome. Digital workflows involve the use of digital tools, software applications, and technologies to streamline and manage various activities within an organization or project. They often enable full or partial automation, and typically include elements such as data input, information processing, task assignment, approval processes, and document management, all conducted in a digital environment. A digital workflow may be implemented through an orchestration script or a collection of orchestration scripts.

Tasks and Process Steps: A task is usually a subset of a workflow and represents a discrete unit of work that needs to be completed as part of the larger process. Tasks are more specific and focused than workflows and are often assigned to individual agents. They have defined inputs, outputs, and objectives. Multiple tasks typically make up a workflow, and each task contributes to the overall goal of the workflow. A process step, or simply "step", in turn, is the smallest unit of work within this hierarchy. Process steps are the individual actions or operations that, when combined, form a task. They are highly specific, often atomic actions that represent the most granular level of detail in a workflow. Multiple process steps are usually required to complete a single task, and the successful execution of all steps results in the completion of the task. In the context of digital workflows, the terms "digital task", "digital workflow task", and "digital engineering task" are used interchangeably herein.

Digital Task Implementation: An orchestration script, or a platform script, may be generated over the IDMP to implement a digital task including one or more process steps, where the "implementation" of the digital task through an orchestration script means that the orchestration script includes instructions carrying out each process step required to complete the digital task.

Resource-capability mapping: A framework for identifying and linking available resources with the capabilities they enable or support. An exemplary resource-capability mapping is the IDMP API, or platform API, where the resource refers to third-party tools and functions integrated into and accessible via the IDMP, and where the exemplary capability refers to IDMP functions written in scripts for completing certain tasks using the available resource. Such resource-capability mappings may be used to identify how tool-specific resources such as tool functions, access and control capabilities, human-machine interfaces, processes, and objects can be allocated, invoked, and utilized efficiently and effectively to achieve specific IDMP platform functions or tasks. Resource capability mapping also assists with zero-knowledge implementations where the capability details are available to a user while the specific digital tool resource or its functions are only mapped within the customer environment. Another example of the resource-capability mapping framework is the variable mapping table disclosed herein.

CONCLUSIONS

One of ordinary skill in the art knows that the use cases, structures, schematics, flow diagrams, and steps may be performed in any order or sub-combination, while the inventive concept of the present invention remains without departing from the broader scope of the invention. Every embodiment may be unique, and step(s) of method(s) may be either shortened or lengthened, overlapped with other activities, postponed, delayed, and/or continued after a time gap, such that every active user and running application program is accommodated by the server(s) to practice the methods of the present invention.

For simplicity of explanation, the embodiments of the methods of this disclosure are depicted and described as a series of acts or steps. However, acts or steps in accordance with this disclosure can occur in various orders and/or concurrently, and with other acts or steps not presented and described herein. Furthermore, not all illustrated acts or steps may be required to implement the methods in accordance with the disclosed subject matter. In addition, those skilled in the art will understand and appreciate that the methods could alternatively be represented as a series of interrelated states via a state diagram or events or their equivalent.

As used herein, the singular forms "a," "an," and "the" include plural references unless the context clearly indicates otherwise. Thus, for example, reference to "a cable" includes a single cable as well as a bundle of two or more different cables, and the like.

The terms "comprise," "comprising," "includes," "including," "have," "having," and the like, used in the specification and claims are meant to be open-ended and not restrictive, meaning "including but not limited to."

In the foregoing description, numerous specific details are set forth, such as specific structures, dimensions, processes parameters, etc., to provide a thorough understanding of the present invention. The particular features, structures, materials, or characteristics may be combined in any suitable manner in one or more embodiments. The words "example", "exemplary", "illustrative" and the like, are used herein to mean serving as an example, instance, or illustration. Any aspect or design described herein as "example" or its equivalents is not necessarily to be construed as preferred or advantageous over other aspects or designs. Rather, use of the words "example" or equivalents is intended to present concepts in a concrete fashion.

As used in this application, the term "or" is intended to mean an inclusive "or" rather than an exclusive "or". That is, unless specified otherwise, or clear from context, "X includes A or B" is intended to mean any of the natural inclusive permutations. That is, if X includes A, X includes B, or X includes both A and B, then "X includes A or B" is satisfied under any of the foregoing instances.

Reference throughout this specification to "an embodiment," "certain embodiments," or "one embodiment" means that a particular feature, structure, or characteristic described in connection with the embodiment is included in at least one embodiment. Thus, the appearances of the phrase "an embodiment," "certain embodiments," or "one embodiment" throughout this specification are not necessarily all referring to the same embodiment.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. For example, in some exemplary embodiments, the term "about" may include the recited number±10%, such that "about 10" would include from 9 to 11. In other exemplary embodiments, the term "about" may include the recited number ±X %, where X is considered the normal variation in said measurement by one of ordinary skill in the art.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom. Features of the transitory physical storage medium described may be incorporated into/used in a corresponding method, digital documentation system and/or system, and vice versa.

Although the present invention has been described with reference to specific exemplary embodiments, it will be evident that the various modifications and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention, as defined by the claims.

What is claimed is:

1. A non-transitory physical storage medium storing program code, the program code executable by a hardware processor to cause the hardware processor to execute a computer-implemented process for generating a sharable digital thread orchestration script related to an input digital model, the program code comprising code to:
   receive a user request indicative of a digital task involving the input digital model;
   retrieve an input digital model file of the input digital model;
   determine characteristic attributes of the input digital model, wherein the characteristic attributes comprise digital artifacts generated from the input digital model file;
   select from a collection of templates, using a machine learning (ML) engine, a selected template matching the characteristic attributes of the input digital model, wherein the ML engine was trained on documentations of digital tools integrated into a digital platform, a resource-capability mapping of the digital platform, and sample digital thread orchestration scripts collected through past uses of the digital platform;
   generate the sharable digital thread orchestration script related to the input digital model based on the selected template,
      wherein the sharable digital thread orchestration script, when executing by the digital platform, implements the digital task,
      wherein the selected template engages a digital model splice having one or more splice functions, and
      wherein the one or more splice functions provide an Application Programming Interface (API) or Software Development Kit (SDK) endpoint to access one or more digital artifacts derived from one or more given digital models;
   output the sharable digital thread orchestration script; and
   execute the sharable digital thread orchestration script.

2. The non-transitory physical storage medium of claim 1, wherein the program code to generate the sharable digital thread orchestration script based on the selected template comprises code to:
   excerpt a portion of the selected template to generate an excerpted portion; and
   update the excerpted portion for the input digital model.

3. The non-transitory physical storage medium of claim 1, wherein the digital artifacts generated from the input digital model file comprise extracted model component data, derivative data derived from the extracted model component data, and metadata.

4. The non-transitory physical storage medium of claim 1, wherein the digital task is related to the selected template.

5. The non-transitory physical storage medium of claim 1,
   wherein the input digital model is a first digital model,
   wherein the sharable digital thread orchestration script accesses the first digital model and a second digital model when executed,
   wherein the ML engine comprises a Graph Transformer Network (GTN) trained on graph representations of the sample digital thread orchestration scripts, and
   wherein the selected template corresponds to a given digital thread execution graph comprising task nodes.

6. The non-transitory physical storage medium of claim 5, wherein at least a first task node of the given digital thread execution graph operates on an input matching a characteristic attribute of the first digital model and at least a second task node operates on a characteristic attribute of the second digital model.

7. The non-transitory physical storage medium of claim 5, wherein the graph representations of the sample digital thread orchestration scripts are direct acyclic graphs (DAGs).

8. The non-transitory physical storage medium of claim 1, wherein the program code further comprises code to generate an embedding of the characteristic attributes in a vector space, and
wherein the selected template matching the characteristic attributes is embedded to a vector closest to the embedding of the characteristic attributes in the vector space, as measured by a given distance function.

9. The non-transitory physical storage medium of claim 8, wherein the embedding is generated further from the user request indicative of the digital task.

10. The non-transitory physical storage medium of claim 8, wherein the vector space is a joint embedding space encoded over at least two data modalities selected from digital thread execution graph data, image data, and text data.

11. The non-transitory physical storage medium of claim 1, wherein the program code further comprises code to perform unsupervised training of the ML engine on the documentations of digital tools integrated into the digital platform, the resource-capability mapping of the digital platform, and the sample digital thread orchestration scripts collected through past uses of the digital platform.

12. The non-transitory physical storage medium of claim 1, wherein the program code further comprises code to store the sharable digital thread orchestration script as a new sample digital thread orchestration script for training the ML engine.

13. The non-transitory physical storage medium of claim 1, wherein the ML engine was trained by customization through Retrieval-Augmented Generation (RAG) using a selection of the sample digital thread orchestration scripts relevant to the digital task.

14. The non-transitory physical storage medium of claim 1, wherein the ML engine was trained further on user inputs, user scripts, and graph representations of dynamically updated documents having corresponding digital threads.

15. The non-transitory physical storage medium of claim 1, wherein the sample digital thread orchestration scripts are desensitized of customer data.

16. A system for generating a sharable digital thread orchestration script related to an input digital model, comprising:
at least one processor; and
at least one memory storing program code, the program code executable by the at least one processor to cause the at least one processor to execute a process for generating the sharable digital thread orchestration script related to an input digital model, the program code comprising code to:
receive a user request indicative of a digital task involving the input digital model;
retrieve an input digital model file of the input digital model;
determine characteristic attributes of the input digital model, wherein the characteristic attributes comprise digital artifacts generated from the input digital model file;
select from a collection of templates, using a machine learning (ML) engine, a selected template matching the characteristic attributes of the input digital model, wherein the ML engine was trained on documentations of digital tools integrated into a digital platform, a resource-capability mapping of the digital platform, and sample digital thread orchestration scripts collected through past uses of the digital platform;
generate the sharable digital thread orchestration script related to the input digital model based on the selected template,
wherein the sharable digital thread orchestration script, when executing by the digital platform, implements the digital task,
wherein the selected template engages a digital model splice having one or more splice functions, and
wherein the one or more splice functions provide an Application Programming Interface (API) or Software Development Kit (SDK) endpoint to access one or more digital artifacts derived from one or more given digital models;
output the sharable digital thread orchestration script; and
execute the sharable digital thread orchestration script.

17. A method implemented by a hardware processor for generating a sharable digital thread orchestration script related to an input digital model, comprising:
receiving a user request indicative of a digital task involving the input digital model;
retrieving an input digital model file of the input digital model;
determining characteristic attributes of the input digital model, wherein the characteristic attributes comprise digital artifacts generated from the input digital model file;
selecting from a collection of templates, using a machine learning (ML) engine, a selected template matching the characteristic attributes of the input digital model, wherein the ML engine was trained on documentations of digital tools integrated into a digital platform, a resource-capability mapping of the digital platform, and sample digital thread orchestration scripts collected through past uses of the digital platform;
generating the sharable digital thread orchestration script related to the input digital model based on the selected template,
wherein the sharable digital thread orchestration script, when executing by the digital platform, implements the digital task,
wherein the selected template engages a digital model splice having one or more splice functions, and
wherein the one or more splice functions provide an Application Programming Interface (API) or Software Development Kit (SDK) endpoint to access one or more digital artifacts derived from one or more given digital models;
outputting the sharable digital thread orchestration script; and
executing the sharable digital thread orchestration script.

18. The method of claim 17, further comprising:
generating an embedding of the characteristic attributes in a vector space, wherein the selected template matching the characteristic attributes is embedded to a vector closest to the embedding of the characteristic attributes in the vector space, as measured by a given distance function.

* * * * *